(12) United States Patent
Ozaki et al.

(10) Patent No.: US 6,919,845 B2
(45) Date of Patent: Jul. 19, 2005

(54) APPARATUS FOR MEASURING SPECIFIC ABSORPTION RATE BASED ON NEAR MAGNETIC FIELD FOR USE IN RADIO APPARATUS

(75) Inventors: Akihiro Ozaki, Matsue (JP); Koichi Ogawa, Hirakata (JP); Yoshio Koyanagi, Ebina (JP); Yutaka Saito, Nomi-gun (JP); Shoichi Kajiwara, Moriguchi (JP); Yoshitaka Asayama, Ogasa-gun (JP); Atsushi Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 252 days.

(21) Appl. No.: 10/419,813

(22) Filed: Apr. 22, 2003

(65) Prior Publication Data

US 2004/0017115 A1 Jan. 29, 2004

(30) Foreign Application Priority Data

Apr. 22, 2002 (JP) .................................. P2002-118882
Dec. 13, 2002 (JP) .................................. P2002-362045

(51) Int. Cl.$^7$ .............................. H02J 1/00; H03C 1/52; G01N 22/00
(52) U.S. Cl. .............................. 343/703; 343/700 MS; 343/755; 343/761; 343/725; 343/729; 307/149; 324/642; 324/247; 324/225; 324/260; 324/95
(58) Field of Search .................. 343/700 MS, 725, 343/729, 755; 307/149; 455/106–107, 90, 63, 83, 550, 66, 73; 324/642, 225, 260, 247, 95, 202

(56) References Cited

U.S. PATENT DOCUMENTS

| | | | | |
|---|---|---|---|---|
| 5,610,519 A | * | 3/1997 | Hankui et al. | 624/247 |
| 5,789,929 A | * | 8/1998 | Hankui | 324/642 |
| 6,434,372 B1 | * | 8/2002 | Neagley et al. | 455/106 |
| 2003/0064761 A1 | * | 4/2003 | Nevermann | 455/572 |
| 2004/0201514 A1 | * | 10/2004 | Stappaerts | 342/25 R |

FOREIGN PATENT DOCUMENTS

JP 2790103 6/1998

OTHER PUBLICATIONS

Rosenberger, B., entitled "Miniature Dielectric–Loaded Personal Telephone Antennas with Low SAR", Radio and Wireless Conference, 1998. Rawcon 98. IEEE Colorado Springs, Co., Aug. 1998, pp. 103–108.

Koyanagi, Y., et al., entitled "Estimation of the Radiation and SAR Characteristics of the NHA at 150 MHz by Use of the Cylindroid Whole Body Phantom ", IEEE Antennas and Propagation Society International Symposium. 2001 Digest. APS. Boston, MA, Jul. 8–13, New York, vol. 1 of 4, pp. 78–81

(Continued)

Primary Examiner—Don Wong
Assistant Examiner—Chuc Tran
(74) Attorney, Agent, or Firm—Wenderoth, Lind & Ponack, L.L.P.

(57) ABSTRACT

In an apparatus for measuring a specific absorption rate (SAR) for use in a radio apparatus, a first near magnetic field of a radio wave radiated from a reference radio apparatus is measured in free space, and an SAR of the radio wave radiated from the reference radio apparatus by using a predetermined phantom according to a predetermined measurement method. A transformation factor α is calculated by dividing the measured SAR by a square value of the measured first near magnetic field, and a second near magnetic field of a radio wave radiated from a radio apparatus to be measured is measured in free space. Then an SAR of the radio wave radiated from the radio apparatus to be measured is estimated and calculated by multiplying a square value of the measured second near magnetic field by the calculated transformation factor α.

18 Claims, 49 Drawing Sheets

OTHER PUBLICATIONS

N. Kuster et al., *"Energy Absorption Mechanism by Biological Bodies in the Near Field of Dipole Antennas Above 300 MHz"*, IEEE Transaction of Vehicle Technology, vol. 41, No. 1, pp. 17–23, Feb. 1992.

*"Standard of Specific Absorption Rate Measurement Method of Portable Radio Terminal"*, issued by Association of Radio Industries and Business in Japan, ARIB STB–T56 Ver. 2.0, revised on January 24, 2002.

* cited by examiner

FIRST PREFERRED EMBODIMENT

FIRST PREFERRED EMBODIMENT

SECOND PREFERRED EMBODIMENT

THIRD PREFERRED EMBODIMENT

FOURTH PREFERRED EMBODIMENT

SEVENTH PREFERRED EMBODIMENT
FIRST HOLDING POSTURE

SECOND HOLDING POSTURE

SEVENTH PREFERRED EMBODIMENT

Fig. 33  EIGHTH PREFERRED EMBODIMENT

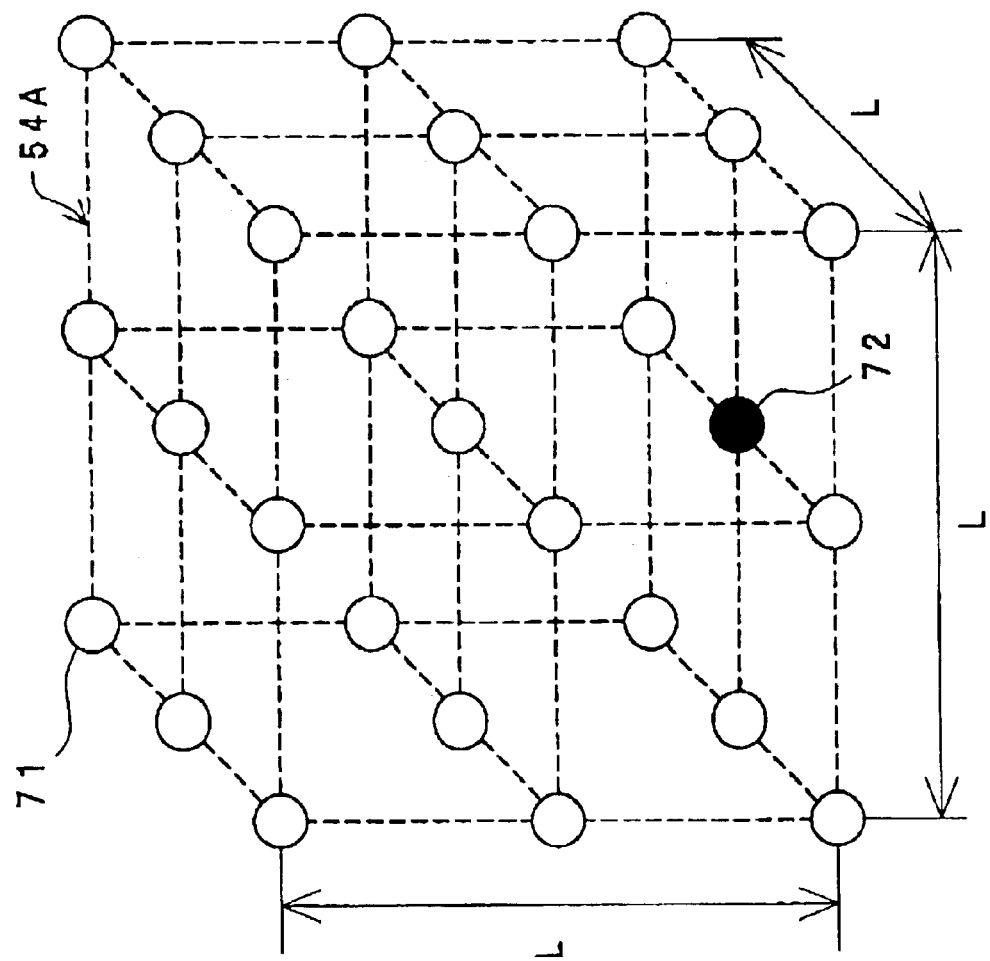
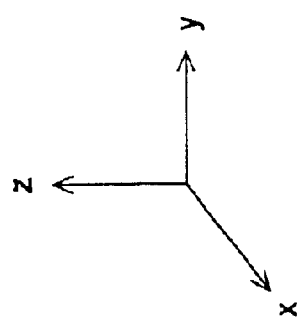
Fig. 34

MODIFIED PREFERRED EMBODIMENT OF EIGHTH PREFERRED EMBODIMENT

MODIFIED PREFERRED EMBODIMENT OF EIGHTH PREFERRED EMBODIMENT

APPARATUS FOR MEASURING SPECIFIC ABSORPTION RATE BASED ON NEAR MAGNETIC FIELD FOR USE IN RADIO APPARATUS

BACKGROUND OF THE INVENTION

1. Field of the Invention

The present invention relates to an SAR measuring apparatus for measuring a specific absorption rate (hereinafter referred to as an SAR) based on a near magnetic field, for use in a radio apparatus such as a portable telephone, a portable radio apparatus, or the like.

2. Description of the Related Art

In recent years, portable radio apparatuses such as portable telephones or the like have been widely used. Accompanying with this, influence of electromagnetic wave radiated from a portable radio apparatus exerted on human bodies has been emerged as a problem. An SAR has been used as a general one to provide an index for this influence. It is herein noted that SAR is an electric power absorbed into a unit mass as a consequence of the exposure of a living body of a human being or the like to an electromagnetic field and expressed by the following equation:

$$SAR = (\sigma E^2)/\rho \qquad (1).$$

In this equation, E [V/m] is an electric field intensity, a [S/m] is an electric conductivity of a biomedical tissue, and ρ [kg/m³] is a density of the biomedical tissue.

According to the SAR estimation method of the so-called electric field probe method as described in the "Specific absorption rate measuring method for portable telephone terminal and the like used beside human body temporal region" of the Telecommunications Technology Council Report of Japanese Ministry of Public Management, Home Affairs, Posts and Telecommunications, there is used a so-called human body phantom, which is a human body model of which the shape, the dimensions and the electrical characteristics of the head tissue are simulated for the human body. By using this human body phantom, SAR that will probably occur in the human body, is experimentally estimated, as disclosed in, for example, a first prior document of "Standard of specific absorption rate measurement method of portable radio terminal", issued by Association of Radio Industries and Business in Japan, ARIB STB-T56 Ver.2.0, revised on Jan. 24, 2002.

With regard to the SAR, worldwide regulations are progressing, and therefore, SAR inspection is indispensable for the production process for a portable radio apparatus such as a portable telephone or the like. Accordingly, there has been demanded a method and an apparatus for carrying out this SAR inspection simply and promptly. Conventionally, as a simple SAR estimation method, a method for experimentally obtaining SAR by a magnetic field intensity H on the surface of a human body phantom is proposed in, for example, a second prior art document of N. Kuster et al., "Energy Absorption Mechanism by Biological Bodies in the Near Field of Dipole Antennas Above 300 MHz", IEEE Transaction on Vehicular Technology, Vol. 41, No. 1, pp. 17–23, February 1992. According to this prior art method of the second prior art document, it has been confirmed that the relationship of the following equation has held with regard to the distribution of SARs generated on the surface of the human body:

$$SAR \propto H^2 \qquad (2).$$

As a conventional SAR estimation method, a method for obtaining an SAR distribution by calculating a current distribution from an incident magnetic field on the surface of the human body phantom when an electromagnetic wave is radiated from an antenna is disclosed in, for example, the Japanese Patent No. 2790103. A magnetic field is detected by a magnetic field probe provided with a movement and rotation mechanism, then the current distribution of the antenna is estimated, and the SAR is estimated based on this current distribution.

In a practical SAR measurement, the measurement is required to be carried out on various kinds of conditions of the arrangement of a portable telephone with respect to the head portion of a human body phantom, the type and the state of arrangement of the antenna and so on, and the maximum value of the SARs of the measurement results under various kinds of conditions is estimated to be the SAR value of the portable telephone. Therefore, much time is required for the measurement of SAR. Even by the above-mentioned simple SAR measurement method, it is necessary to change the method of arranging the portable radio apparatus with respect to the human body phantom. Moreover, during the actual SAR measurement, the portable telephone is measured in such a state in which it is closely fit to the human body phantom. According to the method of the prior art example as disclosed in the Japanese Patent No. 2790103, the incident magnetic field is measured on the surface of the human body phantom, and therefore, magnetic field measurement with the portable telephone arranged in conformity to the actual SAR measurement cannot be performed. Therefore, it is impossible to perform the inspection of SAR of the portable telephone on a production line by using the prior art SAR measurement method and apparatus.

Moreover, judgment of the SAR quality of the manufactured portable telephone is made not by the peak value of the SAR distribution but by an average value in a cube centered about the peak value (hereinafter referred to as an average SAR). The object to be judged is this average SAR, and there has been such a problem that the average SAR has been required to be calculated by some means. It is to be noted that the average SAR is also called a "local SAR".

SUMMARY OF THE INVENTION

An essential object of the present invention is therefore to solve the above-mentioned problems and to provide an SAR measuring apparatus capable of measuring an SAR value such as an average SAR at a higher speed with higher accuracy by a simpler method and a simpler apparatus structure than those of the prior art.

Another object of the present invention is to solve the above-mentioned problems and to provide an SAR measuring apparatus capable of measuring an SAR value in an arrangement of a portable telephone conforming to the actual SAR measurement.

A further object of the present invention is to solve the above-mentioned problems and provide an SAR measuring apparatus capable of measuring the SAR of a portable telephone on a production line more easily than by the prior art.

In order to achieve the above-mentioned objective, according to one aspect of the present invention, there is provided an SAR measuring apparatus for use in a radio apparatus. In the SAR measuring apparatus, a first measurement device measures in free space a first near magnetic field of a radio wave radiated from either a reference radio apparatus or a reference antenna, and a second measurement device measures a specific absorption rate (SAR) of the radio wave radiated from either the reference radio apparatus or the reference antenna by using a predetermined phantom according to a predetermined measurement method. A first calculation device calculates a transformation factor α by dividing the measured specific absorption rate (SAR) by a square value of the measured first near magnetic field, and a third measurement device measures in free space a second near magnetic field of a radio wave radiated from a radio apparatus to be measured. A second calculation device estimates and calculates a specific absorption rate (SAR) of the radio wave radiated from SAR radio apparatus to be measured by multiplying a square value of the measured second near magnetic field by the calculated transformation factor α.

In the above-mentioned SAR measuring apparatus, a first movement device moves either the reference radio apparatus or the reference antenna in one, two or three dimension relatively to the first measurement device and the second measurement device, and a second movement device moves the second measurement device in one, two or three dimension relatively to the radio apparatus to be measured and the phantom. Then the first measurement device measures in free space a distribution of the first near magnetic field of the radio wave radiated from either the reference radio apparatus or the reference antenna, while moving either the reference radio apparatus or the reference antenna by the first movement device, and the second measurement device measures a distribution of the specific absorption rate (SAR) of the radio wave radiated from either the reference radio apparatus or the reference antenna, while moving either the reference radio apparatus or the reference antenna by the first movement device, according to the measurement method. Thereafter, the first calculation device calculates a distribution of the transformation factor α by dividing the distribution of the measured specific absorption rate (SAR) by a distribution of the square value of the measured first near magnetic field, and third measurement device measures in free space a distribution of the second near magnetic field of the radio wave radiated from the radio apparatus to be measured, while moving the radio apparatus to be measured by the second movement device. Finally, the second calculation device estimates and calculates a distribution of the specific absorption rate (SAR) of the radio wave radiated from the radio apparatus to be measured by multiplying a distribution of the square value of the measured second near magnetic field by the distribution of the calculated transformation factor α.

In the above-mentioned SAR measuring apparatus, the first measurement device measures in free space the distribution of the first near magnetic field of the radio wave radiated from either the reference radio apparatus or the reference antenna, while moving either the reference radio apparatus or the reference antenna in one, two or three dimension except for a direction substantially perpendicular to a surface of either the reference radio apparatus or the reference antenna by the first movement device. Then the third measurement device measures in free space the distribution of the second near magnetic field of the radio wave radiated from the radio apparatus to be measured, while moving the radio apparatus to be measured in one or two dimension except for a direction substantially perpendicular to a surface of the radio apparatus to be measured by the second movement device.

In the above-mentioned SAR measuring apparatus, the second calculation device estimates and calculates either a specific absorption rate (SAR) or its distribution, in the direction substantially perpendicular to the surface of the radio apparatus to be measured, by using a relational equation including a skin depth of the phantom used for measuring the specific absorption rate (SAR), based on either the specific absorption rate (SAR) or its distribution, which is estimated and calculated on a measurement plane including a measurement limit line used for measuring the specific absorption rate (SAR) by the third measurement device, and based on a distance from the radio apparatus to be measured.

In the above-mentioned SAR measuring apparatus, the second measurement device measures the specific absorption rates (SARs) or their distributions for a plurality of predetermined mutually different holding postures for holding the reference radio apparatus, and the first calculation device calculates the transformation factors or their distributions for the plurality of holding postures. Then the second calculation device calculates the specific absorption rates (SARs) or their distributions for the plurality of holding postures.

In the above-mentioned SAR measuring apparatus, the second calculation device calculates an average value of the plurality of specific absorption rates (SARs) as an average SAR, based on a plurality of specific absorption rates (SARs) at a plurality of measurement points within a predetermined volume isolated from the radio apparatus to be measured.

In the above-mentioned SAR measuring apparatus, the second calculation device retrieves a maximum value of the average SARs calculated for the plurality of holding postures, determines whether or not the maximum value of the retrieved average SARs is equal to or smaller than a predetermined threshold value, outputs such information that the radio apparatus is non-defective when the maximum value of the retrieved average SARs is equal to or smaller than the predetermined threshold value, and outputs such information that the radio apparatus is defective when the maximum value of the retrieved average SARs is larger than the predetermined threshold value.

In the above-mentioned SAR measuring apparatus, each of the first measurement device and the third measurement device includes at least one magnetic field probe.

In the above-mentioned SAR measuring apparatus, each of the first measurement device and the third measurement device includes a plurality of magnetic field probes aligned apart from one another at predetermined intervals.

In the above-mentioned SAR measuring apparatus, the magnetic field probes are aligned so that their magnetic field detection planes intersect at an angle of 45 degrees and an angle between mutually adjacent one pair of magnetic field probes is 90 degrees.

In the above-mentioned SAR measuring apparatus, each of the first measurement device and the third measurement device calculates a near magnetic field in an intermediate position of the one pair of magnetic field probes by calculating a square root of a sum of squares of two near magnetic fields measured by one pair of mutually adjacent magnetic field probes.

In the above-mentioned SAR measuring apparatus, magnetic field probes each terminated with a terminating resistor are arranged respectively on the outside of the magnetic field probes located at both ends of the plurality of magnetic field probes.

In the above-mentioned SAR measuring apparatus, each of the first measurement device and the third measurement device further includes at least one of a variable amplifier and a variable phase shifter provided at a stage subsequent to the magnetic field probes.

In the above-mentioned SAR measuring apparatus, a control device controls an amplification of the variable amplifier and a quantity of phase shift of the variable phase shifter so that a predetermined SAR distribution can be obtained by the second measurement device.

In the above-mentioned SAR measuring apparatus, each of the magnetic field probes includes three magnetic field probe portions, the three magnetic field probe portions are arranged so that centers of the detection surfaces thereof are passed through by mutually orthogonal three axes.

In the above-mentioned SAR measuring apparatus, each of the first measurement device and the third measurement device calculates a near magnetic field measured by a magnetic field probe comprised of the three magnetic field probe portions by calculating a square root of a sum of squares of three magnetic fields detected by the three magnetic field probe portions.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 34 is a perspective view showing a coordinates of a cubic phantom 54 when an average SAR is calculated in the eighth preferred embodiment of the present invention;

DETAILED DESCRIPTION OF THE PREFERRED EMBODIMENTS

Figure 1:
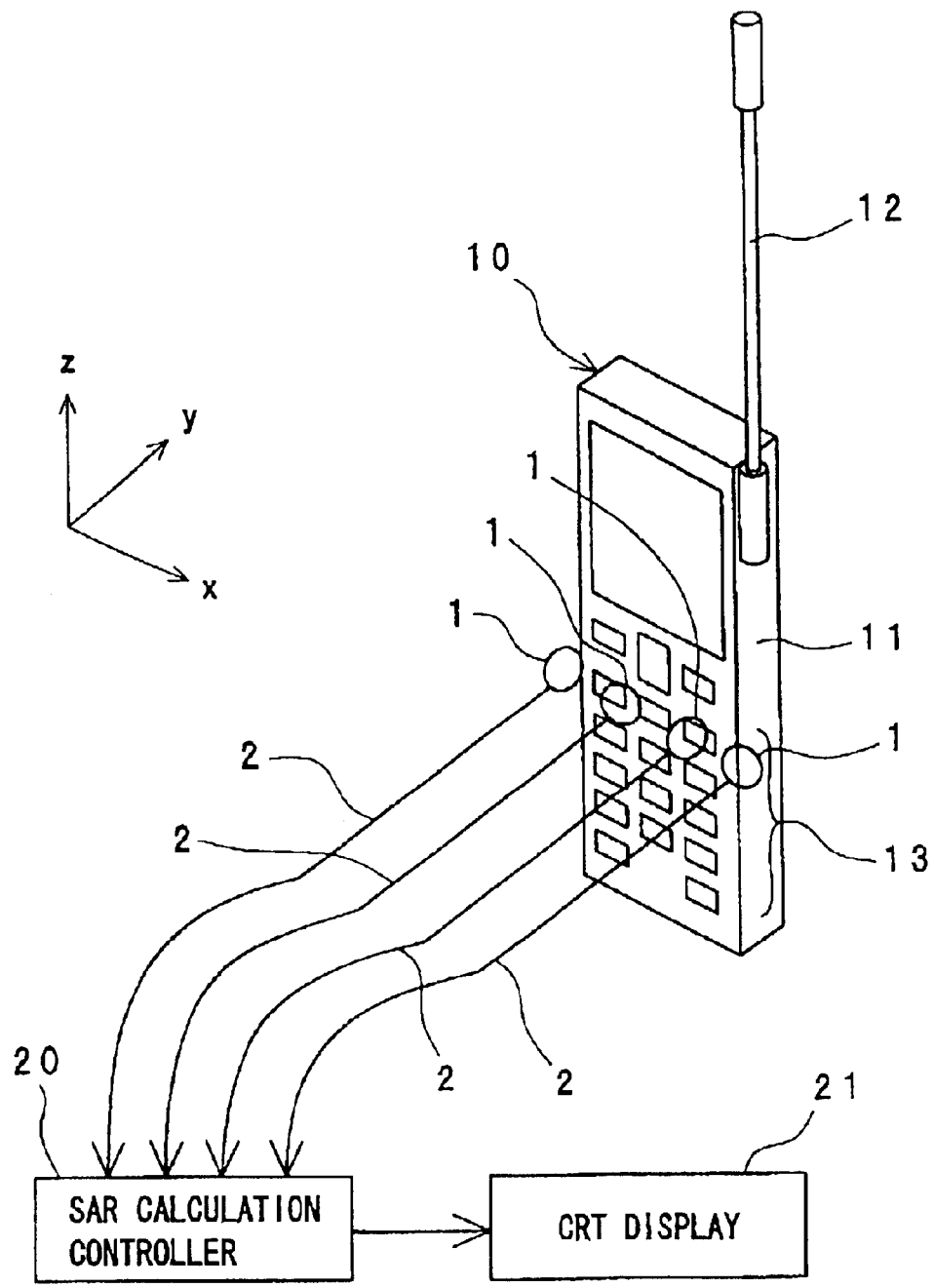
FIG. 1 is a perspective view and a block diagram showing a structure of an SAR measuring apparatus for measuring an SAR of a portable radio apparatus 10 according to a first preferred embodiment of the present invention.

Preferred embodiments of the present invention will be described below with reference to the drawings. In the following drawings, the same components or similar components are denoted by the same reference numerals, and no detailed description is provided therefor. In the preferred embodiments, a radio apparatus means a radio communication apparatus such as a potable telephone, a business-use potable transceiver or the like.

First Preferred Embodiment

FIG. 1 is a perspective view and a block diagram showing a structure of an SAR measuring apparatus for measuring SAR of a portable radio apparatus 10 according to the first preferred embodiment of the present invention.

In the portable radio apparatus 10 of FIG. 1, a whip antenna 12 is mounted so as to extend upward from its casing 11, and a keyboard section 13 is formed in a lower portion of the front surface of the portable radio apparatus 10. As shown in FIG. 1, a plurality of, for example, four magnetic field probes 1 are arranged at regular intervals linearly or aligned in the horizontal direction on the front surface of the keyboard section 13 of the portable radio apparatus 10 so that the probes are located a predetermined distance of adjacency apart from the front surface. It is to be noted that the portable radio apparatus 10 is provided with a built-in flat antenna (not shown) such as an inverted F type antenna, which is arranged on the inside of the casing 11 so as to be parallel to the front surface of the keyboard section 13 in addition to the whip antenna 12. Therefore, radio wave from the portable radio apparatus 10 is radiated from the whip antenna 12 and/or the built-in flat antenna. In particular, when the radio wave is radiated from these antennas, a casing current flows in the casing 11, and a magnetic field is generated in the vicinity of the front surface of the keyboard section 13.

In this case, each of the magnetic field probes 1 includes a circular loop for detecting the magnetic field and a connection cable connected to the loop, and the cross section of the circular loop is arranged perpendicular to the front surface of the portable radio apparatus 10. Each magnetic field probe 1 detects a near magnetic field generated on the front surface of the keyboard section 13, and outputs a detection signal that represents a detection voltage proportional to the near magnetic field to an SAR calculation controller 20 via a detection signal cable 2. In response to this, the SAR calculation controller 20 executes an SAR calculation process of FIG. 2 as described in detail later, namely, calculates the distribution in the horizontal direction of the near magnetic field on the front surface of the portable radio apparatus 10 based on the inputted detection signal, thereafter calculates the SAR distribution in the horizontal direction by using an equation (3) described later, and then outputs to and displays the data of the calculated results on a CRT display 21.

First of all, a principle of the measurement method of the SAR distribution will be described below.

Figure 2:
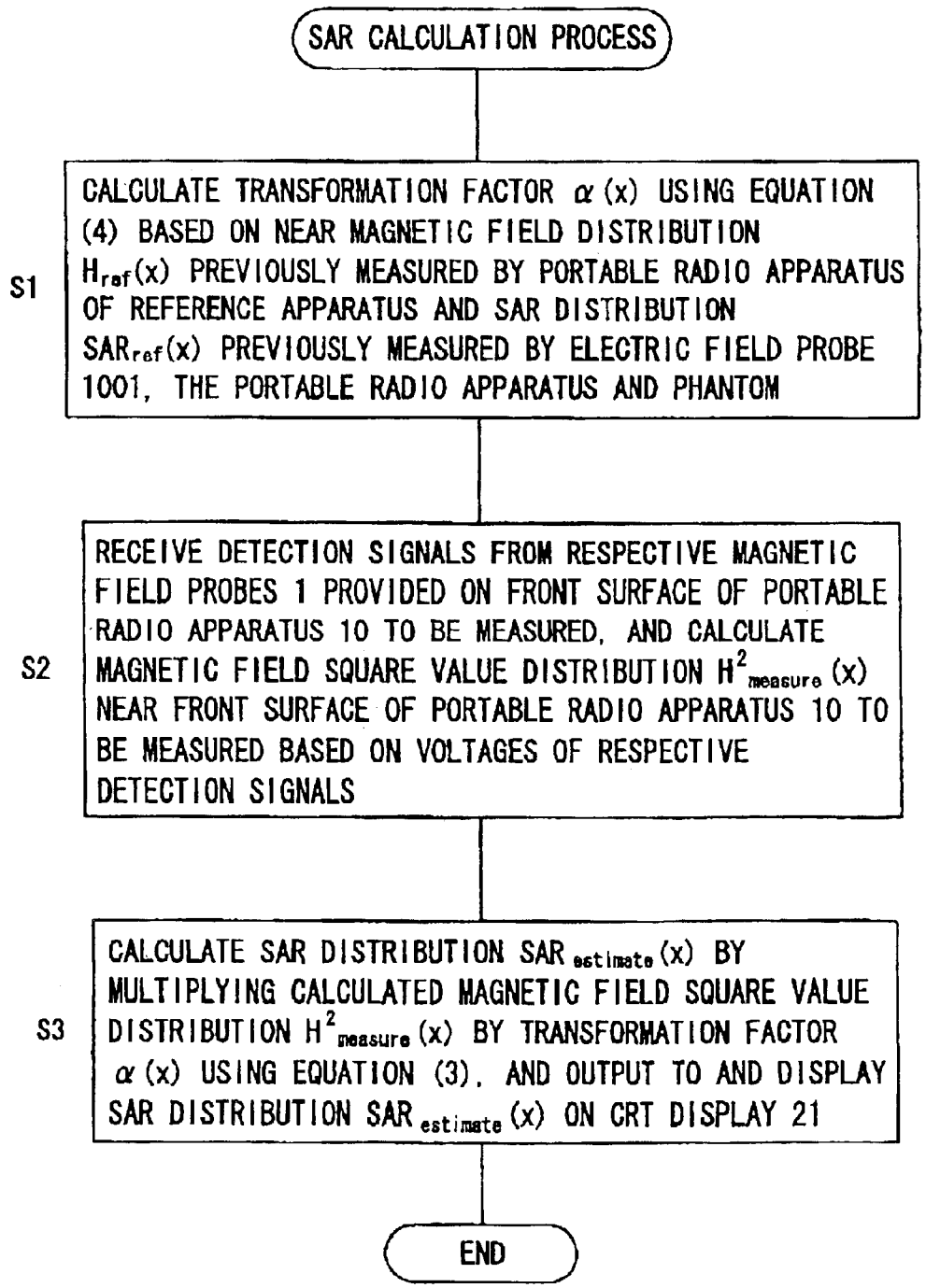
FIG. 2 is a flowchart showing an SAR calculation process executed by an SAR calculation controller 20 of FIG. 1.

Referring to FIG. 1, it is assumed that the direction of arrangement of the plurality of magnetic field probes 1 is an x-direction and a direction directed from the plurality of magnetic field probes 1 toward the portable radio apparatus 10 (i.e., this direction means the direction extending from the front surface to the rear surface of the portable radio apparatus 10, and being perpendicular to the front surface) is a y-direction. Moreover, it is assumed that a surface of the portable radio apparatus 10, which is made to be in contact with a human body, is the front surface on which the keyboard section 13 and so on are arranged. At this time, the front surface of the portable radio apparatus 10 is parallel to the zx-plane and arranged so as to be adjacent to the plurality of magnetic field probes 1. The plurality of magnetic field probes 1 is able to detect the near magnetic field on the front surface of the portable radio apparatus 10 and to obtain detection signals, which are proportional to the intensity of the fields. In this case, by moving the portable radio apparatus 10 or the plurality of magnetic field probes 1 in the z-direction while observing the measured field distribution on the CRT display 21 and fixing a positional relationship between the portable radio apparatus 10 and the plurality of magnetic field probes 1 so that a maximum value of the observed magnetic field distribution becomes maximized, the SAR calculation process of FIG. 2 is executed.

A method will be next described for estimating the SAR distribution from the magnetic field intensity distribution in free space, or the measurement method of the present preferred embodiment. First of all, a distribution $H_{ref}(x)$ in the x-direction of the near magnetic field intensity H and a distribution $SAR_{ref}(x)$ in the x-direction of SAR are previously measured by using a half-wavelength dipole antenna having a simple antenna structure or a portable radio apparatus of a reference radio apparatus as one example. The former near magnetic field intensity distribution $H_{ref}(x)$ can be measured by using the magnetic field probes 1, while the SAR distribution $SAR_{ref}(x)$ can be measured by an electric field probe method (hereinafter referred to as a standard measurement method) using the relational equation (the above-mentioned equation (1)) that the SAR value is proportional to the electric field disclosed in the first prior art document and by using a cubic phantom 54 described later or the head portion 60 of a human body phantom. Since the SAR value is an electric power, if the SAR distribution is compared with a near magnetic field square value distribution, then the square value distribution $H^2(x)$ of the near magnetic field and the SAR distribution SAR(x) have distributions similar to each other as described later with reference to FIGS. 11 and 12. Therefore, it can be considered that the SAR distribution can be estimated by measuring the near magnetic field in free space even if the electromagnetic mutual coupling between the portable radio apparatus and the phantom is not taken into consideration. Therefore, SAR distributions $SAR_{estimate}(x)$ can be obtained by the following equation by using a square value distribution $H^2_{measure}(x)$ of the magnetic field intensity of the measured near magnetic field:

$$SAR_{estimate}(x) = \alpha(x) \cdot H^2_{measure}(x), \text{ where} \qquad (3)$$

$$\alpha(x) = \frac{SAR_{ref}(x)}{H^2_{ref}(x)}, \qquad (4)$$

and $\alpha(x)$ denotes a distribution in the x-direction of a transformation factor. The SAR distribution $SAR_{estimate}(x)$ is estimated and calculated by using this transformation factor distribution $\alpha(x)$ in the SAR measuring apparatus of the present preferred embodiment. In order to calculate this transformation factor distribution $\alpha(x)$, it is required to previously obtain the near magnetic field intensity distribution $H_{ref}(x)$ and the measured value $SAR_{ref}(x)$ of SAR by using, for example, a half-wavelength dipole of a reference antenna or a portable radio apparatus of a reference radio apparatus. According to the experiments conducted by the present inventors, the maximum value of the transformation factor distribution $\alpha(x)$ when the half-wavelength dipole was used was 0.35 V·m2/A·kg as one example.

FIG. 2 is a flowchart showing an SAR calculation process executed by the SAR calculation controller 20 of FIG. 1.

Referring to FIG. 2, in step S1, first of all, the transformation factor distribution $\alpha(x)$ is calculated by using the equation (4) based on the near magnetic field distribution $H_{ref}(x)$ previously measured by using the portable radio apparatus of the reference radio apparatus and the SAR distribution $SAR_{ref}(x)$ previously measured by using an electric field probe 1001, the portable radio apparatus and the cubic phantom 54 or a head portion 60 of a human body phantom as described later. The former near magnetic field $H_{ref}(x)$ can be measured by using the magnetic field probes 1, while the SAR distribution $SAR_{ref}(x)$ can be measured by using the standard measurement method. Subsequently, in step S2, detection signals from respective magnetic field probes 1 provided on the front surface of the portable radio apparatus 10 to be measured are received, and the magnetic field square value distribution $H^2_{measure}(x)$ in the vicinity of the front surface of the portable radio apparatus 10 to be measured is calculated based on the voltages of the detection signals. Further, in step S3, the SAR distribution $SAR_{estimate}(x)$ is calculated by multiplying the calculated magnetic field square value distribution $H^2_{measure}(x)$ by the transformation factor distribution $\alpha(x)$ by using the equation (3), and then, is outputted to and displayed on the CRT display 21. Then the SAR calculation process is completed.

As described above, according to the present preferred embodiment, merely by previously measuring the near magnetic field intensity distribution $H_{ref}(x)$ and the SAR distribution $SAR_{ref}(x)$ as to the reference antenna or the reference portable radio apparatus and calculating the transformation factor distribution $\alpha(x)$ by using the equation (4), the SAR distribution $SAR_{estimate}(x)$ in the x-direction of the portable radio apparatus 10 to be measured can be estimated and calculated extremely simply at a higher speed and automatically as compared with those of the prior arts.

In the above-mentioned preferred embodiment, the four magnetic field probes 1 are linearly arranged or aligned. However, the present invention is not limited to this, and it is acceptable to arrange at least one magnetic field probe 1 in a linear array (or in one dimension), a two-dimensional array or a three-dimensional array. For example, it is acceptable to arrange two magnetic field probes 1 in the z-direction. It is also acceptable to arrange two magnetic field probes 1 in the x-direction and arrange two magnetic field probes 1 in the z-direction. With this arrangement, it is unnecessary to retrieve the maximum value by moving the probes in the z-direction, and therefore, the SAR measurement can be executed at a higher speed.

In the above-mentioned preferred embodiment, the magnetic field square value distribution $H^2_{measure}(x)$ in the vicinity of the front surface of the portable radio apparatus 10 is calculated in step S2 of FIG. 2, and the SAR distribution $SAR_{estimate}(x)$ is estimated and calculated in step S3. However, the present invention is not limited to this, and it is acceptable to calculate the maximum value $H_{max}^2$ of the magnetic field square value distribution $H^2_{measure}(x)$ in the vicinity of the front surface of the portable radio apparatus 10, calculate the maximum value $SAR_{estimatemax}$ of the SAR distribution $SAR_{estimate}(x)$ that has been estimated and calculated in step S3, and then, output to and display the calculated value on the CRT display 21.

It is to be noted that the near magnetic fields of the portable radio apparatus of the reference apparatus and the portable radio apparatus 10 to be measured can be measured by the same magnetic field probes 1. This can be applied to the other preferred embodiments hereinbelow.

Second Preferred Embodiment

Figure 3:
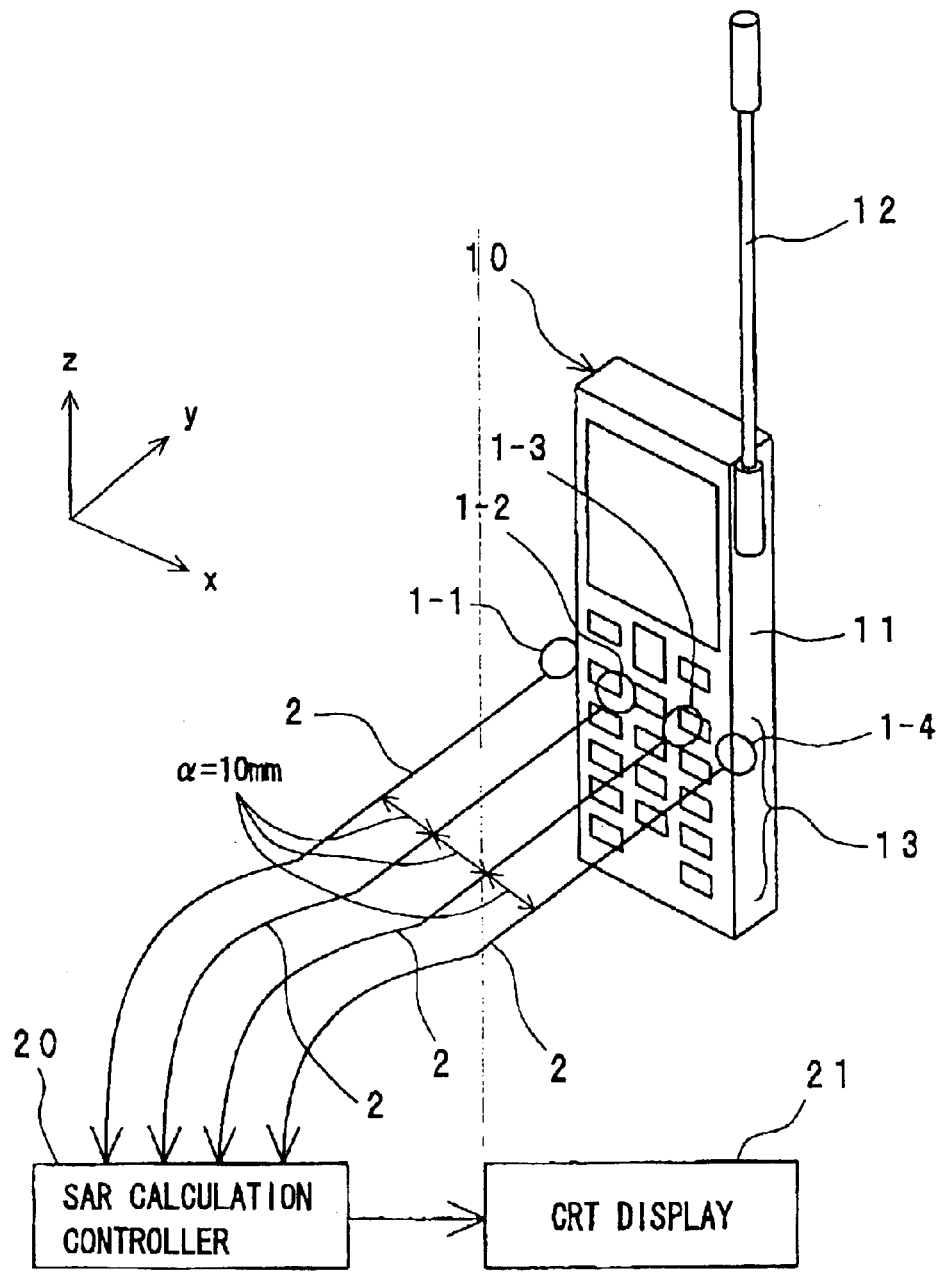
FIG. 3 is a perspective view and a block diagram showing a structure of an SAR measuring apparatus for measuring an SAR of a portable radio apparatus 10 according to a second preferred embodiment of the present invention.
Figure 4:
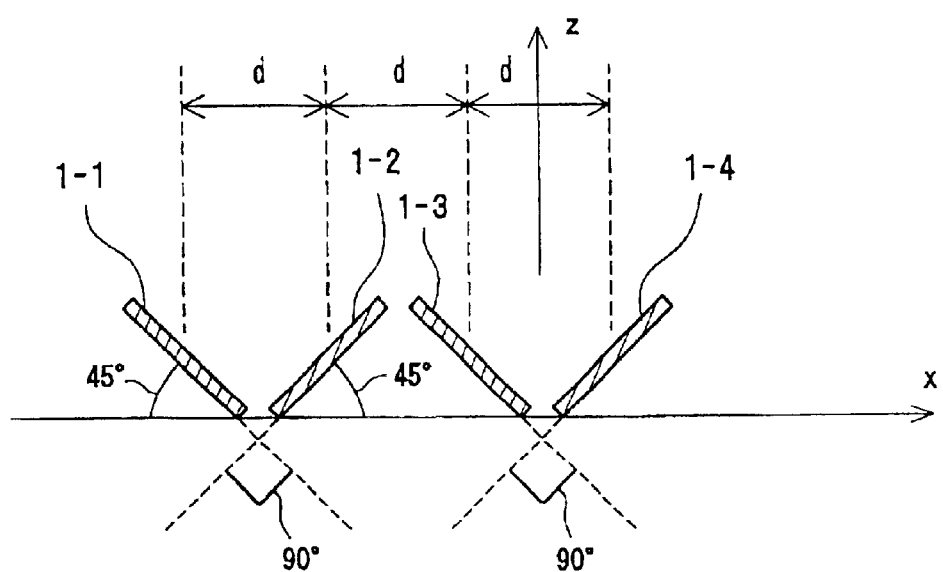
FIG. 4 is a sectional view showing an arrangement of magnetic field probes 1-1 to 1-4 of FIG. 3.

FIG. 3 is a perspective view and a block diagram showing a structure of an SAR measuring apparatus for measuring the SAR of a portable radio apparatus 10 according to the second preferred embodiment of the present invention, and FIG. 4 is a sectional view showing an arrangement of magnetic field probes 1-1 to 1-4 of FIG. 3.

In the present preferred embodiment, there is provided an SAR measuring apparatus of the portable radio apparatus used in the 900 MHz band as one example, each interval of "d" between mutually adjacent magnetic field probes 1 is set to 10 mm (=0.03λ, where λ is the wavelength of the transmission and reception frequency used by the portable radio apparatus 10), and a distance from the tip of the magnetic field probe 1 to the front surface of the portable radio apparatus 10 is set to 10 mm. For each of the magnetic field probes 1, a loop type magnetic field probe provided with a conductor line circular loop at its tip is employed.

In the present preferred embodiment, as shown in FIG. 4, the magnetic field detection planes of the cross sections of the circular loops of the magnetic field probes 1 are arranged so as to intersect the x-axis parallel to the direction in which the magnetic field probes 1 are arranged (parallel to the front surface of the portable radio apparatus 10) at an angle of 45 degrees, an angle between mutually adjacent one pair of magnetic field probes 1 becomes 90 degrees, and further, the cross sections of the circular loops become perpendicular to the front surface of the portable radio apparatus 10. In the present preferred embodiment, each of the magnetic field probes 1 measures the magnetic field on the zx-plane. Therefore, each of the magnetic field probes 1 is required to detect an x-component Hx and a z-component Hz of the near magnetic field H. Accordingly, these magnetic field probes 1 are arranged so as to make an angle of 45 degrees with respect to the x-axis. Further, an angle made between mutually adjacent magnetic field probes 1 is set to 90 degrees in order to weaken the mutual coupling between the mutually adjacent magnetic field probes 1. In this SAR measuring apparatus, the maximum value of SAR of the entire portable radio apparatus 10 is calculated by moving the portable radio apparatus 10 in the z-direction. A plurality of portable radio apparatuses 10, which are to be measured and are mass-produced, can be continuously measured during the production process by moving the apparatuses using, for example, a belt conveyer and a robot arm. This enables higher-speed SAR estimation and further automatic measurement of the SAR distribution and the maximum SAR.

As described above, according to the present preferred embodiment, the operation and advantageous effects similar to those of the first preferred embodiment can be obtained, and the mutual coupling between the magnetic field probes 1 can be weakened as compared with that of the first preferred embodiment. Therefore, errors which may be caused in the SAR measurement due to the mutual coupling can be reduced, and the SAR distribution and the maximum SAR can be measured with higher accuracy. Also, the various kinds of modified preferred embodiments described in connection with the first preferred embodiment can be applied to the second preferred embodiment.

Third Preferred Embodiment

Figure 5:
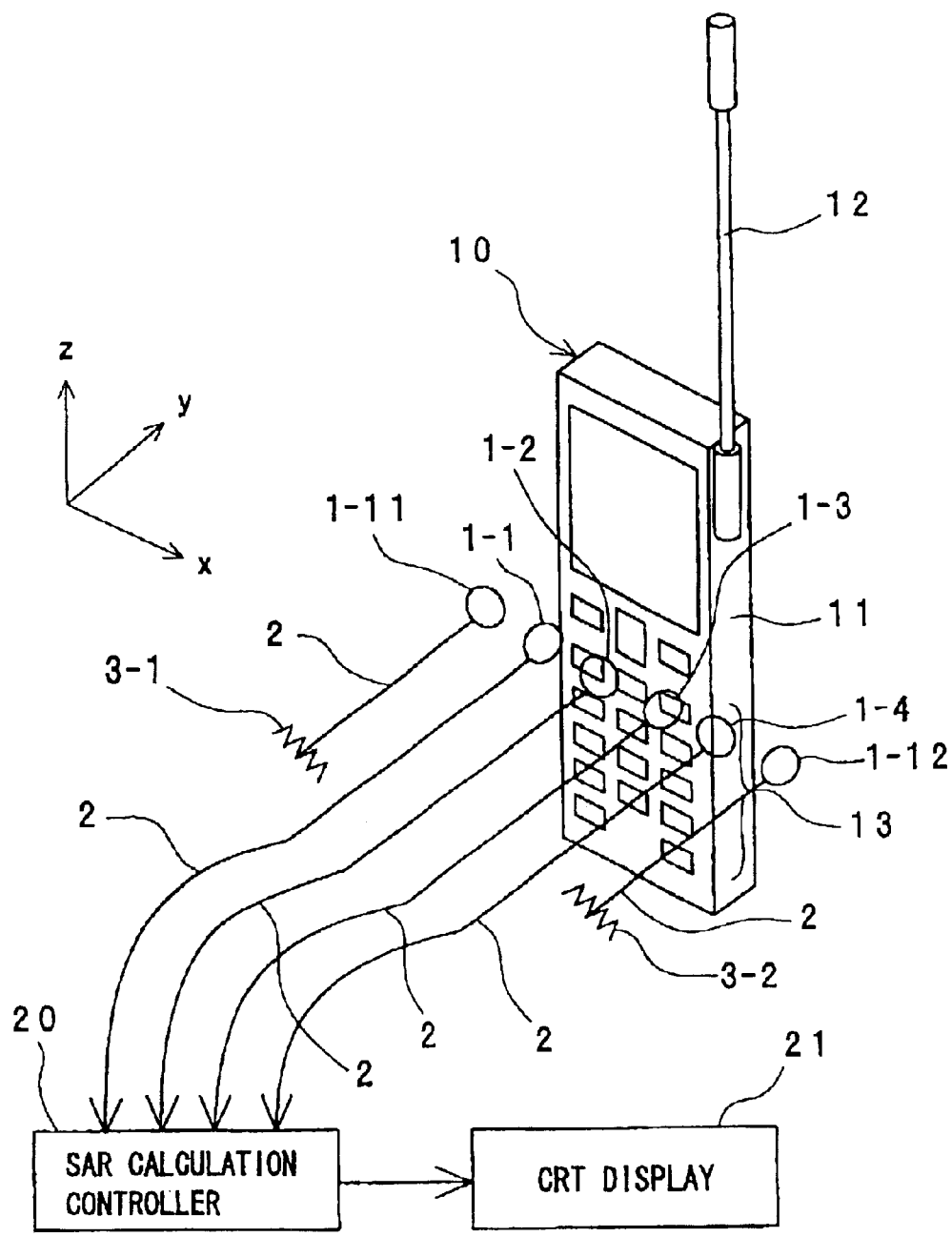
FIG. 5 is a perspective view and a block diagram showing a structure of an SAR measuring apparatus for measuring an SAR of a portable radio apparatus 10 according to a third preferred embodiment of the present invention.

FIG. 5 is a perspective view and a block diagram showing a structure of an SAR measuring apparatus for measuring the SAR of a portable radio apparatus 10 according to the third preferred embodiment of the present invention.

As shown in FIG. 5, as compared with the first preferred embodiment and the second preferred embodiment, the SAR measuring apparatus of this third preferred embodiment is characterized in that magnetic field probes (hereinafter referred to as dummy magnetic field probes) 1-11 and 1-12 are linearly arranged or aligned so as to be parallel on the outside of the two magnetic field probes located at both ends of four magnetic field probes 1-1 to 1-4. It is to be noted that the two dummy magnetic field probes 1-11 and 1-12 located outside are respectively terminated via respective detection signal cables 2 by non-reflection terminating resistors 3-1 and 3-2 each having the same resistance value as the characteristic impedance of the detection signal cable 2. In this case, the non-reflection terminating resistors 3-1 and 3-2 absorb the voltages of the detection signals detected and outputted from the dummy magnetic field probes 1-11 and 1-12, respectively.

When the dummy magnetic field probes 1-11 and 1-12 are not provided in a manner similar to that of the first preferred embodiment and the second preferred embodiment, the magnetic field probes (1-1 and 1-3) and (1-2 and 1-4) are located on both sides of the magnetic field probes 1-2 and 1-3 located inside, respectively, while only the magnetic field probes 1-2 and 1-3 exist on only one side of the magnetic field probes 1-1 and 1-4 located outside, respectively. Therefore, when the mutual coupling between mutually adjacent magnetic field probes 1-1 to 1-4 is relatively strong, there is caused a significant difference between the influence exerted from the adjacent probes on the magnetic field probes 11 and 1-4 and the influence exerted on the magnetic field probes 1-2 and 1-3. Accordingly, variations are caused in the obtained detection signals, respectively.

In the present preferred embodiment, in order to solve this problem, the dummy magnetic field probes 1-11 and 1-12 each having the same structure as that of each of the magnetic field probes 1-1 to 1-4 are arranged on the outside of the magnetic field probes 1-1 and 1-4, respectively, and this leads to that the influence exerted from the adjacent probes on the magnetic field probes 1-1 and 1-4 and the influence exerted from the adjacent probes on the magnetic field probes 1-2 and 1-3 are made equal to each other. With this arrangement, the variations in the detection signals obtained from the magnetic field probes 1-1 to 1-4 can be reduced.

As described above, according to the present preferred embodiment, the operation and advantageous effects similar to those of the first and second preferred embodiments can be obtained, and the arrangement of the dummy magnetic field probes 1-11 and 1-12 on the outside of the magnetic field probes 1-1 to 1-4 reduces the variations in the detection signals obtained from the magnetic field probes 1-1 to 1-4. With this arrangement, the near magnetic field can be measured more accurately, and the SAR measurement based on this can be executed with higher accuracy as compared with the prior art.

Fourth Preferred Embodiment

Figure 6:
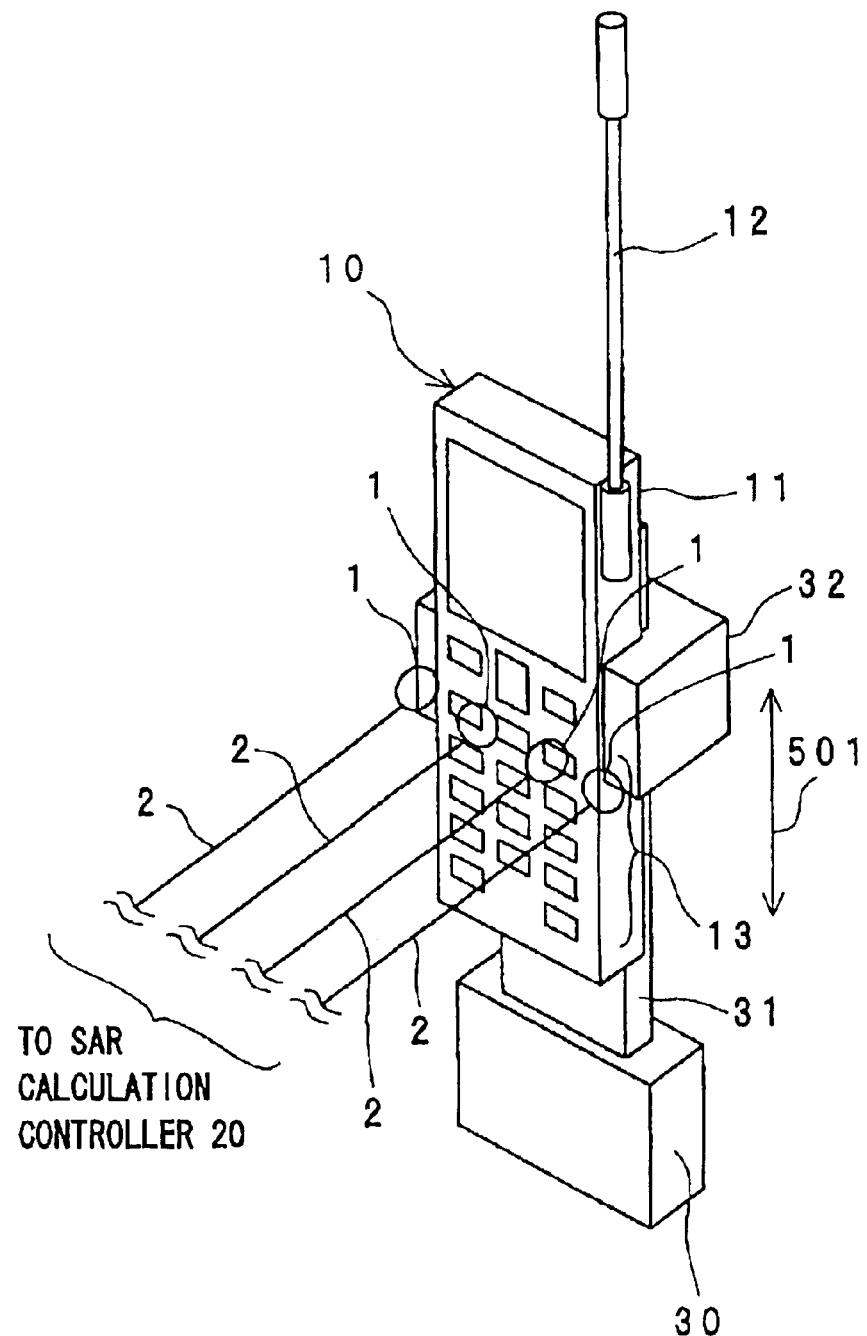
FIG. 6 is a perspective view and a block diagram showing a structure of an SAR measuring apparatus for measuring an SAR of a portable radio apparatus 10 according to a fourth preferred embodiment of the present invention.

FIG. 6 is a perspective view and a block diagram showing a structure of an SAR measuring apparatus for measuring the SAR of a portable radio apparatus 10 according to the fourth preferred embodiment of the present invention. As compared with the first preferred embodiment, the SAR measuring apparatus of this fourth preferred embodiment is characterized in that the portable radio apparatus 10 is supported by a movement support section 32 of a movement mechanism apparatus 30 so that the portable radio apparatus 10 can be moved in the z-direction of arrow 501.

Referring to FIG. 6, the movement mechanism apparatus 30 has a rectangular-columnar-shaped supporting column 31 extended upward or in the vertical direction, and has the movement support section 32 for movably supporting the portable radio apparatus 10 along the longitudinal direction (in the direction of arrow 501) of the supporting column 31. It is to be noted that the components 31 and 32 of the movement mechanism apparatus 30 are made of resin of, for example, acrylic resin, Teflon resin, ABS resin or the like, so that no influence is exerted on the magnetic field distribution to be measured.

As described above, according to the present preferred embodiment, the portable radio apparatus 10 can be automatically moved in the z-direction, and the positions of the tips of the magnetic field probes 1 can be moved relatively to the portable radio apparatus 10. Therefore, the portable radio apparatus 10 and the positions of the tips of the magnetic field probes 1 can be moved automatically and stably, and the maximum value of the SAR distribution can be easily retrieved and outputted. It is to be noted that the characteristic structures of the second and third preferred embodiments can be also applied to the fourth preferred embodiment.

In the above-mentioned fourth preferred embodiment, the portable radio apparatus 10 is moved with respect to the plurality of magnetic field probes 1. However, the present invention is not limited to this, and it is acceptable to move the plurality of magnetic field probes 1 with respect to the portable radio apparatus 10. That is, the portable radio apparatus 10 and the magnetic field probes 1 may be moved relatively to each other.

Fifth Preferred Embodiment

Figure 7:
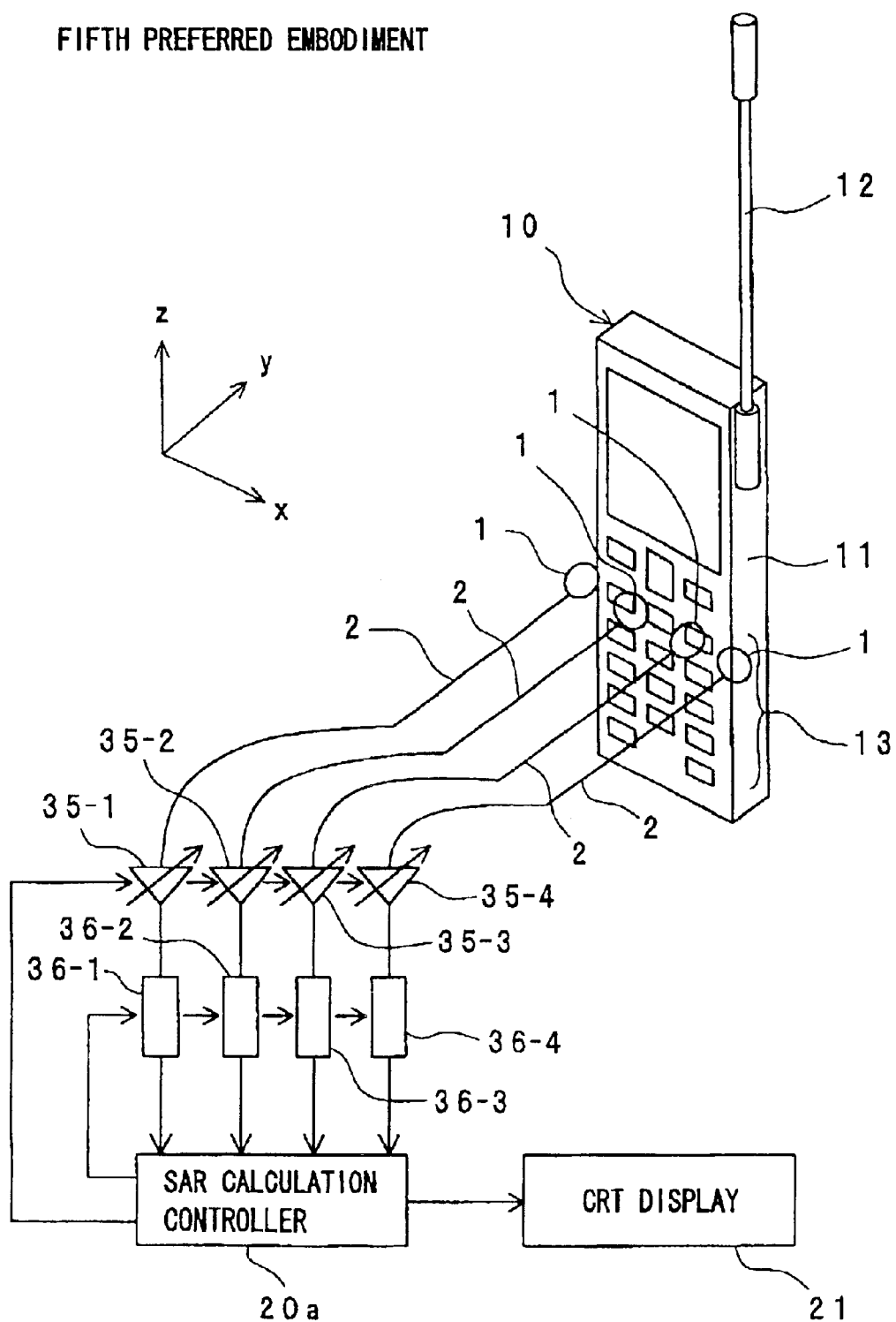
FIG. 7 is a perspective view and a block diagram showing a structure of an SAR measuring apparatus for measuring an SAR of a portable radio apparatus 10 according to a fifth preferred embodiment of the present invention.

FIG. 7 is a perspective view and a block diagram showing a structure of an SAR measuring apparatus for measuring the SAR of a portable radio apparatus 10 according to the fifth preferred embodiment of the present invention. As compared with the first preferred embodiment, the SAR measuring apparatus of this fifth preferred embodiment is characterized in that variable amplifiers 35-1 to 35-4 and variable phase shifters 36-1 to 36-4 are inserted in the detection signal cables 2 between the magnetic field probes 1 and an SAR calculation controller 20a.

In the SAR measuring apparatus of FIG. 7, there is a possibility that the configurations, arrangements and detection characteristics of the magnetic field probes 1 may change and deteriorate with a lapse of time. Accordingly, in the present preferred embodiment, the magnetic field distribution and the SAR distribution are detected or measured by means of a reference antenna of which the magnetic field distribution and the SAR distribution have been already known prior to the SAR measurement. If the obtained SAR distribution is different from the predetermined SAR distribution of the reference antenna, then the SAR calculation controller 20a adjusts the degrees of amplification of the variable amplifiers 35-1 to 35-4 and the quantities of phase shifts of the variable phase shifters 36-1 to 36-4 so that the obtained SAR distribution substantially coincide with the predetermined SAR distribution of the reference antenna, and thereafter, executes the above-mentioned SAR measurement process on the portable radio apparatus 10 to be measured.

As described above, according to the present preferred embodiment, the variable amplifiers 35-1 to 35-4 and the variable phase shifters 36-1 to 36-4 can be adjusted so that the magnetic field characteristics of the magnetic field probes 1 become the predetermined characteristics, and therefore, the SAR distribution can be measured with higher accuracy by calibrating the measuring apparatus. It is to be noted that the characteristic structures of the second to fourth preferred embodiments can be also applied to the fifth preferred embodiment.

The above-mentioned preferred embodiment is provided with the variable amplifiers 35-1 to 35-4 and the variable phase shifters 36-1 to 36-4. However, the present invention is not limited to this, and it is acceptable to provide at least one of the variable amplifiers 35-1 to 35-4 and the variable phase shifters 36-11 to 36-4.

Sixth Preferred Embodiment

Figure 8:
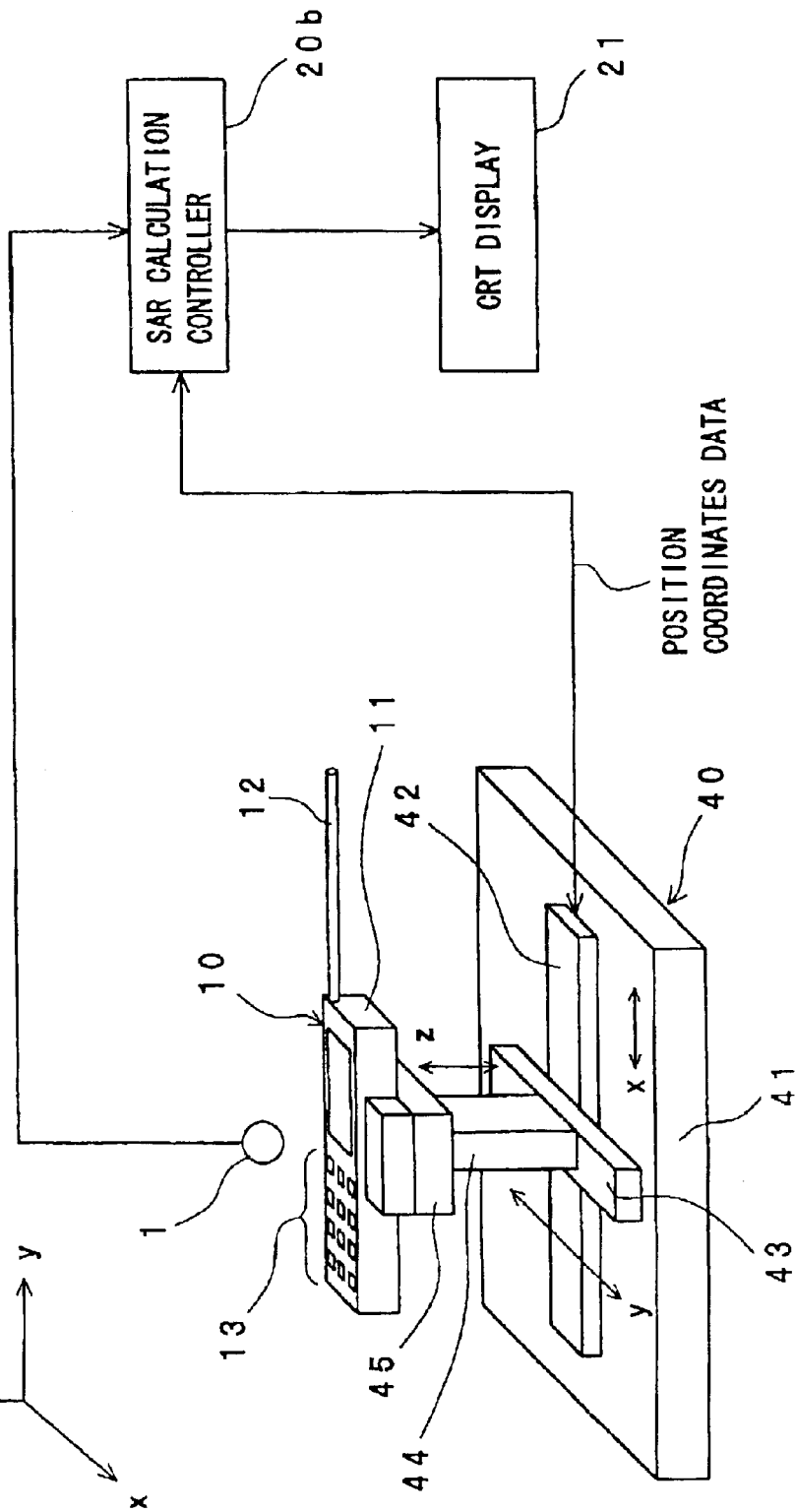
FIG. 8 is a perspective view and a block diagram showing a structure of an SAR measuring apparatus for measuring an SAR of a portable radio apparatus 10 according to a sixth preferred embodiment of the present invention.

FIG. 8 is a perspective view and a block diagram showing a structure of an SAR measuring apparatus for measuring the SAR of a portable radio apparatus 10 according to the sixth preferred embodiment of the present invention. The SAR measuring apparatus of this sixth preferred embodiment is characterized in that it is provided with a movement mechanism apparatus 40 for moving the portable radio apparatus 10 while supporting the radio apparatus in the mutually orthogonal x-direction, y-direction and z-direction, and an SAR is measured by measuring the near magnetic field of the portable radio apparatus 10 by using one magnetic field probe 1.

Referring to FIG. 8, the movement mechanism apparatus 40 is constituted by comprising, on its support base 41 an X-stage 42 movable in the x-direction, a Y-stage 43 movable in the y-direction, a supporting column 44 extended in the z-direction above the support base 41 and a movement support section 45 that is movable in the longitudinal direction (z-direction) of the supporting column 44 and supports the portable radio apparatus 10. In this case, the portable radio apparatus 10 is supported by the movement support section 45 so that the keyboard section 13 faces upward and moved in the x-direction, y-direction and z-direction which are orthogonal to each other. In the sixth and subsequent preferred embodiments, the x-direction is set in the direction parallel to the longitudinal direction of the portable radio apparatus 10, and the y-direction is set in the direction parallel to the horizontal direction of the portable radio apparatus 10. It is to be noted that the movement in the z-direction is used in the eighth and subsequent preferred embodiments described later. In the movement mechanism apparatus 40, the position coordinates (x, y) of the magnetic field detection position of the portable radio apparatus 10 with respect to the magnetic field probe 1 are previously calibrated, and the movement mechanism apparatus 40 calculates the position coordinate data (x, y) of the magnetic field detection position, and outputs the data to an SAR calculation controller 20b.

Moreover, the one magnetic field probe 1 is arranged so that the cross section of its circular loop becomes perpendicular to the front surface of the portable radio apparatus 10. As described above, the magnetic field probe 1 detects the near magnetic field on the front surface of the keyboard section 13 by scanning on, for example, the xy-plane, and then, outputs a detection signal that represents the detection voltage to the SAR calculation controller 20b via the detection signal cable 2. In response to this, the SAR calculation controller 20b executes the SAR calculation process of FIG. 13 as described in detail later for a plurality of predetermined position coordinates (x, y), referring to the position coordinates data from the movement mechanism apparatus 40, and calculates the two-dimensional distribution $H^2(x, y)$ in the horizontal plane of the square value of the near magnetic field on the front surface of the portable radio apparatus 10 based on the inputted detection signal, and then, thereafter calculates the SAR distribution SAR(x, y) in the horizontal direction by using an equation (6) described later, and outputs to and displays the data of the calculated results on the CRT display 21.

Figure 9:
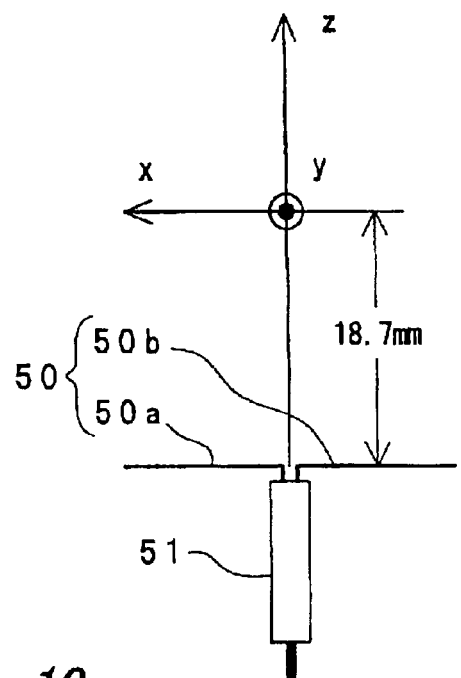
FIG. 9 is a sectional view showing a coordinate system of magnetic field distribution measurement of a dipole antenna 50 of a reference antenna apparatus.
Figure 10:
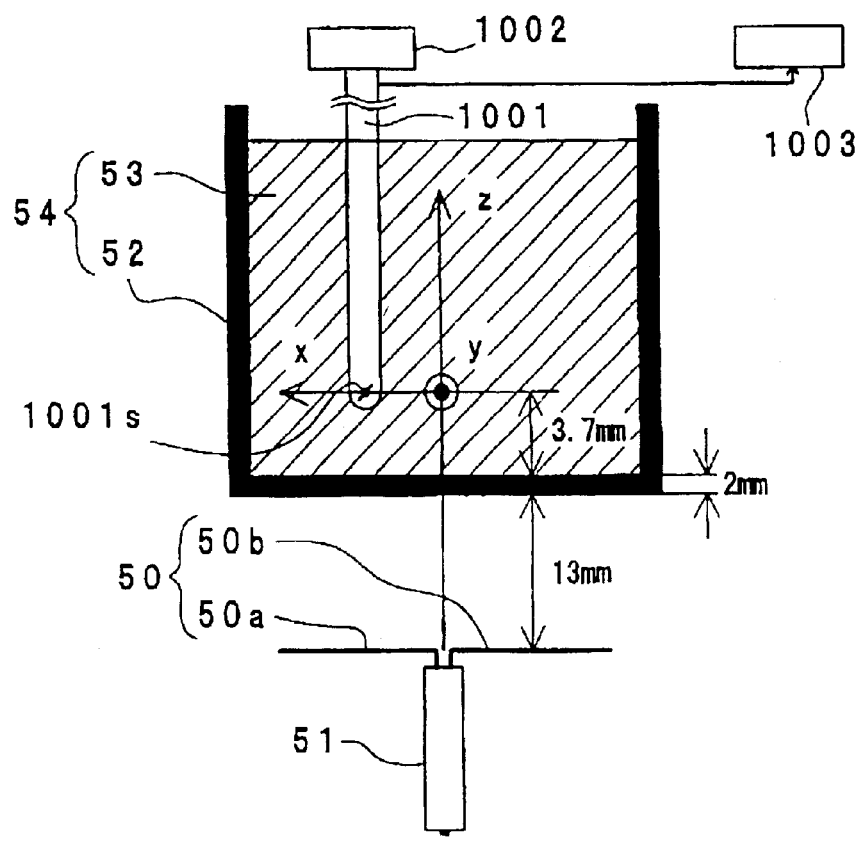
FIG. 10 is a sectional view showing a coordinate system of SAR measurement using a cubic phantom 54.

Next, it will be described that an SAR distribution can be estimated from the near magnetic field intensity distribution in free space, namely, the measurement principle of the present preferred embodiment will be described below. The distribution of a near magnetic field intensity H and SAR were measured when a half-wavelength dipole antenna having a simple structure was used as a reference antenna as one example. FIG. 9 is a sectional view showing a coordinate system of near magnetic field distribution measurement of a dipole antenna 50 of a reference antenna apparatus, and FIG. 10 is a sectional view showing a coordinate system of SAR measurement using a cubic phantom 54.

Referring to FIG. 9, the half-wavelength dipole antenna 51 of the reference antenna is constituted by two antenna elements 50a and 50b, and a transmission signal is fed via a balun (unbalanced to balanced transformer) 51 to the antenna elements 50a and 50b. The dipole antenna 51 is aligned so that a distance from its feeding point to the origin of the xyz-coordinate system becomes 18.7 mm. In this case, the frequency of the transmission signal is set to 900 MHz. As shown in FIG. 10, the cubic phantom 54 used for the SAR measurement is constituted by filling a 200-mm square cubic container 52 made of 2-mm thick acrylic with an SAR solution 53 that has a dielectric constant of $\epsilon_r=41.8$ and an electric conductivity of $\sigma=0.84$ S/m similar to the dielectric constant and the electric conductivity of the human head portion. In this case, the SAR measurement by a standard measurement method is performed by inserting an electric field probe 1001 having a sensor portion 1001s in the SAR solution 53. The SAR distribution in FIG. 10 can be obtained as follows. The electric field probe 1001 is moved to be scanned in the x-direction and the y-direction along the surface configuration of the cubic phantom 54 by means of a movement mechanism apparatus 1002. An SAR calculation controller 1003 calculates the electric field intensity based on a detection signal that represents the electric field intensity from the electric field probe 1001, and then, calculates and outputs the SAR distribution by using the equation (1) based on the electric field intensity. It is to be noted that the movement by the movement mechanism apparatus 1002 is only required to be able to move the electric field probe 1001 relatively to the cubic phantom 54 and the half-wavelength dipole antenna 50. That is, the cubic phantom 54 and the half-wavelength dipole antenna 50 may be moved relatively to the electric field probe 1001.

Figure 11:
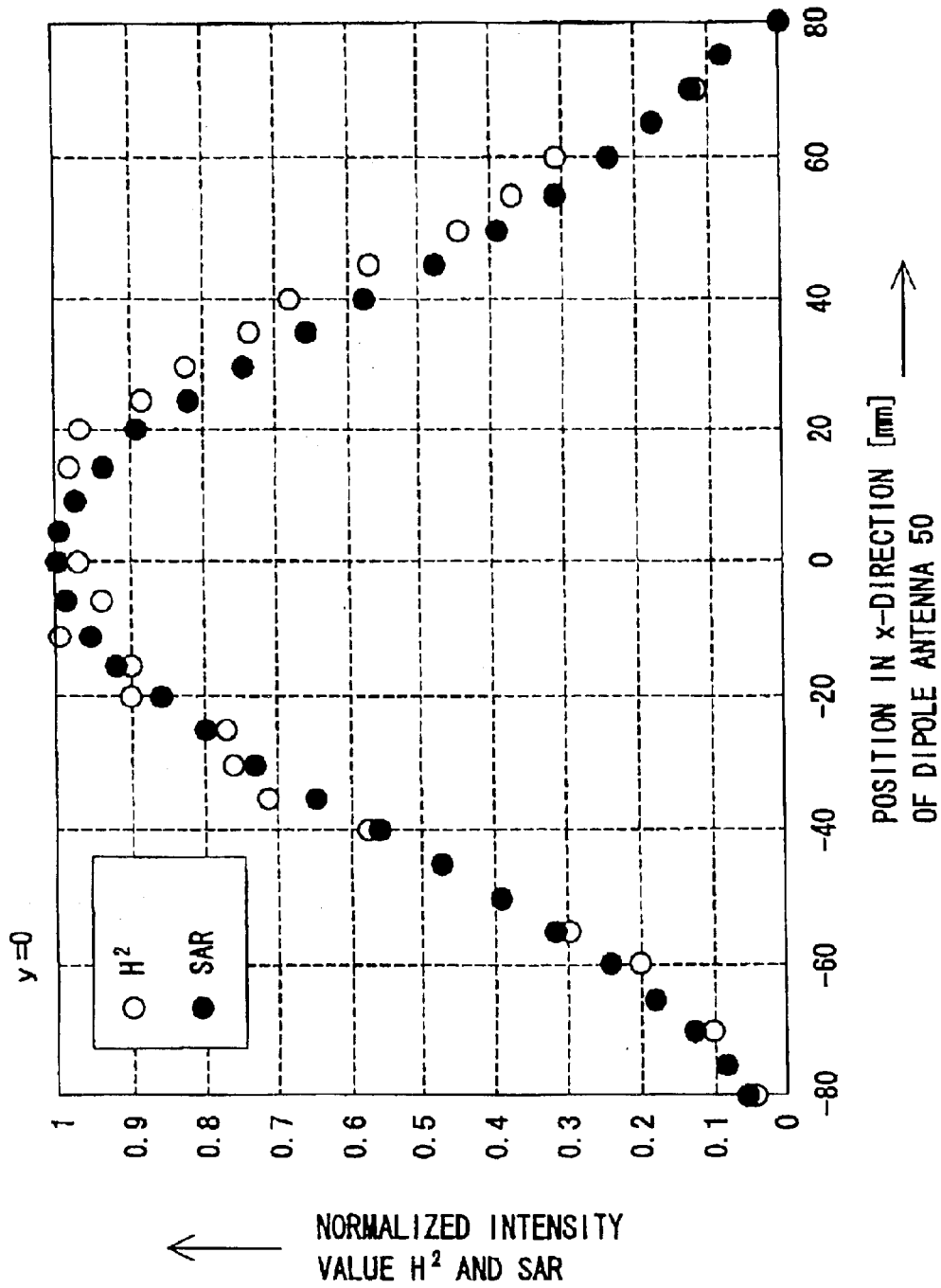
FIG. 11 is a graph showing distributions of a normalized magnetic field square value $H^2$ and SAR with respect to a position in an x-direction in free space when y=0 in the dipole antenna 50 of FIG. 9.
Figure 12:
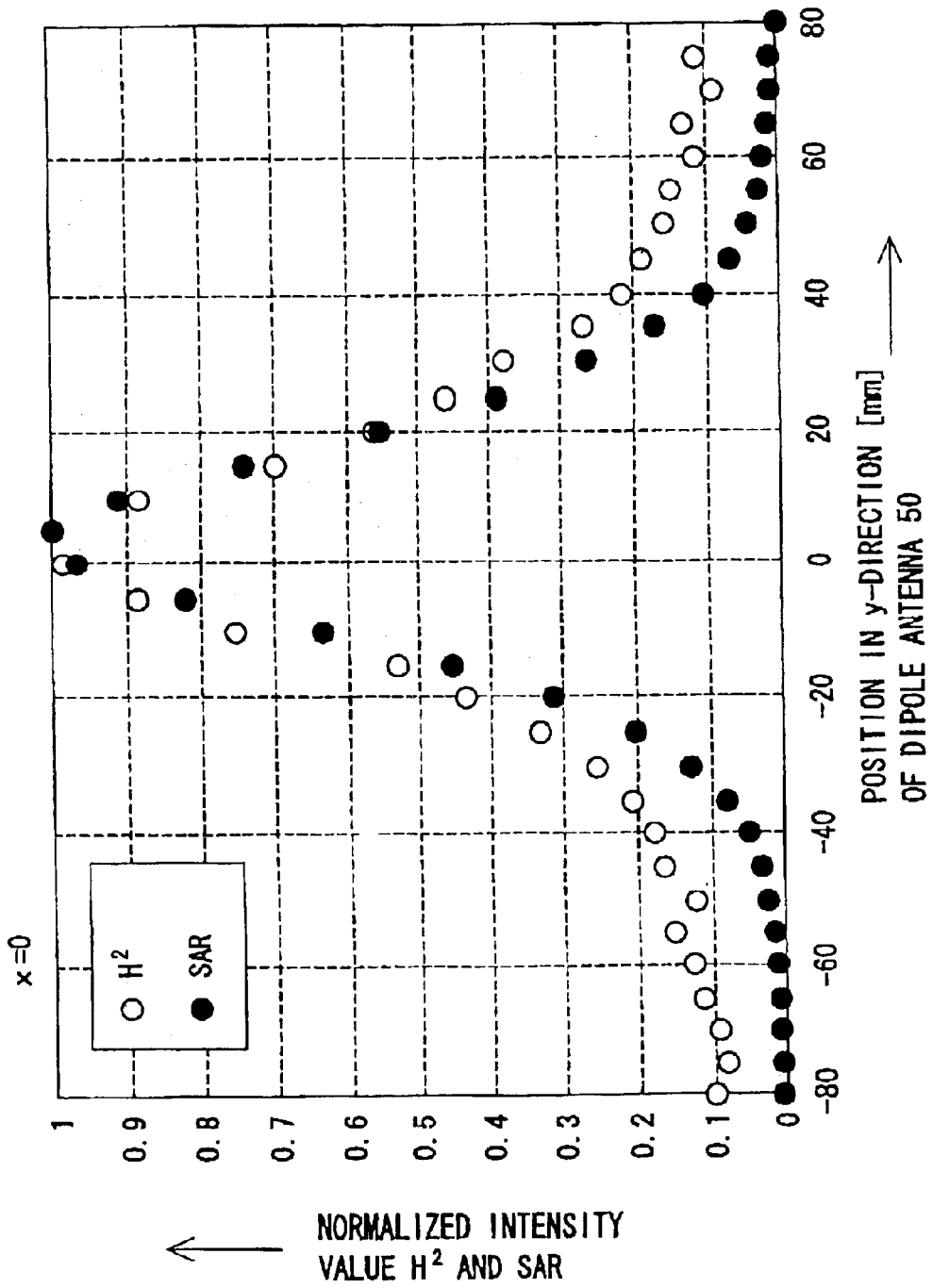
FIG. 12 is a graph showing distributions of a normalized magnetic field square value $H^2$ and SAR with respect to a position in a y-direction in free space when x=0 in the dipole antenna 50 of FIG. 9.

FIG. 11 is a graph showing a distributions of a normalized magnetic field square value $H^2$ and SAR with respect to a position in the x-direction in free space when y=0 (on the x-axis) in the dipole antenna 50 of FIG. 9, and FIG. 12 is a graph showing a distributions of a normalized magnetic field square value $H^2$ and SAR with respect to a position in the y-direction in free space when x=0 (on the y-axis) in the dipole antenna 50 of FIG. 9. It is to be noted that the distribution of the magnetic field square value $H^2$ and the distribution of SAR are both normalized by the respective maximum values.

As is apparent from FIGS. 11 and 12, there is a close resemblance between the distribution of the near magnetic field square value $H^2$ and the distribution of SAR. That is, it can be found that there is a relationship of $SAR \propto H^2$ from FIGS. 11 and 12. For this reason, the SAR distribution can be estimated by measuring the near magnetic field in free space on the front surface of the portable radio apparatus 10 even if the electromagnetic mutual coupling between the portable radio apparatus 10 and the phantom 54 is not taken into consideration.

The measurement by the SAR measuring apparatus of the present preferred embodiment is performed by first of all detecting the magnetic field radiated from the half-wavelength dipole 50 of the reference antenna or the portable radio apparatus of the reference radio apparatus by means of the magnetic field probe 1 and by then calculating the position coordinate data (x, y) of the magnetic field probe 1 for these apparatuses by means of the movement mechanism apparatus 40 and outputting the data to the SAR calculation controller 20b. In this case, the normal line direction of the front surface (i.e., display surface) of the keyboard section 13 of the portable radio apparatus 10 is set to the +z-direction, the longitudinal direction of the portable radio apparatus 10 is set to the x-direction, and the transverse direction of the portable radio apparatus 10 is set to the y-direction. The near magnetic field of the portable radio apparatus 10 is measured by scanning on the support base 41 measurement points on the xy-plane located apart by a certain interval in the +z-direction from the portable radio apparatus 10 while moving the movement support section 45 of the movement mechanism apparatus 40 by means of the X-stage 43 and the Y-stage 44. The transformation factor distribution α(x, y) is calculated for a plurality of predetermined position coordinates (x, y) by using the following equation, based on (a) the near magnetic field distribution $H_{ref}$(x, y) previously measured when it is radiated from the half-wavelength dipole 50 of the reference antenna or the portable radio apparatus of the reference radio apparatus, and (b) its SAR distribution $SAR_{ref}$(x, y) measured actually previously by using the above-mentioned standard measurement method:

$$\alpha(x, y) = \frac{SAR_{ref}(x, y)}{H^2_{ref(x,y)}}, \quad (5)$$

where $SAR_{ref}$(x, y) denotes an SAR distribution of the portable radio apparatus of the reference radio apparatus, and $H_{ref}$(x, y) denotes a near magnetic field distribution in free space of the portable radio apparatus of the reference radio apparatus. Therefore, the SAR of the portable radio apparatuses 10 of the same type mass-produced can be calculated by using the transformation factor distribution α(x, y) and using the following equation, and the SAR distribution of the portable radio apparatuses 10 successively produced on, for example, a production line or the like can be measured extremely easily:

$$SAR_{estimate}(x, y) = \alpha(x, y) \cdot H^2_{measure}(x, y) \quad (6).$$

It is to be noted that $SAR_{estimate}$(x, y) is an estimated SAR distribution of the portable radio apparatus 10 to be measured, and $H_{measure}$(x, y) is a near magnetic field distribution in free space of the portable radio apparatus 10 to be measured. The SAR distribution of the portable radio apparatus 10 can be estimated and calculated based on the near magnetic field in free space by the above-mentioned method.

Figure 13:
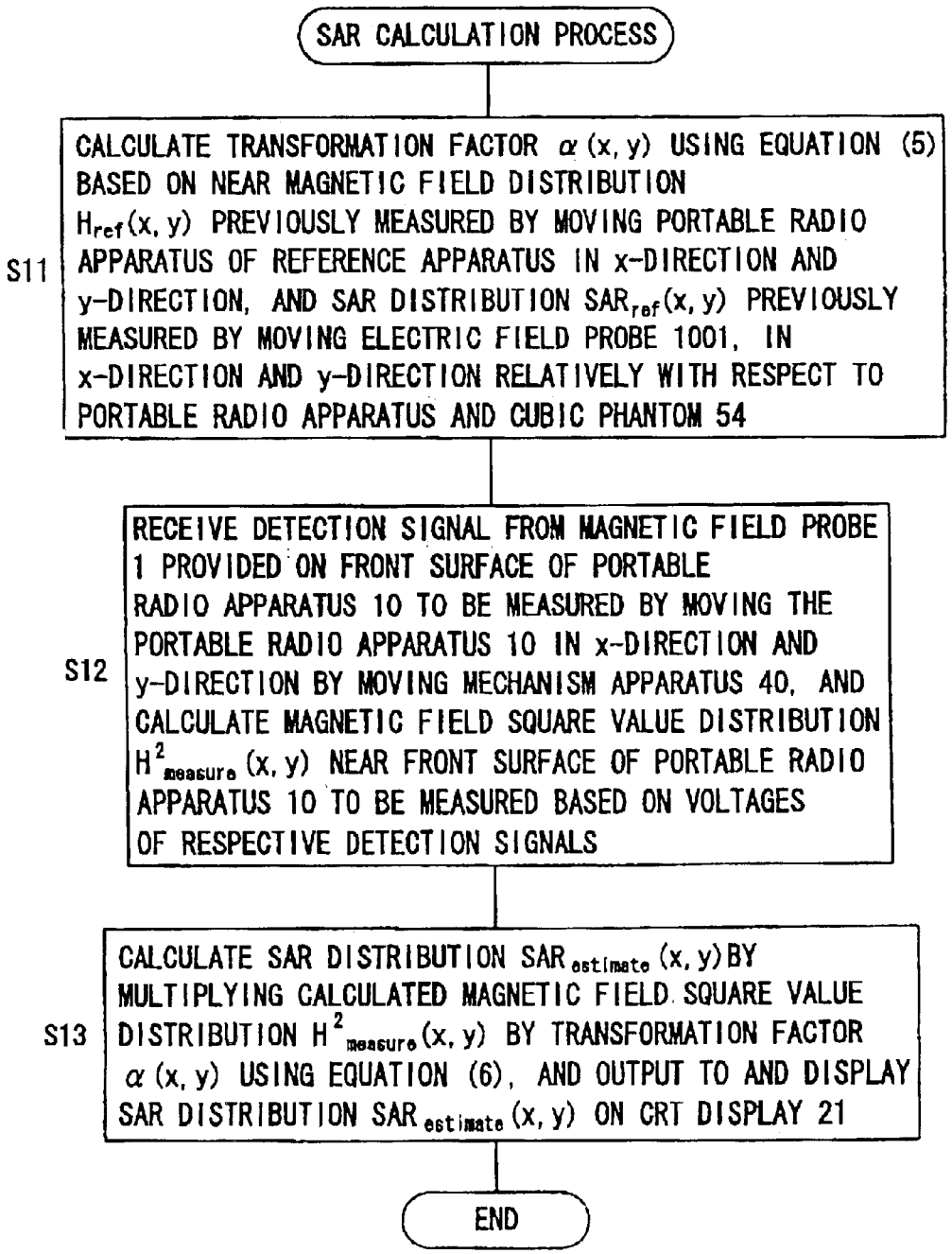
FIG. 13 is a flowchart showing an SAR calculation process executed by an SAR calculation controller 20b of FIG. 8.

FIG. 13 is a flowchart showing an SAR calculation process executed by the SAR calculation controller 20b of FIG. 8.

In the SAR calculation process of FIG. 13, first of all, in step S11, a transformation factor distribution α(x, y) is calculated for a plurality of predetermined position coordinates (x, y) by using the equation (5), based on (a) the near magnetic field distribution $H_{ref}$(x, y) previously measured while moving the portable radio apparatus of the reference radio apparatus in the x-direction and the y-direction by using the movement mechanism apparatus 40, and (b) the SAR distribution $SAR_{ref}$(x, y) previously measured while moving the electric field probe 1001 in the x-direction and the y-direction with respect to the portable radio apparatus and the cubic phantom 54. In this case, the near magnetic field distribution $H_{ref}$(x, y) can be measured by using the magnetic field probe 1, and the SAR distribution $SAR_{ref}$(x, y) can be measured by using the above-mentioned standard measurement method. Next, in step S12, the detection signal from the magnetic field probe 1, which is provided on the apparatus surface and detects the near magnetic field, is received while moving the portable radio apparatus 10 to be measured in the x-direction and the y-direction by means of the movement mechanism apparatus 40, and the magnetic field square value distribution $H^2_{measure}$(x, y) in the vicinity of the front surface of the portable radio apparatus 10 to be measured is calculated for a plurality of determined position coordinates (x, y) based on the voltage of the detection signal. Further, in step S13, the SAR distribution $SAR_{estimate}$(x, y) is estimated and calculated by multiplying the calculated magnetic field square value distribution $H^2_{measure}$(x, y) by the calculated transformation factor distribution α(x, y) using the equation (6), and the calculated SAR distribution $SAR_{estimate}$(x, y) is outputted to and displayed on the CRT display 21. Then the SAR calculation process is completed.

Next, the results of actually calculating SAR by using the above-mentioned SAR estimating and calculating method will be described below.

The estimation and analysis of SAR was performed by using an FDTD method with regard to a spherical-ball-shaped phantom 55 of the standard conforming to IEEE SCC (Standards Coordinating Committee) 34 as a human head model and the half-wavelength dipole antenna 50 of the reference antenna arranged in the vicinity of the phantom. It is acceptable to estimate and analyze the SAR and its SAR distribution by using the FDTD method instead of the above-mentioned SAR standard measurement method used in each of the preferred embodiments of the present invention.

Figure 14:
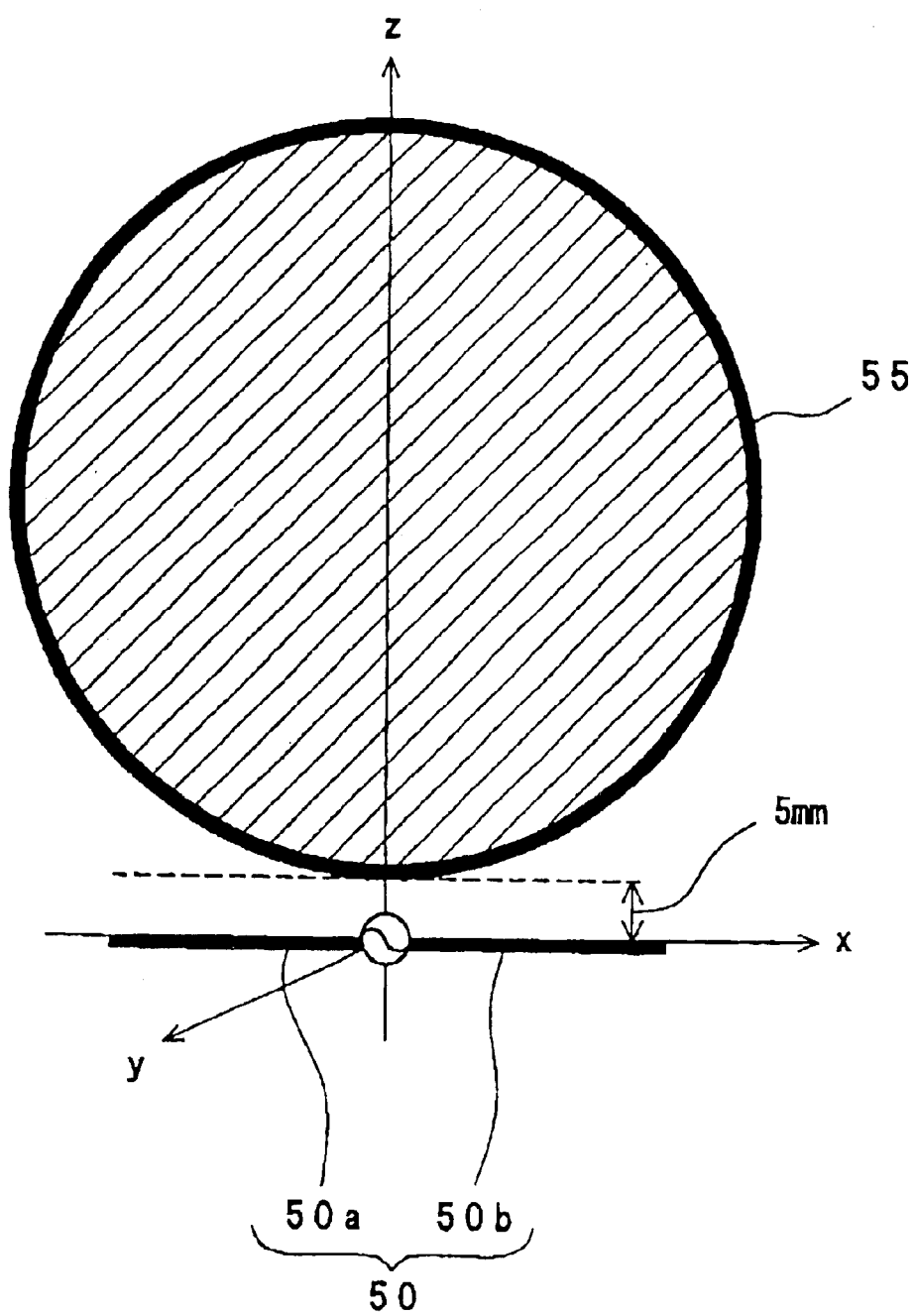
FIG. 14 is a sectional view showing a coordinate system of a magnetic field distribution measurement of a dipole antenna 50 employing a ball-shaped phantom 55.

FIG. 14 is a sectional view showing a coordinate system of a magnetic field distribution measurement of the dipole antenna 50 employing the ball-shaped phantom 55.

Referring to FIG. 14, the feeding point of the dipole antenna 50 is set to the origin of the xyz-coordinate system, and the dipole antenna 50 having an antenna length of 158 mm was arranged along the x-axis. The ball-shaped phantom 55 had its center located in the z-direction, and there was an arrangement in which a closest approach distance in the z-direction between the bottom surface of the ball-shaped phantom 55 and the dipole antenna 50 became 5 mm. The ball-shaped phantom 55 has a spherical shape of an inside diameter of 200 mm, a dielectric constant of $\epsilon_r$=41.5 and an electric conductivity of σ=0.95 S/m. In this case, the frequency of the transmission signal from the dipole antenna 50 is set to 900 MHz.

Figure 15:
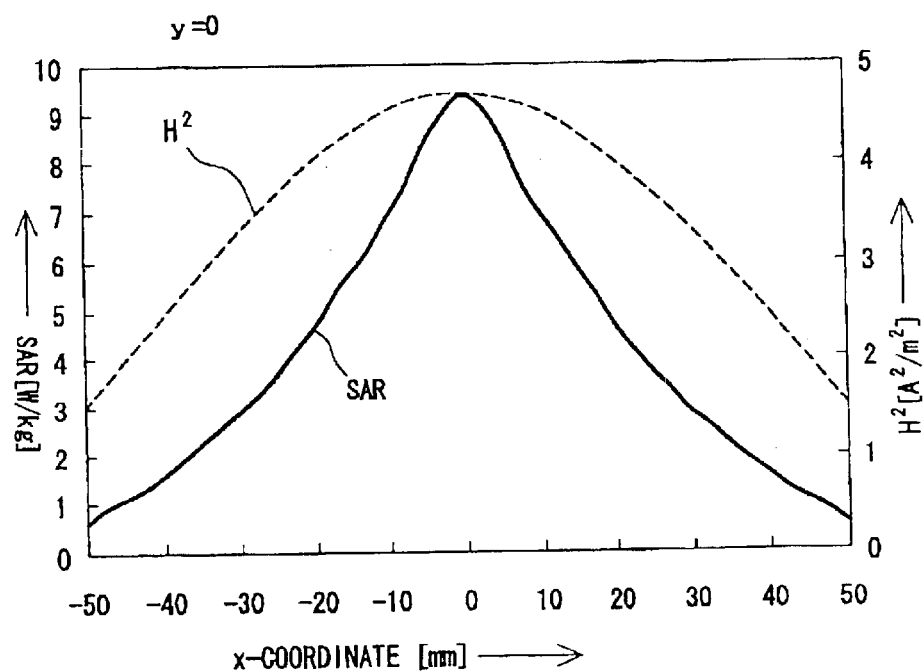
FIG. 15 is a graph showing distributions of a normalized magnetic field square value $H^2$ and SAR with respect to a position in the x-direction (x-coordinate) in free space when y=0 in the dipole antenna 50 of FIG. 14.
Figure 16:
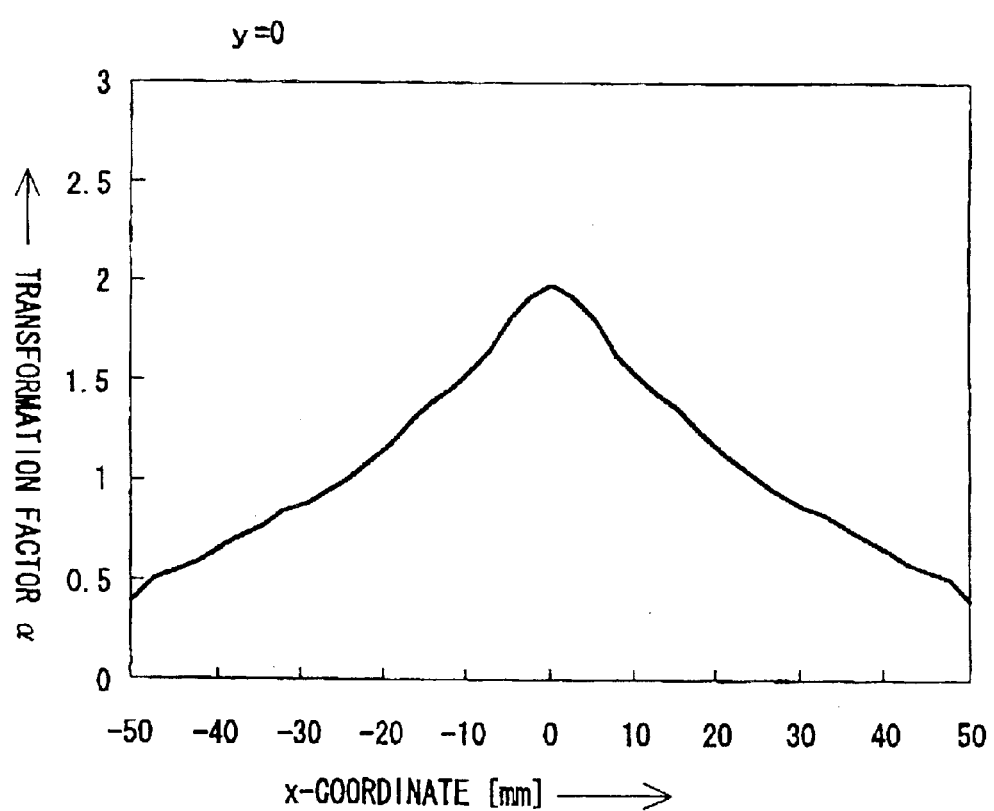
FIG. 16 is a graph showing a distribution of a transformation factor α with respect to a position in the x-direction (x-coordinate) in free space, estimated and calculated based on the graph of FIG. 15.

FIG. 15 is a graph showing a distributions of a normalized magnetic field square value $H^2$ and SAR with respect to a position in the x-direction (x-coordinate) in free space when y=0 in the dipole antenna 50 of FIG. 14. It is to be noted that the distribution of the magnetic field square value $H^2$ of FIG. 15 has the analyzed values at a position located apart by a distance of 5 mm from the dipole antenna 50 in the +z-direction. It is assumed that the distributions of the magnetic field square value $H^2$ and SAR of FIG. 15 are $H^2_{ref}$(x) and $SAR_{ref}$(x), respectively, and the transformation factor distribution α(x) is calculated by using the equation (4). This transformation factor distribution α(x) is shown in FIG. 16. As is apparent from FIG. 16, it can be understood that the transformation factor α(x) is changed in accordance with the position in the y-direction and has a maximum value roughly at the feeding point of the dipole antenna 50.

Figure 17:
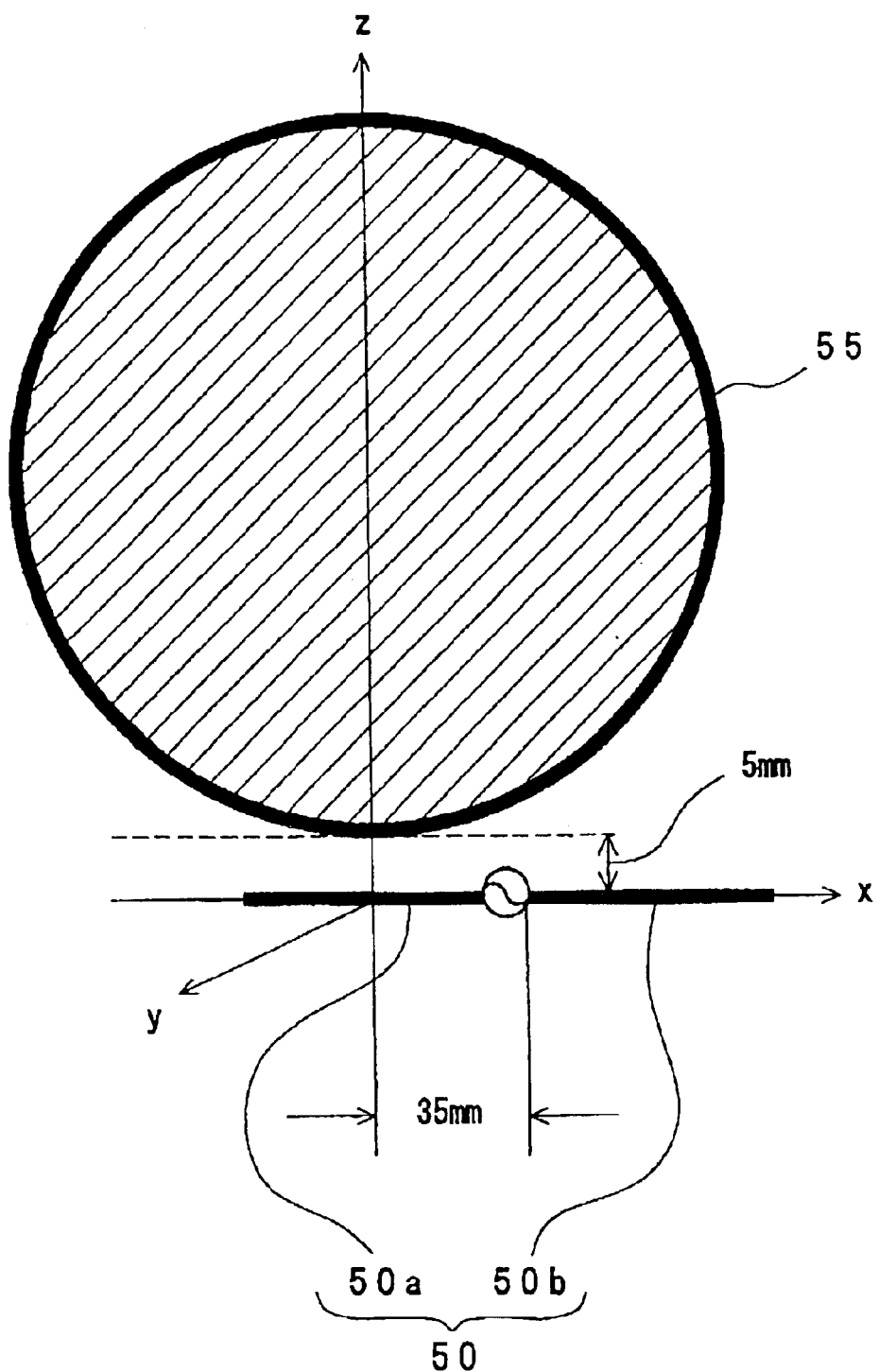
FIG. 17 is a sectional view showing a coordinate system of the magnetic field distribution measurement of the dipole antenna 50 when the position of the dipole antenna 50 located to as to be adjacent to the ball-shaped phantom 55 of FIG. 14 is moved by 35 mm in the x-direction.

FIG. 17 is a sectional view showing a coordinate system of the near magnetic field distribution measurement of the dipole antenna 50 when the position of the dipole antenna 50 located so as to be adjacent to the ball-shaped phantom 55 of FIG. 14 is moved by 35 mm in the x-direction. That is, as shown in FIG. 17, it is assumed that the near magnetic field distribution in free space at y=0 mm when the dipole antenna 50 at the position of FIG. 14 is moved by 35 mm in the x-direction is $H_{measure}$(x).

Figure 18:
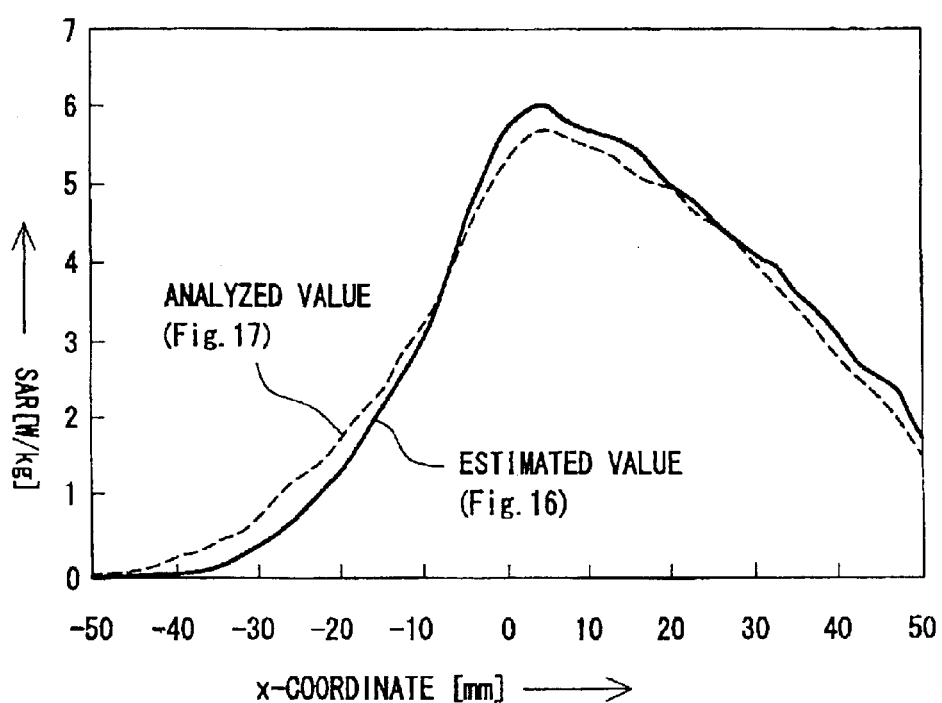
FIG. 18 is a graph of an SAR distribution with respect to the position in the x-direction (x-coordinate) of the dipole antenna 50 shown in FIGS. 14 and 17, showing an analytical value of FIG. 17 and an estimated value of FIG. 16.

FIG. 18 shows an estimated calculation value of SAR (hereinafter referred to as an estimated SAR distribution) calculated by multiplying the square value of the near magnetic field distribution $H_{measure}$(x) by the transformation factor distribution α(x) of FIG. 16, and analyzed values of the SAR distribution analyzed by the estimated analysis method of SAR by using the FDTD method in the state of FIG. 17. As is apparent from FIG. 18, the estimated SAR distribution obtained by using the multiplication equation of $\alpha H^2$ become values very close to those of the analyzed SAR distribution analyzed by the estimating and analyzing method of SAR by using the FDTD method. According to the results, it can be understood that the SAR of different current distributions in the near radiation magnetic field can be estimated and calculated by multiplying the transformation factor distribution $\alpha(x)$ in the x-direction by the square value $H^2$ of the near magnetic field in free space.

Next, the above-mentioned SAR estimation calculation is performed with regard to the actual portable radio apparatus 10.

Figure 19:
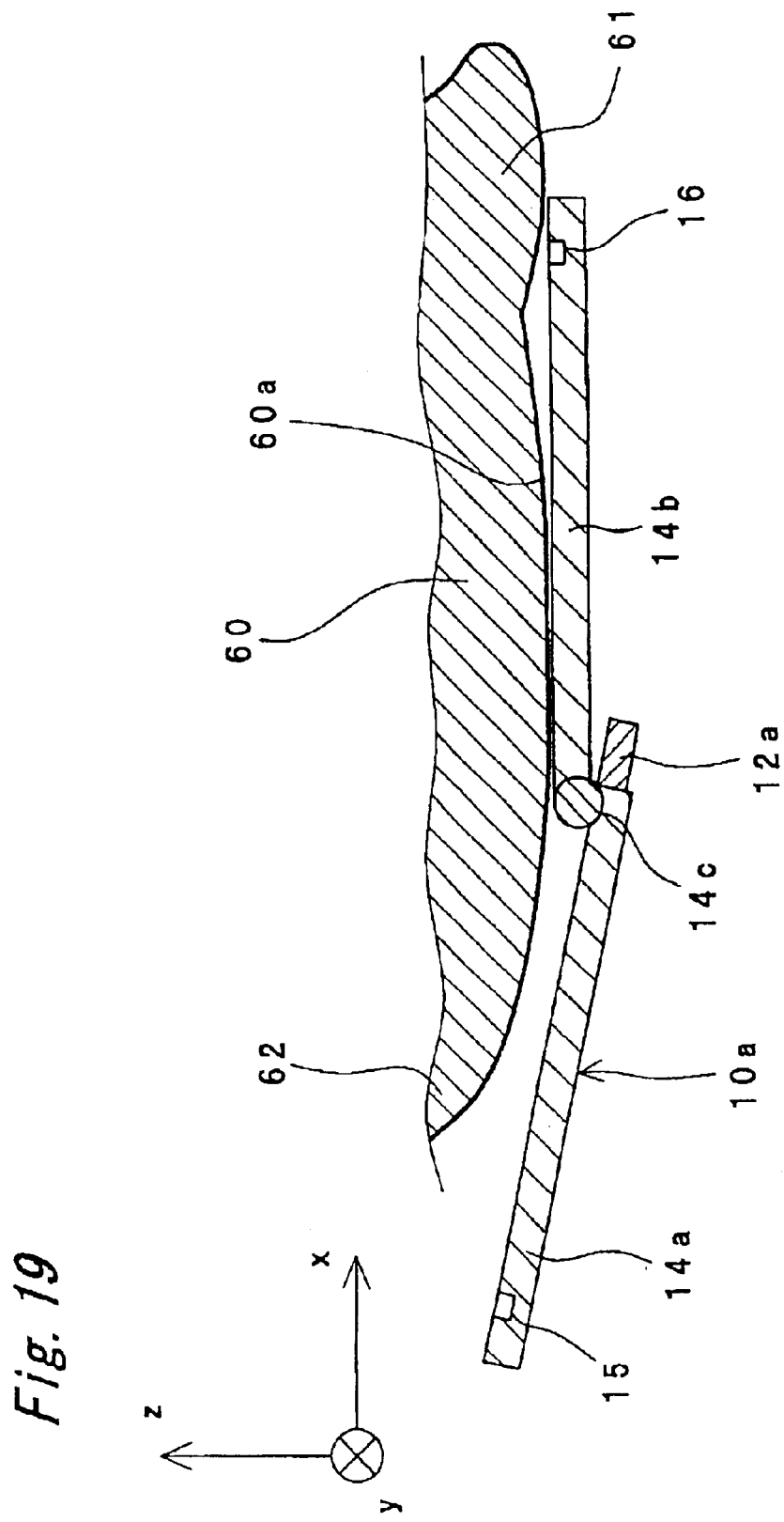
FIG. 19 is a sectional view on a zx-plane, showing a positional relationship between a head portion 60 of a human body phantom and a folding type portable radio apparatus 10a when the folding type portable radio apparatus 10a is made to be in contact with a right-hand side surface 60a of the head portion 60 of the human body phantom and a whip antenna 12a of the portable radio apparatus 10a is retracted.
Figure 20:
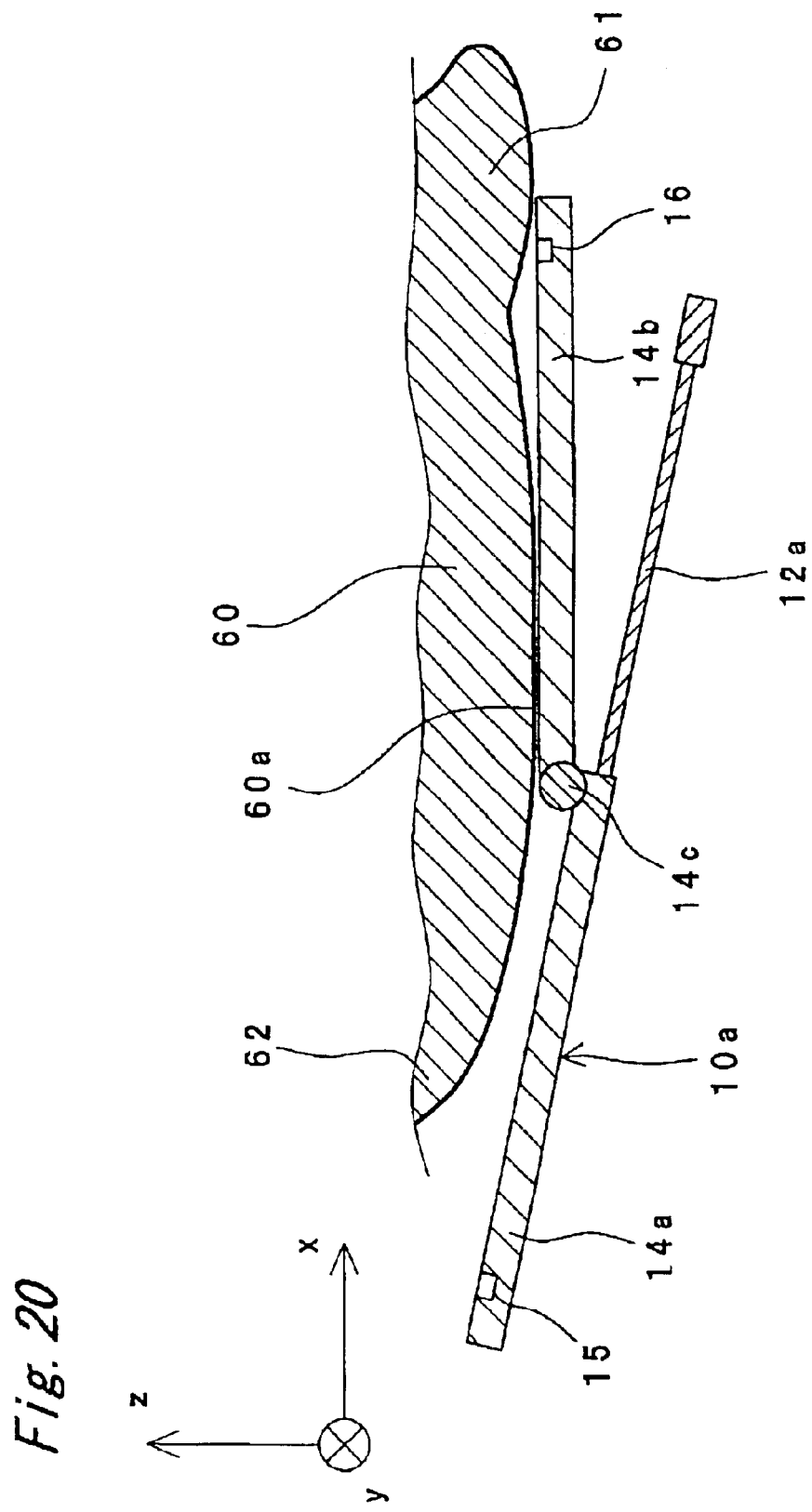
FIG. 20 is a sectional view on the zx-plane, showing a positional relationship between the head portion 60 of the human body phantom and the folding type portable radio apparatus 10a when the folding type portable radio apparatus 10a is made to be in contact with the right-hand side surface 60a of the head portion 60 of the human body phantom and a whip antenna 12a of the portable radio apparatus 10a is extended.

FIG. 19 is a sectional view in the zx-plane, showing a positional relationship between the head portion 60 of a human body phantom and a folding type portable radio apparatus 10a when the folding type portable radio apparatus 10a is made to be in contact with a right-hand side surface 60a of the head portion 60 of the human body phantom and a whip antenna 12a of the portable radio apparatus 10a is retracted, and FIG. 20 is a sectional view in the zx-plane, showing a positional relationship between the head portion 60 of the human body phantom and the folding type portable radio apparatus 10a when the folding type portable radio apparatus 10a is made to be in contact with the right-hand side surface 60a of the head portion 60 of the human body phantom and the whip antenna 12a of the portable radio apparatus 10a is extended.

Figure 29:
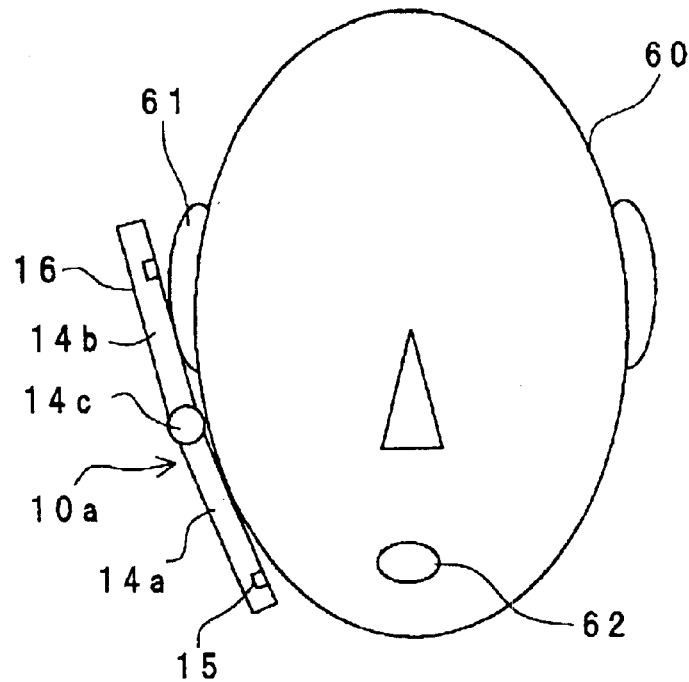
FIG. 29 is a front view showing a state of a first holding posture of the portable radio apparatus 10a with respect to a head portion 60 of a human body phantom in a seventh preferred embodiment of the present invention.

In FIGS. 19 and 20, the folding type portable radio apparatus 10a is constituted by joining a main body casing 14a located in a lower portion to a display section casing 14b located in an upper portion via a hinge 14c, and has a length of 200 mm and a width of 50 mm. In this case, in the vicinity of the hinge 14c of the main body casing 14a of the folding type portable radio apparatus 10a, the whip antenna 12a is provided so as to extend from the upper portion of the main body casing 14a. The whip antenna 12a is in a state as shown in FIG. 19 when retracted in the main body casing 14a. On the other hand, when the whip antenna 12a is extended from the main body casing 14a, the antenna is extended so as to extend in the longitudinal direction from the main body casing 14a as shown in FIG. 29. In this case, the folding type portable radio apparatus 10a is arranged so as to be adjacent to the head portion 60 of the human body phantom, and the head portion surface 60a is made to be in contact with the display section casing 14b. An ear portion 61 of the head portion 60 of the human body phantom is located so as to be adjacent to a sound hole portion 16 of a speaker, and a mouth portion 62 of the head portion 60 of the human body phantom is located so as to be adjacent to a microphone 15.

The state in which the whip antenna 12a was retracted as shown in FIG. 19 was assumed to be the reference state, and the near magnetic field $H_{ref}(x, y)$ was actually measured by using the magnetic field probe 1. On the other hand, the actually measured SAR distribution $SAR_{ref}(x, y)$ was measured by using the above-mentioned standard measurement method, and the transformation factor distribution $\alpha(x, y)$ was calculated by using the equation (5). Subsequently, in the state in which the whip antenna 12a was extended as shown in FIG. 20, SAR estimation was performed by using the equation (6) and using the calculated transformation factor distribution $\alpha(x, y)$. It is to be noted that the characteristics of the solution of the head portion 60 of the human body phantom show a dielectric constant of $\epsilon_r=41.5$ and an electric conductivity of $\sigma=1.01$ S/m at a measurement frequency of 925 MHz.

Figure 21:
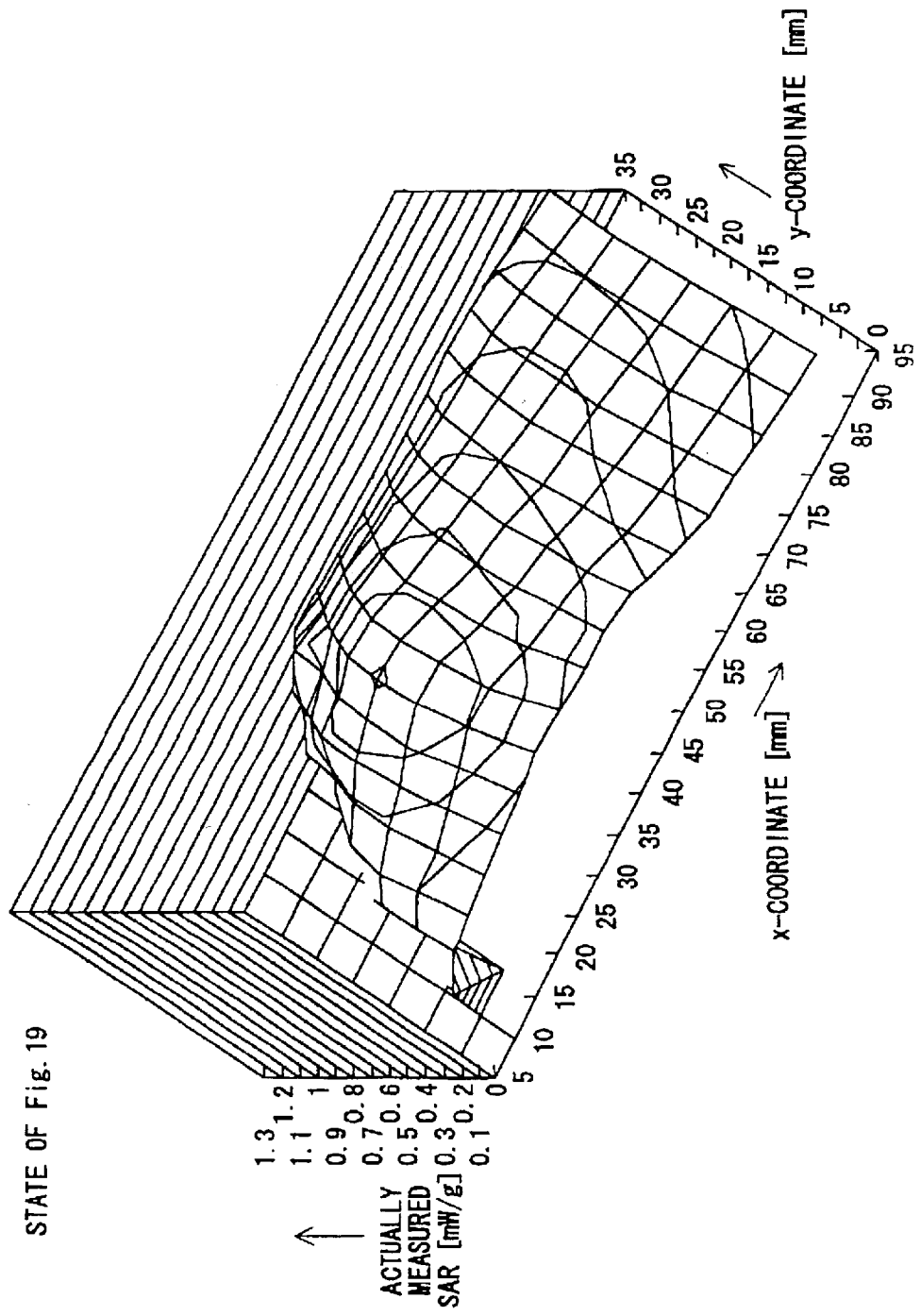
FIG. 21 is a graph showing a distribution of the actually measured SAR on an xy-plane in the state of FIG. 19.

FIG. 21 is a graph showing an actually measured SAR distribution on the xy-plane in the state of FIG. 19.

Figure 22:
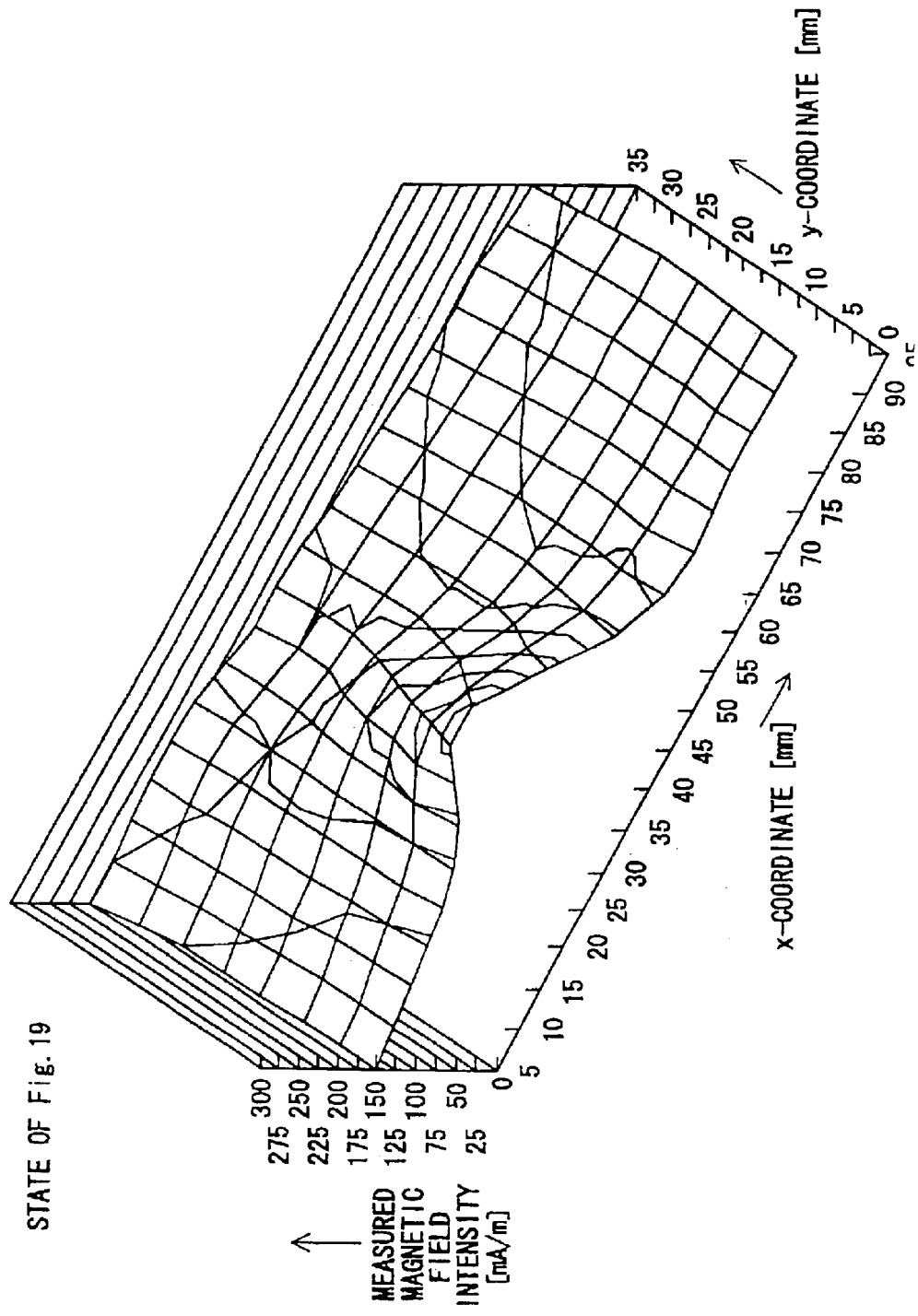
FIG. 22 is a graph showing a distribution of the magnetic field measured on the xy-plane in the state of FIG. 19.
Figure 23:
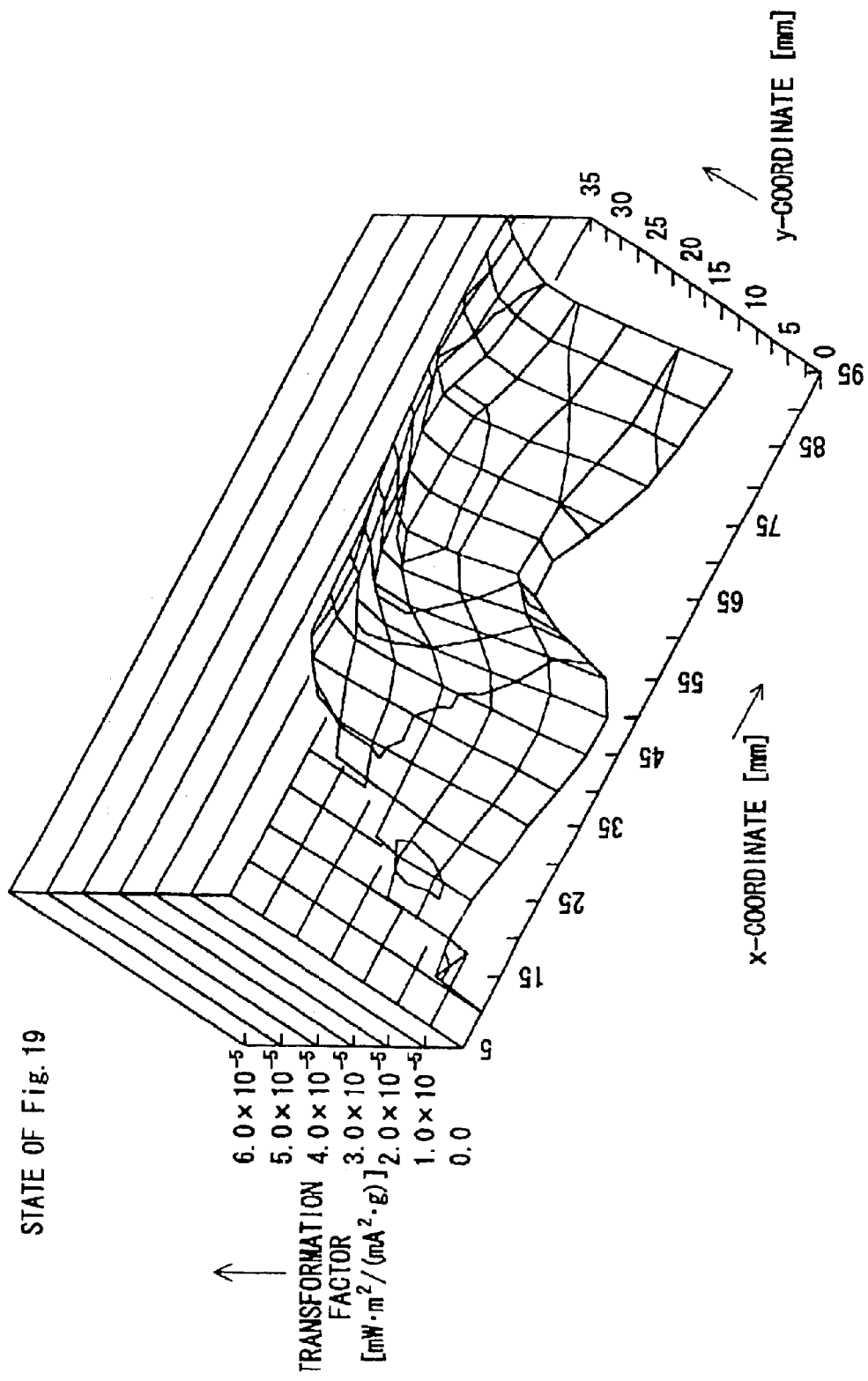
FIG. 23 is a graph showing a distribution of the transformation factor α calculated on the xy-plane in the state of FIG. 19.

Referring to FIG. 21, measurement intervals were set to 5 mm in the x-direction, and were set to 5 mm in the y-direction. A setting frequency of the transmission signal from the portable radio apparatus 10a was set to 925 MHz, and a transmission signal having a transmission power of 0.8 W was used. FIG. 22 is a graph showing a distribution of the magnetic field measured on the xy-plane in the state of FIG. 19. In this case, transmission setting conditions of the portable radio apparatus 10a were set to be similar to those of the SAR measurement stage, and a distance from the surface of the portable radio apparatus 10a to the magnetic field probe 1 was set to about 5 mm. The transformation factor distribution $\alpha(x, y)$ of the portable radio apparatus 10a was calculated by using the equation (5) based on the distribution $SAR_{ref}(x, y)$ of the actually measured SAR of FIG. 21 measured by using the above-mentioned standard measurement method and the distribution $H_{ref}(x, y)$ of the measured magnetic field intensity of the above-mentioned measured near magnetic field, and the result are shown in FIG. 23.

Figure 24:
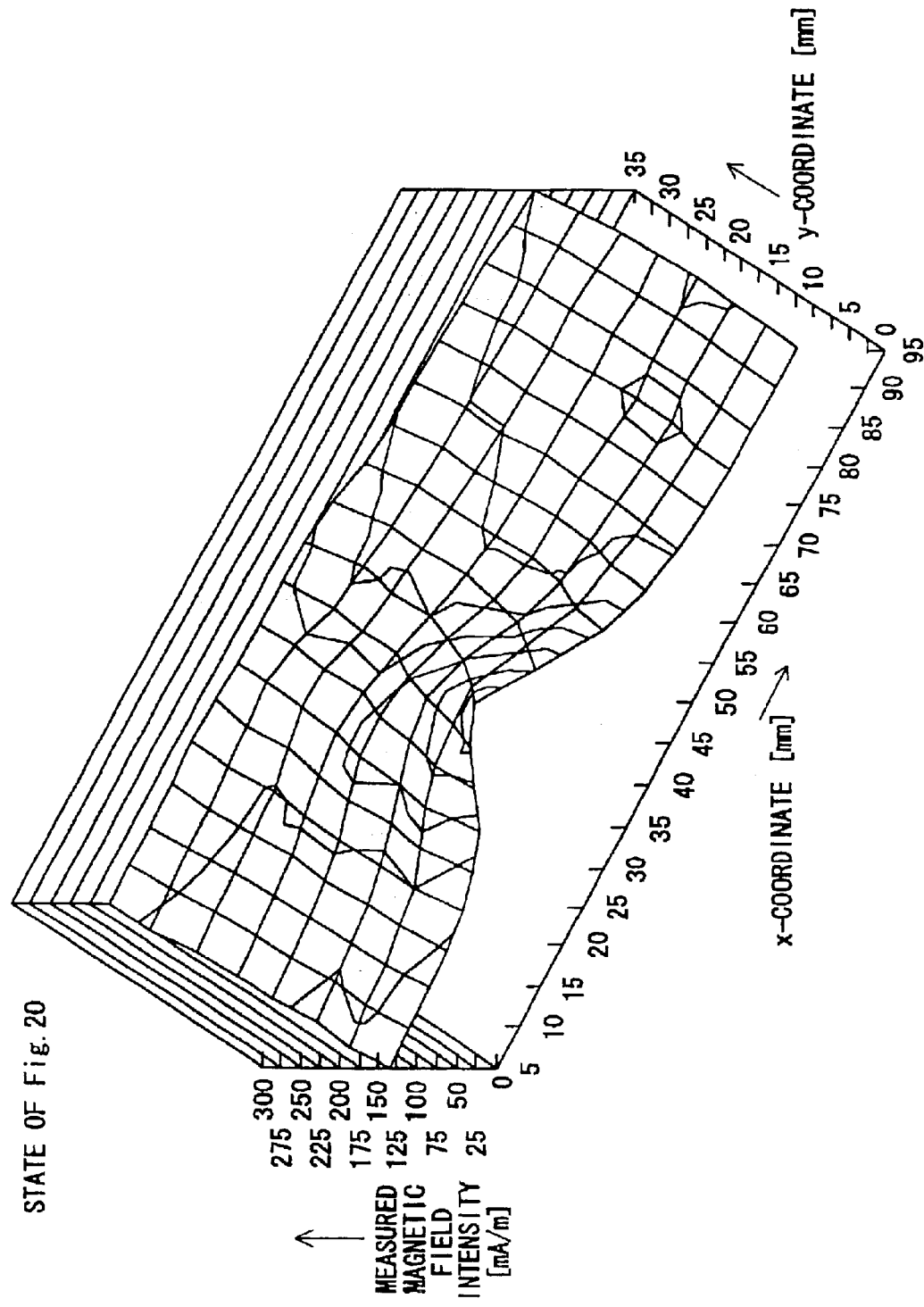
FIG. 24 is a graph showing a distribution of the magnetic field measured on the xy-plane in the state of FIG. 20.
Figure 25:
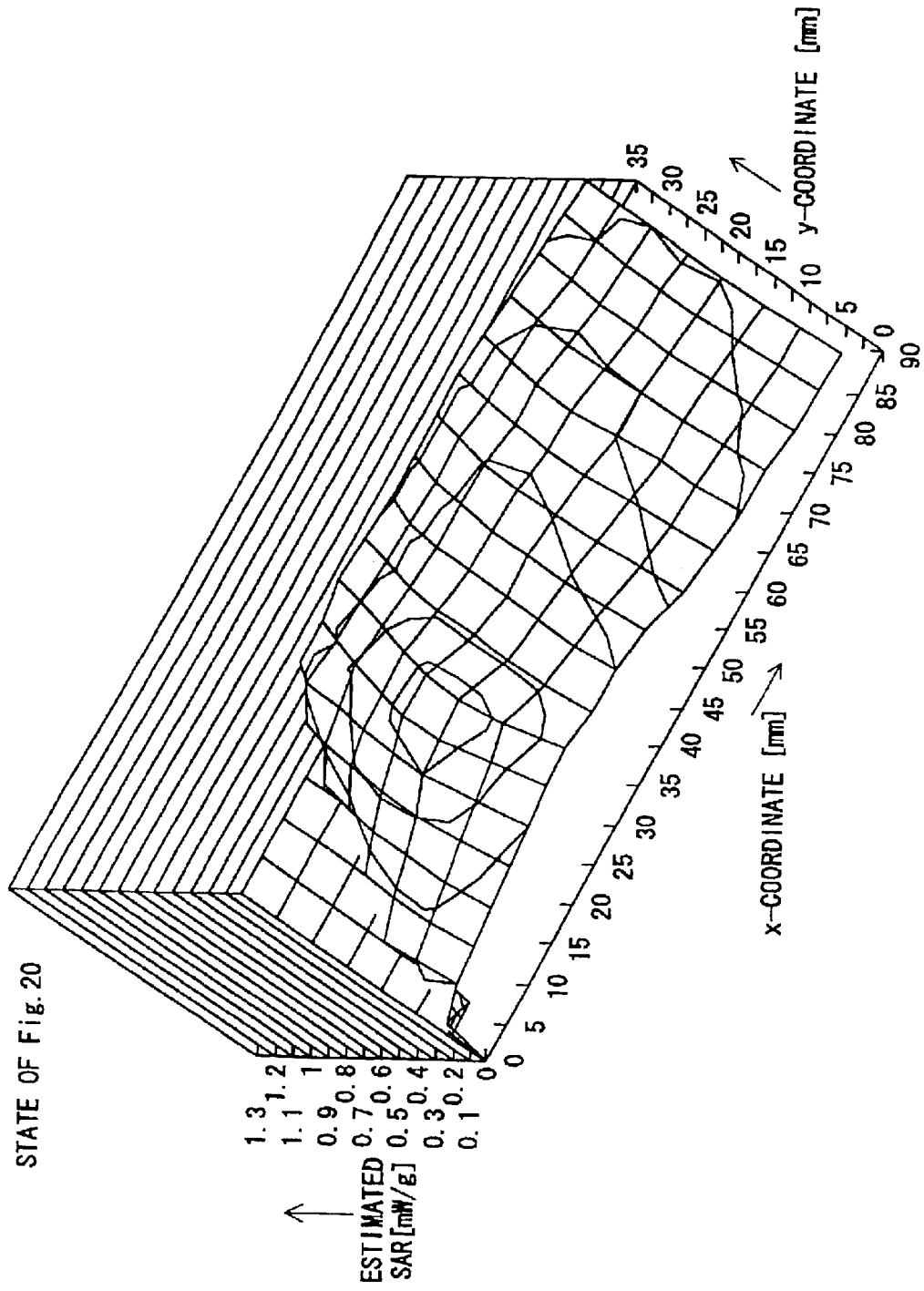
FIG. 25 is a graph showing a distribution of the estimated SAR on the xy-plane in the state of FIG. 20.
Figure 26:
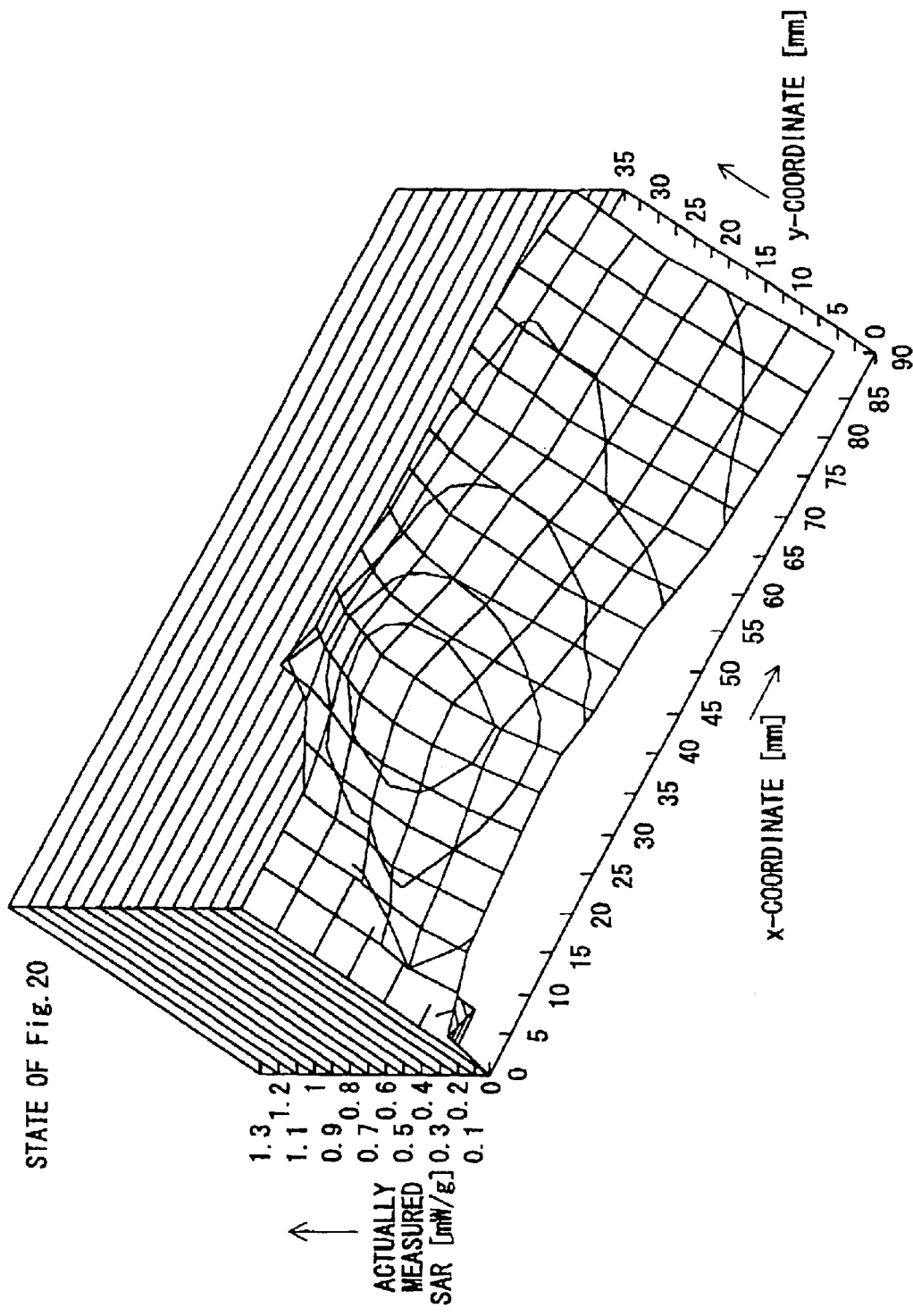
FIG. 26 is a graph showing a distribution of the actually measured SAR on the xy-plane in the state of FIG. 20.

Subsequently, the near magnetic field $H_{measure}(x, y)$ in the state (state of FIG. 20) in which the whip antenna 12a of the portable radio apparatus 10a was extended was measured, and the results are shown in FIG. 24. It is to be noted that the transmission setting conditions of the portable radio apparatus 10a were set to be similar to those of the state of FIG. 19 in which the antenna was retracted. In this case, the distance from the front surface of the portable radio apparatus 10a to the probe was set to about 5 mm. The estimated SAR distribution in the state in which the whip antenna 12a was extended was calculated by multiplying the square value of the actually measured near magnetic field $H_{measure}(x, y)$ by the calculated transformation factor distribution $\alpha(x, y)$, and the estimated calculation result is shown in FIG. 25. FIG. 26 shows the actually measured SAR distribution in the state in which the whip antenna was extended, the distribution being actually measured by the above-mentioned standard measurement method. In this case, the position coordinate (x, y) of the peak value of the estimated SAR distribution was (x, y)=(40, 10), and the position coordinate (x, y) of the peak value of the actually measured SAR distribution was (x, y)=(40, 15).

Figure 27:
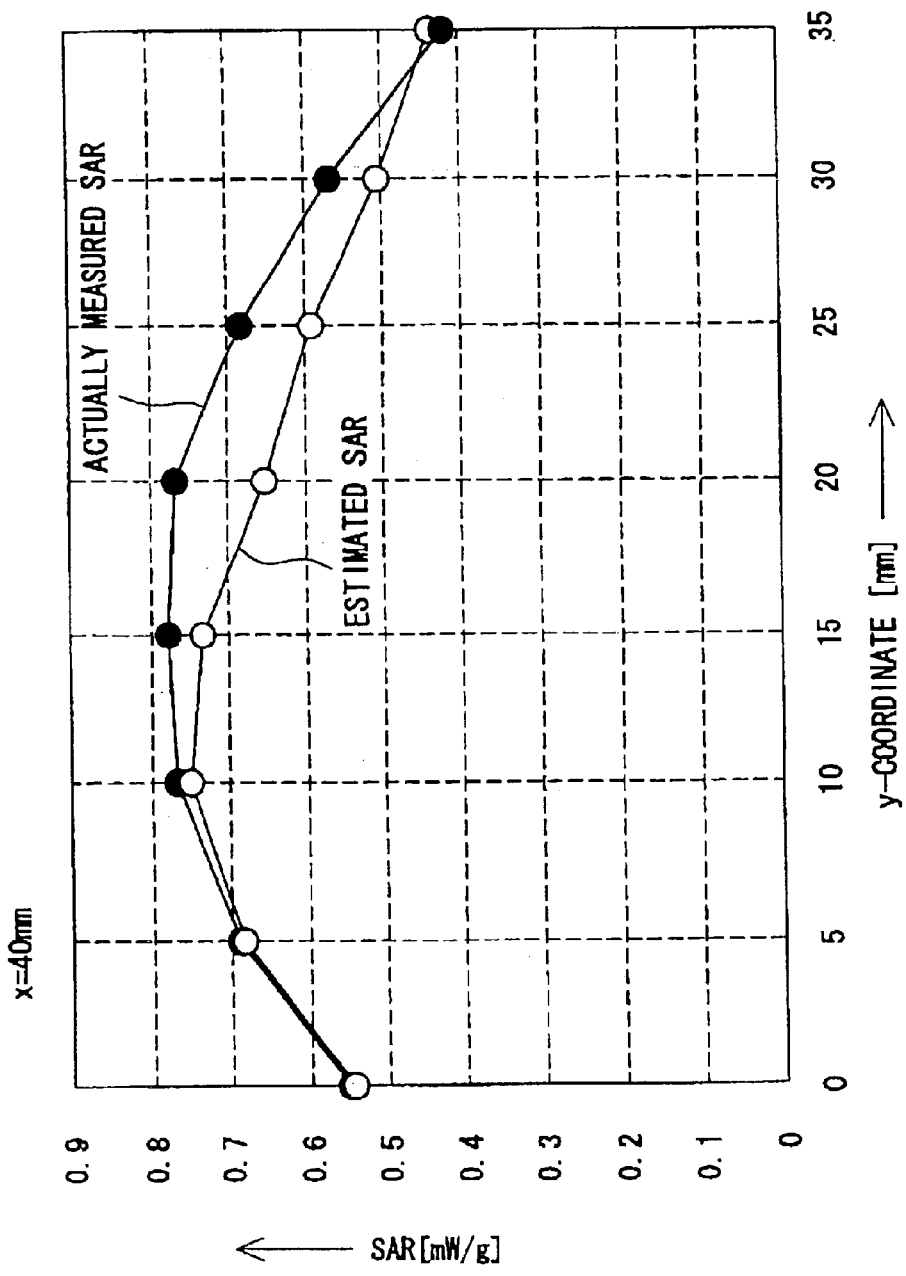
FIG. 27 is a graph showing distributions of the actually measured SAR and the estimated SAR when x=40 mm in the state of FIG. 20.
Figure 28:
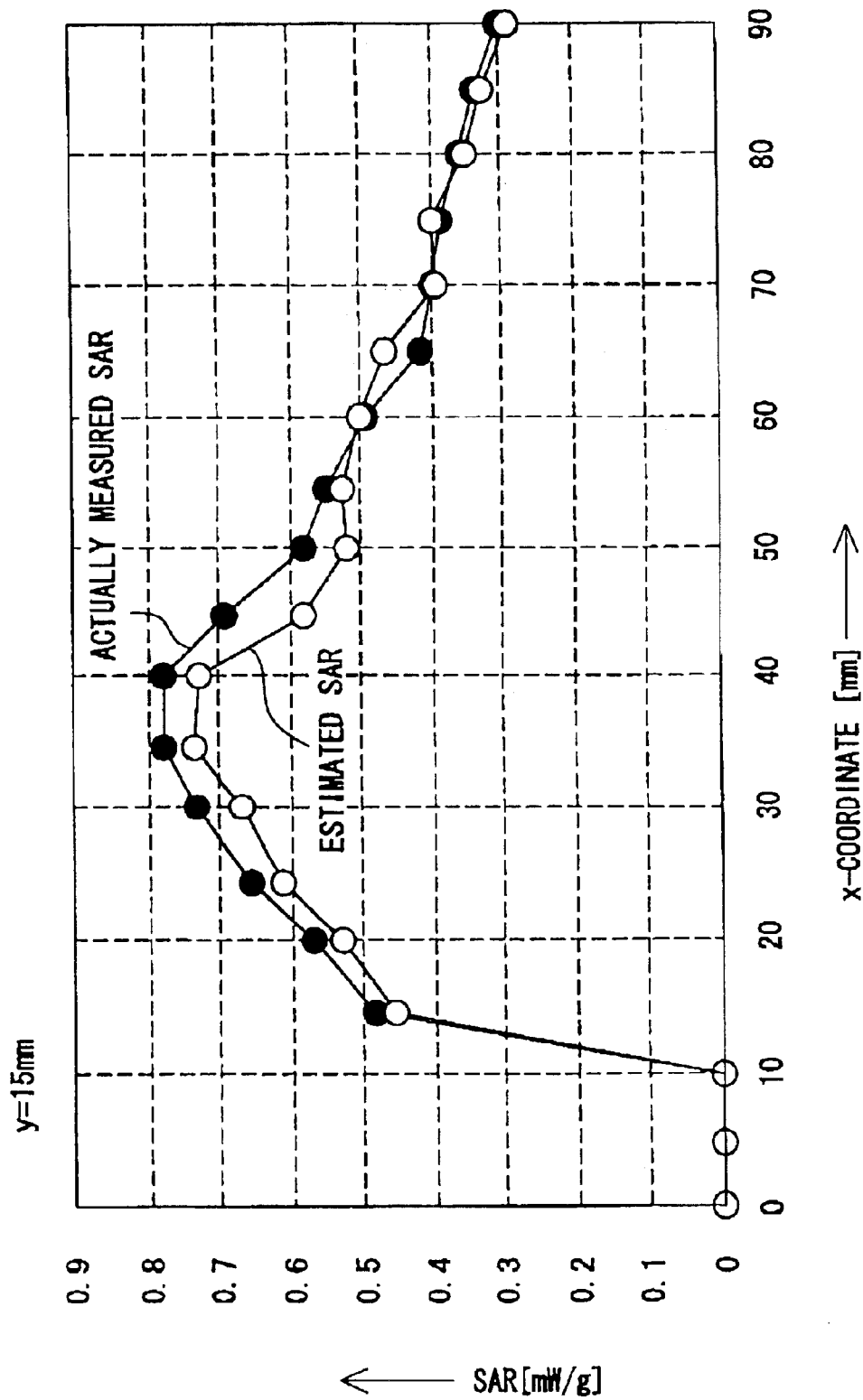
FIG. 28 is a graph showing distributions of the actually measured SAR and the estimated SAR when y=15 mm in the state of FIG. 20.

Further, FIG. 27 is a graph showing a distributions of the actually measured SAR and the estimated SAR when x=40 mm in the state of FIG. 20, and FIG. 28 is a graph showing a distributions of the actually measured SAR and the estimated SAR when y=15 mm in the state of FIG. 20.

As is apparent from the graphs of FIGS. 25 to 28, it is indicated that the estimated SAR distribution by the estimative measurement method of the present preferred embodiment closely resembles the actually measured SAR distribution measured by the above-mentioned standard measurement method, and the estimation accuracy is very high. The maximum value of the estimated SAR distribution was 0.747 mW/g, while the maximum value of the actually measured SAR distribution was 0.775 mW/g, then an error of 4% existed between them. The maximum value of the error within the measurement range was about 18%. As described above, the SAR was able to be estimated with higher accuracy than that of the prior art even when the portable radio apparatus of the reference radio apparatus was used, and the effectiveness of the estimative measurement method of the preferred embodiment of the present invention was demonstrated.

It is to be noted that the near magnetic field distribution $H_{ref}(x, y)$ and $SAR_{ref}(x, y)$ of the reference antenna or the reference radio apparatus are not always required to be obtained by the above-mentioned standard measurement method, and it is acceptable to calculate the transformation factor distribution $\alpha(x, y)$ by the method of the sixth preferred embodiment by using a near magnetic field distribution and an SAR distribution calculated by a predetermined well-known electromagnetic field simulation.

In the above sixth preferred embodiment, the portable radio apparatus 10a is moved with respect to the magnetic field probe 1. However, the present invention is not limited to this, and it is acceptable to move the magnetic field probes 1 with respect to the portable radio apparatus 10, i.e., they may be moved relatively to each other. This can be applied to the other preferred embodiments.

Seventh Preferred Embodiment

Figure 30:
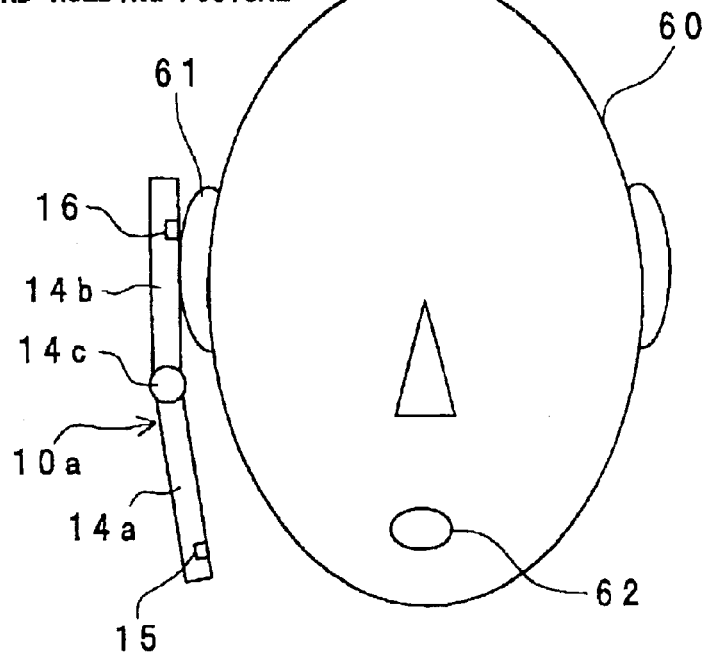
FIG. 30 is a front view showing a state of a second holding posture of the portable radio apparatus 10a with respect to the head portion 60 of the human body phantom in the seventh preferred embodiment of the present invention.

FIG. 29 is a front view showing a state of a first holding posture of the portable radio apparatus 10a with respect to the head portion 60 of a human body phantom in the seventh preferred embodiment of the present invention, and FIG. 30 is a front view showing a state of a second holding posture of the portable radio apparatus 10a with respect to the head portion 60 of the human body phantom in the seventh preferred embodiment of the present invention. That is, with regard to the holding posture of the portable radio apparatus 10a such as a portable telephone, there can be considered roughly two kinds of holding postures as shown in FIGS. 29 and 30.

The first holding posture shown in FIG. 29 is a normal holding posture in a state in which the front surface of the main body casing 14a of the portable radio apparatus 10a is closely fit onto the right cheek of the head portion 60 of the human body phantom. On the other hand, the second holding posture shown in FIG. 30 is a holding posture when the voice from the other party is hard to hear in a state in which the sound hole portion 16 of the speaker of the portable radio apparatus 10a is closely fit onto the right ear portion 61 of the head portion 60 of the human body phantom. According to the actual SAR measurement disclosed in FIG. 3. 1–2 on page 9 of the first prior art document, measurement is carried out for these two kinds of holding postures. Accordingly, a transformation factor distribution $\alpha_n(x, y)$ (n=1, 2) is calculated by using the following equations for respective holding postures n to hold the portable radio apparatus of the reference radio apparatus by a measurement method similar to that of the sixth preferred embodiment:

$$\alpha_1(x, y) = \frac{SAR_{ref1}(x, y)}{H^2_{ref(x,y)}}, \text{ and} \tag{7}$$

$$\alpha_2(x, y) = \frac{SAR_{ref2}(x, y)}{H^2_{ref(x,y)}}, \tag{8}$$

where $SAR_{ref}(x, y)$ denotes an SAR distribution of the reference portable radio apparatus in the first holding posture of FIG. 29, $\alpha_1(x, y)$ denotes a transformation factor distribution of the first holding posture of FIG. 29, $SAR_{ref2}(x, y)$ denotes an SAR distribution of the reference portable radio apparatus in the second holding posture of FIG. 30, and $\alpha_2(x, y)$ denotes a transformation factor distribution of the second holding posture of FIG. 30. It is to be noted that $H_{ref}(x, y)$ is measured by a measurement method similar to that of the sixth preferred embodiment regardless of the holding posture of the reference portable radio apparatus. By using the transformation factor distribution $\alpha_n(x, y)$ (n=1, 2) calculated by using the equations (7) and (8), the SAR distributions for the holding postures of the portable radio apparatus 10a to be measured are calculated using the following equations:

$$SAR_{estimate1}(x, y) = \alpha_1(x, y) \cdot H^2_{measure}(x, y) \tag{9), and}$$

$$SAR_{estimate2}(x, y) = \alpha_2(x, y) \cdot H^2_{measure}(x, y) \tag{10}.$$

It is possible to estimate and calculate the SAR distribution $SAR_{estimate1}(x, y)$ of the first holding posture of FIG. 29 by using the equation (9), and to estimate and calculate the SAR distribution $SAR_{estimate2}(x, y)$ of the second holding posture of FIG. 30 by using the equation (10). In addition to this, similar measurement is carried out for the left side of the head portion 60 of the human body phantom in a manner similar to that of FIGS. 29 and 30. As a result, by calculating four transformation factor distributions (including $\alpha_1(x, y)$ and $\alpha_2(x, y)$ on the right-hand side and $\alpha_1(x, y)$ and $\alpha_2(x, y)$ on the left-hand side, hereinafter referred to as $\alpha_n(x, y)$ (n=1, 2, 3, 4)), and by measuring only once the near magnetic field distribution $H_{measure}(x, y)$ of the reference portable radio apparatus, SAR values for the arrangements and postures (four holding postures in total) of the portable radio apparatus 10a required for the standard SAR measurement method can be estimated.

Figure 31:
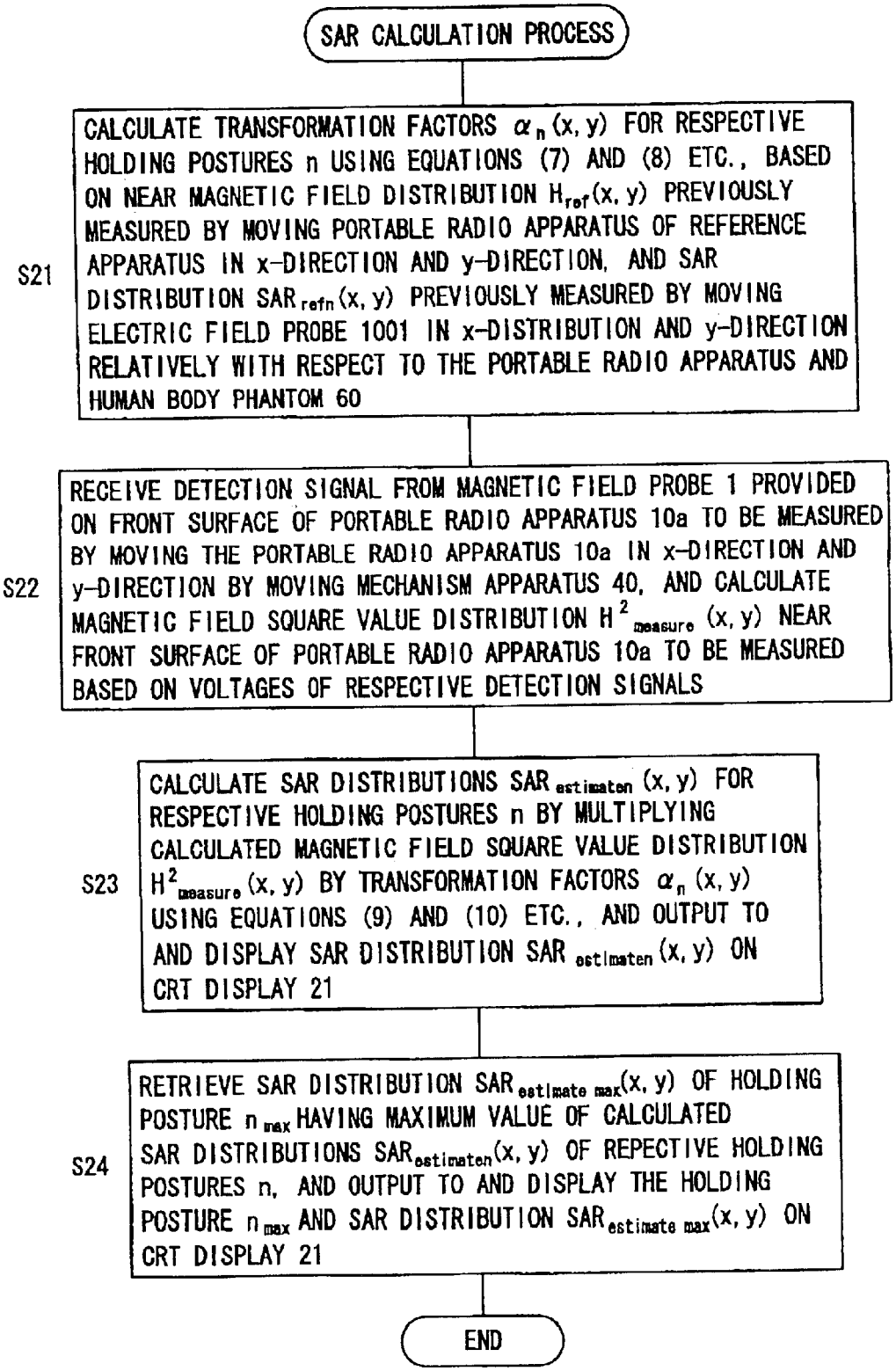
FIG. 31 is a flowchart showing an SAR calculation process executed by an SAR calculation controller of the seventh preferred embodiment of the present invention.

FIG. 31 is a flowchart showing an SAR calculation process executed by the SAR calculation controller of the seventh preferred embodiment of the present invention.

In the SAR calculation process of FIG. 31, first of all, in step S21, a transformation factor distribution $\alpha_n(x, y)$ is calculated for a plurality of predetermined position coordinates (x, y) by using the equations (7), (8), etc. based on the near magnetic field distribution $H_{ref}(x, y)$ previously measured while moving the portable radio apparatus of the reference radio apparatus in the x-direction and the y-direction for respective holding postures n (n=1, 2, 3, 4) by means of the movement mechanism apparatus 40 and the SAR distribution $SAR_{ref}(x, y)$ previously measured while moving the electric field probe 1001 in the x-direction and the y-direction with respect to the portable radio apparatus and the human body phantom 60. In this case, the near magnetic field distribution $H_{ref}(x, y)$ can be measured by using the magnetic field probe 1, while the SAR distribution $SAR_{ref}(x, y)$ can be measured by using the above-mentioned standard measurement method. Next, in step S22, while moving the portable radio apparatus 10a to be measured in the x-direction and the y-direction by means of the movement mechanism apparatus 40, a detection signal from the magnetic field probe 1, which is provided on its surface and detects the near magnetic field, is received, and the magnetic field square value distribution $H^2_{measure}(x, y)$ in the vicinity of the front surface of the portable radio apparatus 10a to be measured is calculated for a plurality of determined position coordinates (x, y) based on the voltages of the detection signals. Then, in step S23, the SAR distribution $SAR_{estimaten}(x, y)$ are estimated and calculated for respective holding postures n (n=1, 2, 3, 4) by multiplying the magnetic field square value distribution $H^2_{measure}(x, y)$ calculated by using the equations (9), (10), etc. by the transformation factor distribution $\alpha_n(x, y)$ for the calculated respective holding postures n (n=1, 2, 3, 4) and then outputted to and displayed on the CRT display 21. Further, in step S24, the SAR distribution $SAR_{estimatemax}(x, y)$ of a certain holding posture $n_{max}$ having the maximum value is retrieved from the SAR distribution $SAR_{estimaten}(x, y)$ for the calculated respective holding postures n (n=1, 2, 3, 4), and the holding posture information $n_{max}$ and the SAR distribution $SAR_{estimatemax}(x, y)$ are outputted to and displayed on the CRT display 21, ending the SAR calculation process.

As described above, by executing the SAR calculation process shown in FIG. 31, it is unnecessary to execute the measurement of the near magnetic field of the portable radio apparatus 10a to be measured for the respective holding postures, and it is necessary to perform only once measurement of the near magnetic field distribution. Therefore, the measuring time can be shortened to about a quarter as compared with the measuring time of the prior art method, and then the SAR measurement can be done in a higher speed.

Figure 32:
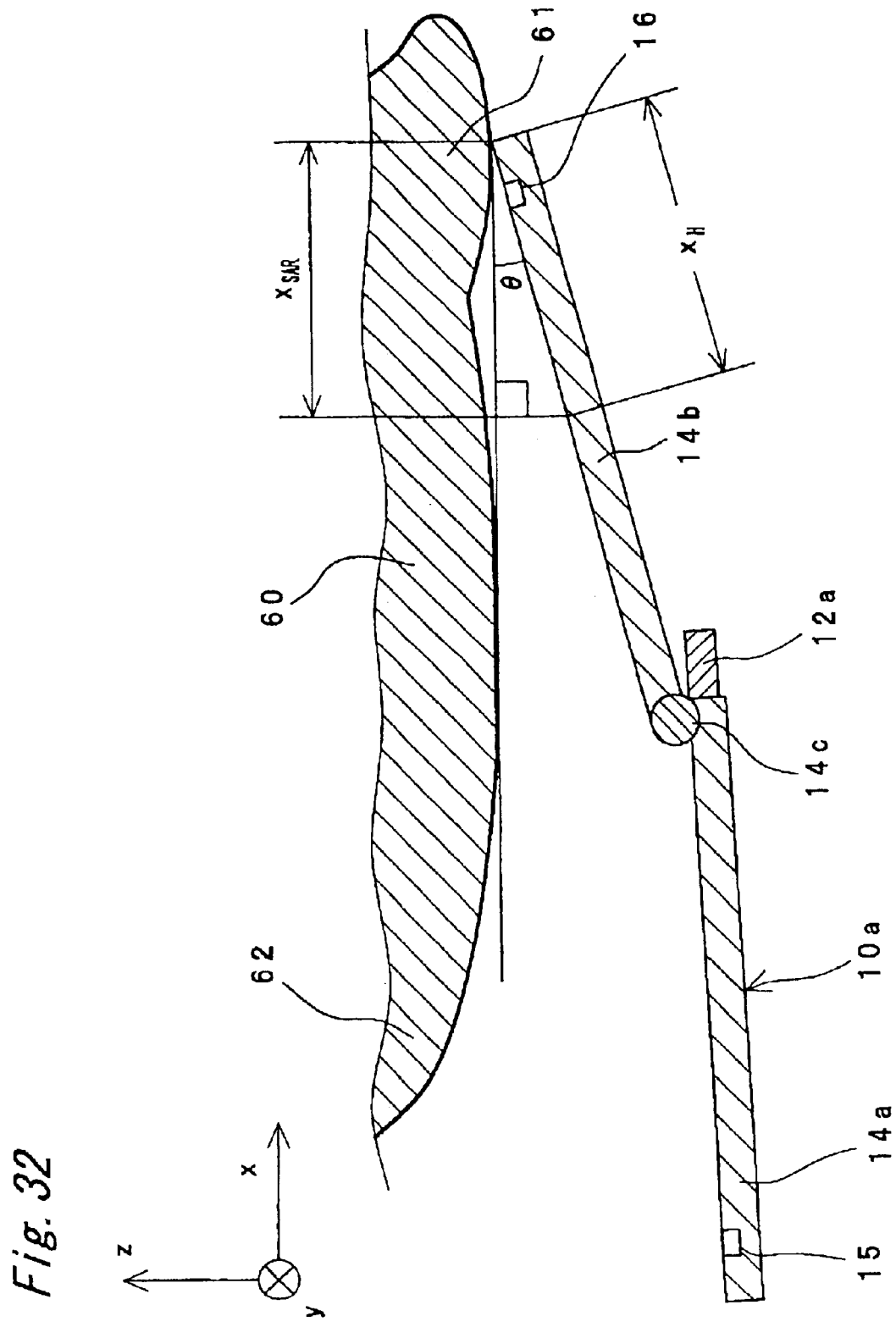
FIG. 32 is a sectional view showing a state in which the state in the magnetic field measurement stage is inclined by an angle θ from the state in which the SAR should be measured according to a modified preferred embodiment of the seventh preferred embodiment of the present invention.

FIG. 32 is a sectional view showing a state in which the state in the magnetic field measurement stage is inclined by an angle 0 from the state in which the SAR should be measured according to a modified preferred embodiment of the seventh preferred embodiment of the present invention. As shown in FIG. 32, depending on the angle θ of arrangement of the portable radio apparatus 10a in the SAR measurement stage with respect to the head portion 60 of the human body phantom, the original measurement results are made to correspond to the near magnetic field distribution $H_{ref}(x, y)$ of the reference radio apparatus and the measurement points of the SAR distribution $SAR_{ref}(x, y)$. For example, when the coordinate system in the SAR measurement stage and the coordinate system in the magnetic field measurement stage are inclined at an angle θ with respect to the x-axis as shown in FIG. 32, it is preferable to execute the SAR measurement by correcting a measurement interval $x_{SAR}$ in the x-direction according to the following equation:

$$x_{SAR} = x_H \cdot \cos\theta \tag{11}$$

Eighth Preferred Embodiment

Figure 33:
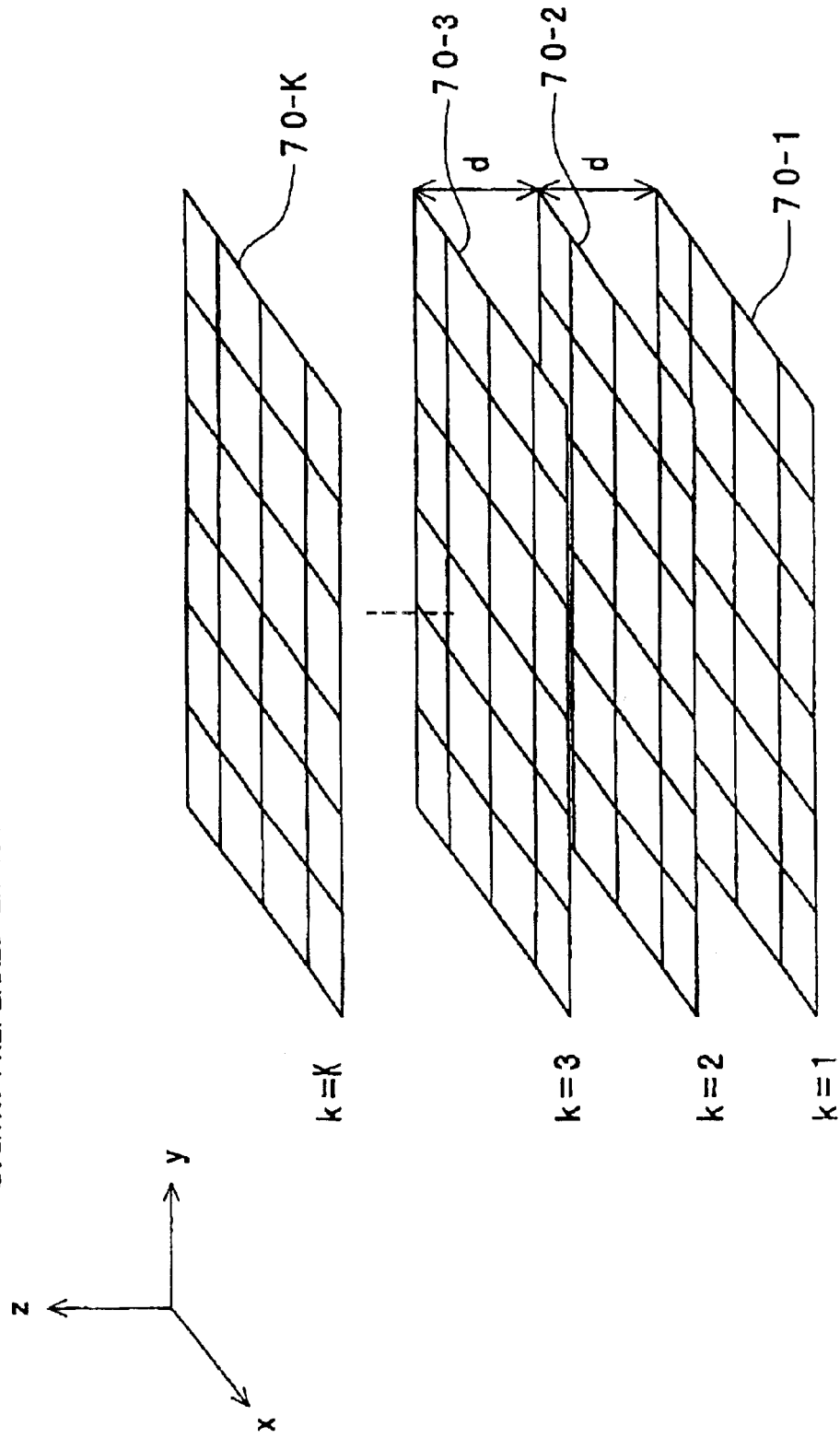
FIG. 33 is a perspective view showing a plurality of layers 70-1 to 70-K in a z-direction used for SAR measurement in an eighth preferred embodiment of the present invention.

FIG. 33 is a perspective view showing a plurality of layers 70-1 to 70-K in the z-direction used for the SAR measurement in the eighth preferred embodiment of the present invention. In order to estimate the average SAR value of the portable radio apparatus 10a, it is required to three-dimensionally perform the SAR measurement. The SAR estimation method of the measurement apparatus of the present preferred embodiment is similar to that of the sixth preferred embodiment. As shown in FIG. 33, in order to measure the SAR distribution $SAR_{ref}(x, y)$ by means of the plurality of K layers 70-1 to 70-K arranged at predetermined intervals of "d" from the phantom surface in the z-direction, a transformation factor distribution $\alpha(x_i, y_j, z_k)$ is previously calculated for respective layers 70-k (k=1, 2, . . . , K) by using the following equation, where it is assumed that the z-coordinate value when k=1 is set to $z_1$ and the subsequent values are set to $z_2, z_3, \ldots z_K$:

$$\alpha(x_i, y_j, z_k) = \frac{SAR_{ref}(x_i, y_j, z_k)}{H^2_{ref(x_i, y_j)}}, \tag{12}$$

where $SAR_{ref}(x_i, y_j, z_k)$ denotes an SAR distribution of a k-th layer from the phantom surface of the reference portable radio apparatus, and $H_{ref}(x_i, y_j)$ denotes a near magnetic field distribution of the k-th layer in the reference portable radio apparatus. With regard to the near magnetic field distribution in the present preferred embodiment, the near magnetic field is measured at an arbitrary distance within a range of about several millimeters from the surface of the portable radio apparatus, and the distribution of the near magnetic field changes similarly within the range. Therefore, the distance in the z-direction is not taken into consideration. Then, the SAR distribution of the k-th layer of the portable radio apparatus to be measured is calculated by using the following equation based on the transformation factor distribution $\alpha(x_i, y_j, z_k)$ calculated by using the equation (12):

$$SAR_{estimate}(x_i, y_j, z_k) = \alpha(x_i, y_j, z_k) H^2_{measure}(x_i, y_j), \tag{13}$$

where $SAR_{estimate}(x_i, y_j, z_k)$ denotes an estimated SAR distribution of the k-th layer from the phantom surface. In order to obtain an average SAR, first of all, a maximum value of $SAR_{estimate}(x_i, y_j, z_k)$ of the first layer calculated by using the equation (13) and its coordinates $(x_i, y_j, z_k)$ are obtained. As shown in FIG. 34, when the center of the bottom surface of a cubic lattice 54A is assumed as a position 72 having the maximum value of SAR (hereinafter referred to as a maximum point) among measurement points 71 within the cubic lattice 54A upon virtually setting that the cubic phantom 54 exists, the average SAR can be calculated as an average value of SAR values $SAR_{estimate}(x_i, y_j, z_k)$ at the measurement points 71 included within the cubic lattice 54A having one side length L. A 1-gram average SAR value, which is the average SAR of one gram of the head tissue of the human body phantom, can be calculated by using the following equation (equation (14)), and a 10-gram average SAR value, which is the average SAR of ten grams of the head tissue of the human body phantom, can be calculated by using the following equation (equation (15)). It is to be noted that the SAR averaged within a tissue of one gram or ten grams is called the local SAR, and the maximum value of the local SAR is called the local maximum SAR.

$$SAR_{1g} = \frac{1}{M_x M_y M_z} \sum_{i=1}^{M_x} \sum_{j=1}^{M_y} \sum_{k=1}^{M_z} SAR_{estimate}(x_i, y_j, z_k), \text{ and} \tag{14}$$

$$SAR_{10g} = \frac{1}{N_x N_y N_z} \sum_{i=1}^{N_x} \sum_{j=1}^{N_y} \sum_{k=1}^{N_z} SAR_{estimate}(x_i, y_j, z_k), \tag{15}$$

where $M_x, M_y, M_z, N_x, N_y$ and $N_z$ are defined as follows:

(a) $M_x$ is the number of measurement points in the x-direction required for calculating the 1-gram average SAR value;

(b) $M_y$ is the number of measurement points in the y-direction required for calculating the 1-gram average SAR value;

(c) $M_z$ is the number of measurement points in the z-direction required for calculating the 1-gram average SAR value;

(d) $N_x$ is the number of measurement points in the x-direction required for calculating the 10-gram average SAR value;

(e) $N_y$ is the number of measurement points in the y-direction required for calculating the 10-gram average SAR value; and (f) $N_z$ is the number of measurement points in the z-direction required for calculating the 10-gram average SAR value.

In this case, the 1-gram average SAR value is calculated by using the equation (14) based on the SAR values $SAR_{estimate}(x_i, y_j, z_k)$ measured at the measurement points included in the cubic phantom 54 whose length L=10 mm. Moreover, the 10-gram average SAR value is calculated by using the equation (15) based on the SAR values $SAR_{estimate}(x_i, y_j, z_k)$ measured at the measurement points 71 included in the cubic lattice 54A whose length L=22 mm. It is to be noted that the density of the head tissue of the human being is assumed to be one $g/cm^3$.

Figure 35:
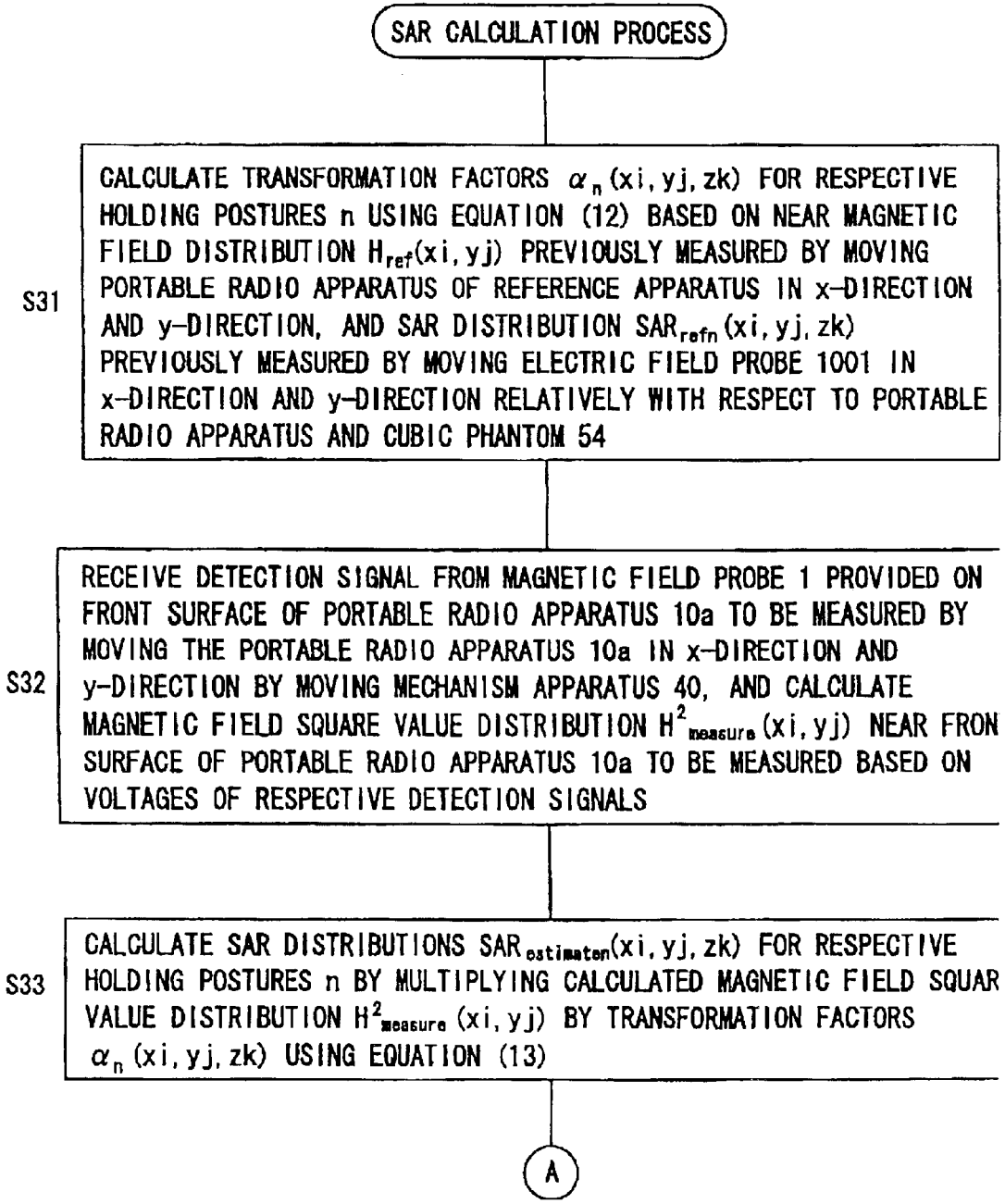
FIG. 35 is a flowchart showing a first part of the SAR calculation process executed by the SAR calculation controller of the eighth preferred embodiment of the present invention.
Figure 36:
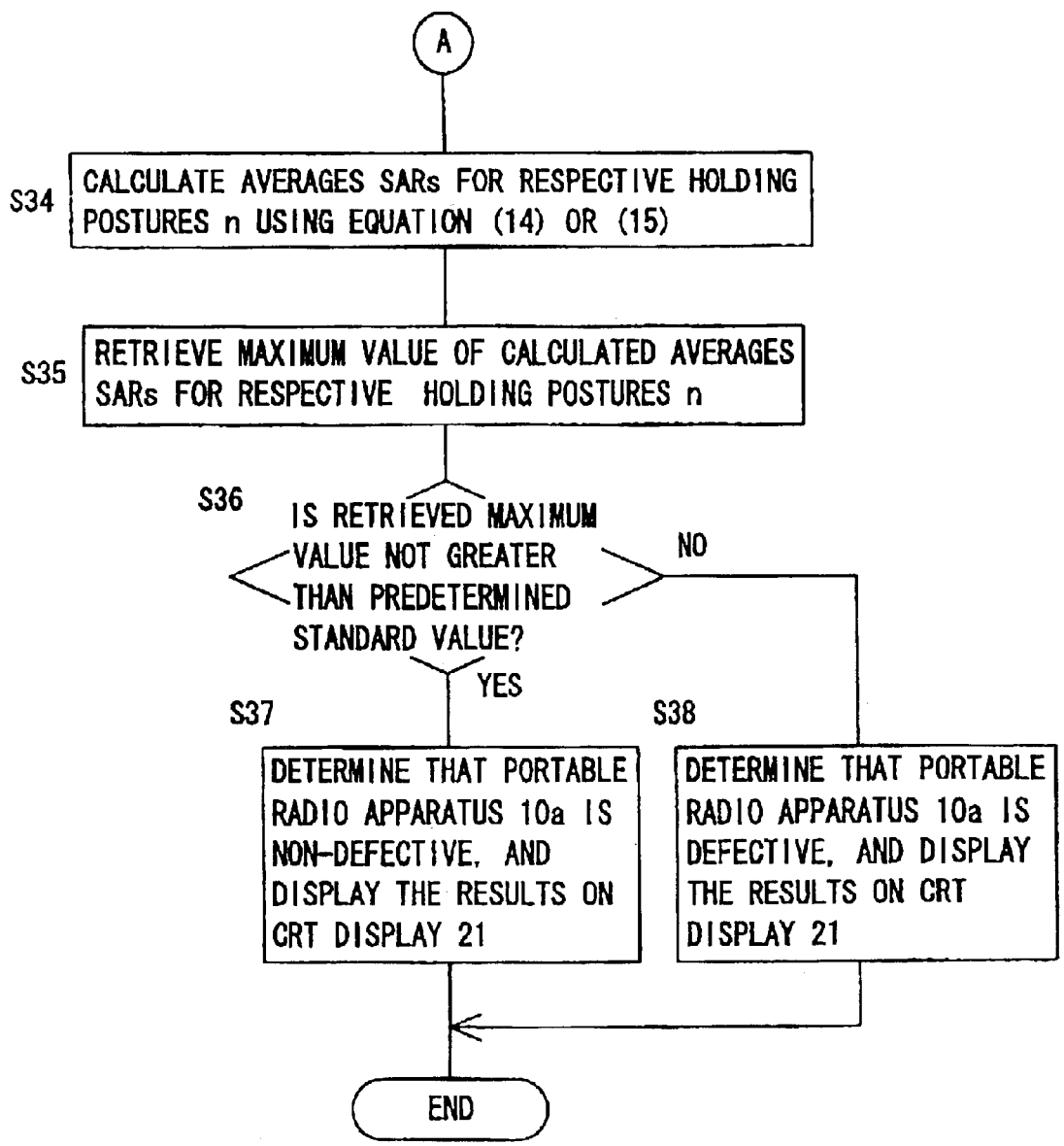
FIG. 36 is a flowchart showing a second part of the SAR calculation process executed by the SAR calculation controller of the eighth preferred embodiment of the present invention.

FIGS. 35 and 36 are flowcharts showing an SAR calculation process executed by the SAR calculation controller of the eighth preferred embodiment of the present invention.

In the SAR calculation process of FIG. 35, first of all, in step S31, the transformation factor distributions $\alpha_n(x_i, y_j, z_k)$ for respective holding postures n (n=1, 2, 3, 4) are calculated for a plurality of predetermined position coordinates $(x_i, y_j, z_k)$ using the equation (12), based on (a) the near magnetic field distribution $H_{ref}(x_i, y_j)$ previously measured while moving the portable radio apparatus of the reference apparatus in the x-direction and the y-direction by means of the movement mechanism apparatus 40 and (b) the SAR distributions $SAR_{refn}(x_i, y_j, z_k)$ previously measured while moving the electric field probe 1001 in the x-direction and the y-direction with respect to the portable radio apparatus and the cubic phantom 54. It is to be noted that the electric field probe 1001 is moved in the x-direction, y-direction and z-direction orthogonal to each other by, for example, a movement mechanism apparatus 1002 as shown in FIG. 10. In this case, the near magnetic field distribution $H_{ref}(x_i, y_j)$ can be measured by using the magnetic field probe 1, and the SAR distributions $SAR_{ref}(x_i, y_j, z_k)$ can be measured by using the above-mentioned standard measurement method. Subsequently, in step S32, while moving the portable radio apparatus 10a to be measured in the x-direction and the y-direction by the movement mechanism apparatus 40, a detection signal from the magnetic field probe 1, which is provided on its front surface and detects the near magnetic field, is received, and the magnetic field square value distribution $H^2_{measure}(x_i, y_j)$ in the vicinity of the front surface of the portable radio apparatus 10a to be measured is calculated for a plurality of predetermined position coordinates $(x_i, y_j)$ based on the voltages of the detection signals. Then, in step S33, the SAR distributions $SAR_{estimaten}(x_i, y_j, z_k)$ for respective holding postures n (n=1, 2, 3, 4) are estimated and calculated using the equation (13) by multiplying the calculated magnetic field square value distribution $H^2_{measure}(x_i, y_j)$ by the transformation factor distributions $\alpha_n(x_i, y_j, z_k)$ for the respective holding postures n (n=1, 2, 3, 4), and then, the program flow proceeds to step S34 of FIG. 36.

In step S34 of FIG. 36, the average SAR is calculated for the respective holding postures n (n=1, 2, 3, 4) by using the equation (14) or the equation (15). In step S35, the maximum value of the average SARs for the calculated respective holding postures n (n=1, 2, 3, 4) is retrieved. In step S36, it is determined whether or not the retrieved maximum value is equal to or smaller than a predetermined standard value (or threshold value). Then the program flow proceeds to step S37 when the answer is YES or proceeds to step S38 when the answer is NO. In step S38, it is determined that the portable radio apparatus 10a is non-defective, and the results are displayed on the CRT display 21, then the SAR calculation process is completed. On the other hand, in step S39, it is determined that the portable radio apparatus 10a is defective, and the results are displayed on the CRT display 21, and the SAR calculation process is completed.

Although the information of the non-defective or defective product is displayed on the CRT display 21 in steps S37 and S38, the present invention is not limited to this. It is acceptable to print the information by means of a printer, to output the information by synthetic voices by sound information means or to output the information by the other information output means.

Moreover, it is acceptable to calculate the average SAR by using a relationship of the following equation from the SAR distribution in one layer when calculating the average SAR (this measurement method is hereinafter referred to as a modified preferred embodiment of the eighth preferred embodiment) instead of measuring the average SARs of a plurality of layers as described above:

$$E(z)=E_o \exp(-z/\delta) \tag{16},$$

where $E_o$ denotes an electric field intensity when z=0, and $\delta$ denotes a skin depth of the phantom material expressed by the following equation:

$$\delta=(\pi f \mu \sigma)^{-1/2} \tag{17},$$

where f denotes an operation frequency of the transmission signal, $\mu$ denotes a magnetic permeability of the phantom material, and $\sigma$ denotes an electric conductivity of the phantom material. In this case, the SAR value is expressed by the following equation:

$$SAR=\sigma E^2/\rho \tag{18}.$$

Therefore, the following equation is obtained from the above equation:

$$SAR \propto \exp(-2z/\delta) \tag{19}.$$

Therefore, an SAR distribution $SAR_{calculate}(x_i, y_j, z)$ at a position located apart by a distance of "z" from the phantom surface in the z-direction can be obtained by the following equation:

$$SAR_{calculate}(x_i, y_j, z)=SAR_{estimate}(x_i, y_j, 0)\exp(-2z/\delta) \tag{20},$$

where $SAR_{estimate}(x_i, y_j, 0)$ denotes an SAR distribution when $z=z_1=0$ on the first layer 70-1.

Figure 37:
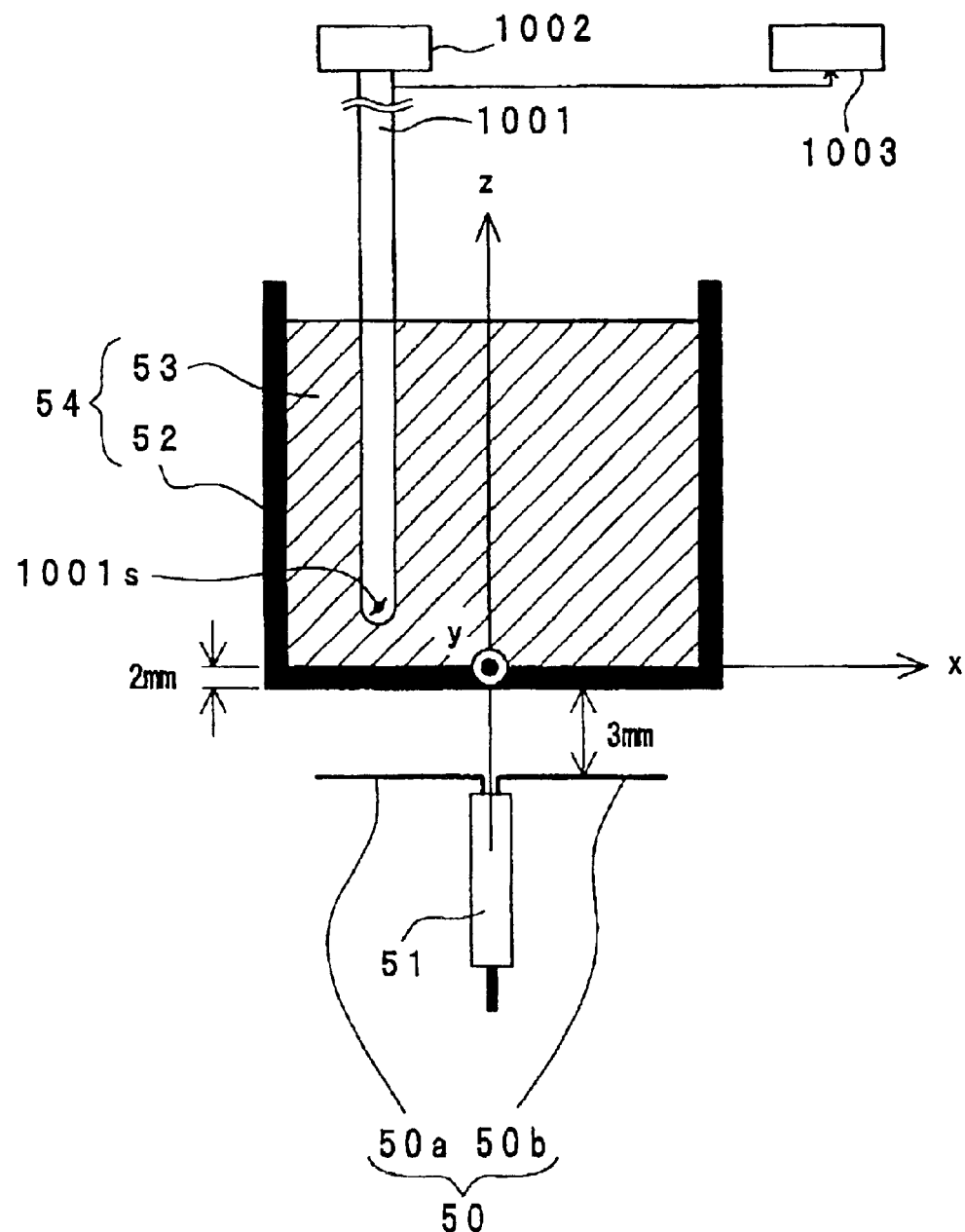
FIG. 37 is a perspective view showing a coordinates of the cubic phantom 54 when the average SAR is calculated by another method according to a modified preferred embodiment of the eighth preferred embodiment of the present invention.

In order to verify the propriety of the equation (20), the measured value by the above-mentioned standard measurement method and the estimated value by the equation (20) are compared with each other with regard to the SAR distribution in the z-direction when the half-wavelength dipole antenna 50 is located so as to be adjacent to the cubic phantom 54 shown in FIG. 37. In this case, the cubic container 52 of the cubic phantom 54 is filled with an SAR solution 53 having a dielectric constant of $\epsilon_r=41.5$ and an electric conductivity of $\sigma=0.95$ S/m. The cubic container 52 has a thickness of 2 mm, and one side thereof has an inside dimension of 200 mm. Moreover, the half-wavelength dipole antenna 50 has an antenna length of 158 mm, and the measurement frequency, which is the frequency of the transmission signal, is set to 900 MHz. The SAR measurement by the above-mentioned standard measurement method is carried out by inserting the electric field probe 1001 having the sensor portion 1001s in the SAR solution 53, and the SAR distribution shown in FIG. 37 is calculated and outputted by using the equation (1) based on the electric field intensity, by scanning the electric field probe 1001 in the x-direction and the y-direction along the surface configuration of the cubic phantom 54 while moving the electric field probe 1001 by a movement mechanism apparatus 1002 and calculating the electric field intensity by the SAR calculation controller 1003 based on the detection signal that represents the electric field intensity from the electric field probe 1001. The movement by the movement mechanism apparatus 1002 is only required to be able to move the electric field probe 1001 relatively to the cubic phantom 54 and the half-wavelength dipole antenna 50. That is, the cubic phantom 54 and the half-wavelength dipole antenna 50 may be moved relatively to the electric field probe 1001.

Figure 38:
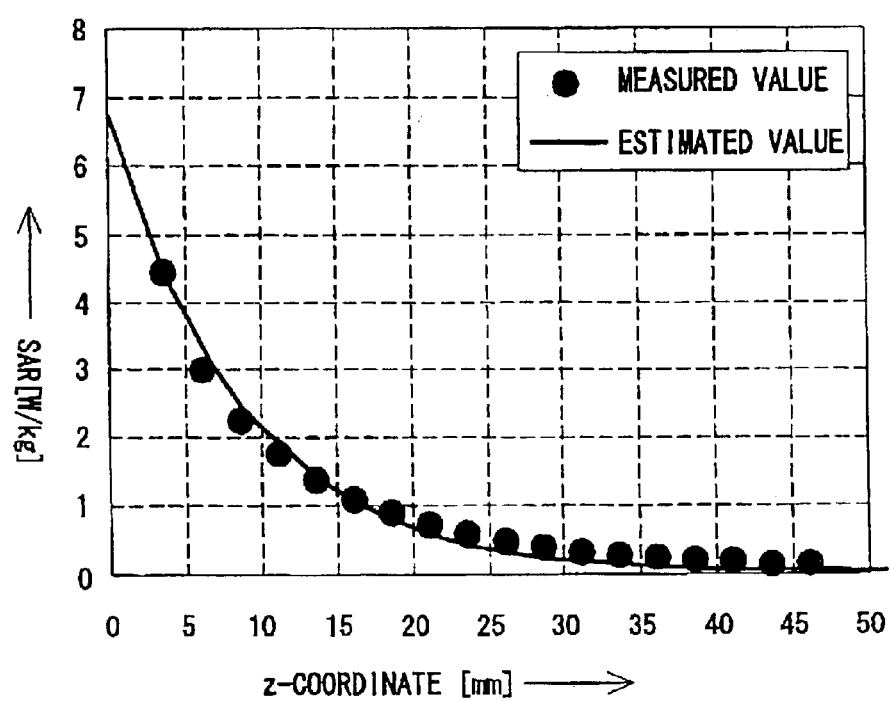
FIG. 38 is a graph showing measured values and estimated values of SAR with respect to a position in the z-direction (z-coordinate) in the state of FIG. 37.

FIG. 38 is a graph showing measured values and estimated values of SAR with respect to a position in the z-direction (z-coordinate) in the state of FIG. 37. FIG. 38 shows measured values of the SAR distribution on the z-axis according to the above-mentioned standard measurement method and the estimated values using the equation (20). As is apparent from FIG. 38, the estimated values satisfactorily coincide with the measured values, and it can be understood that the SAR distribution in the z-direction can be estimated by using the equation (20). In this case, by substituting the equation (20) into the equation (14) and the equation (15), the average SAR can be calculated. The SAR measurement plane necessary for this calculation method is one plane. Therefore, it is merely required to measure only one plane when the transformation factor distribution a is calculated, and the measurement of the SAR distribution can be remarkably simplified.

Figure 39:
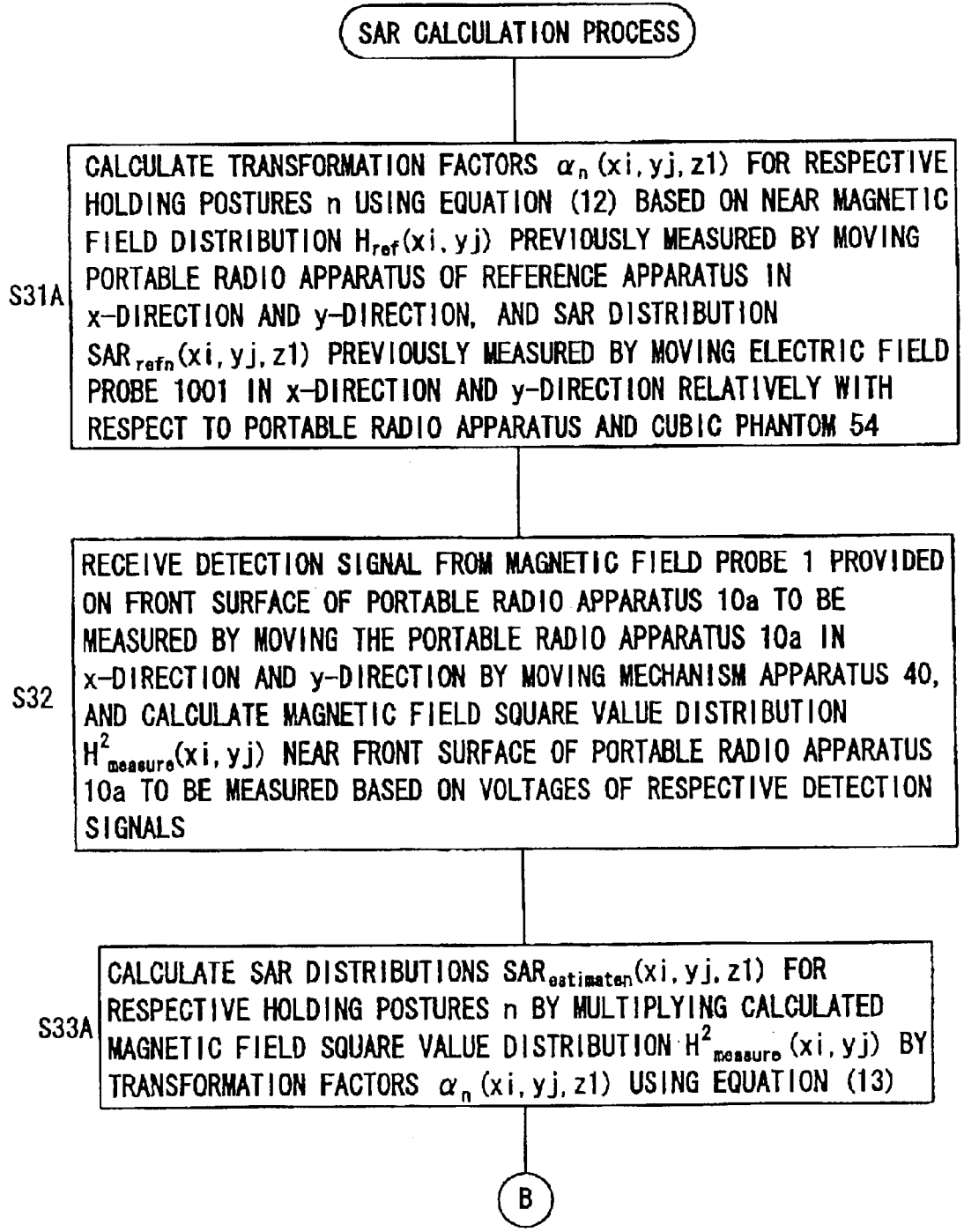
FIG. 39 is a flowchart showing a first part of the SAR calculation process executed by the SAR calculation controller of the modified preferred embodiment of the eighth preferred embodiment of the present invention.
Figure 40:
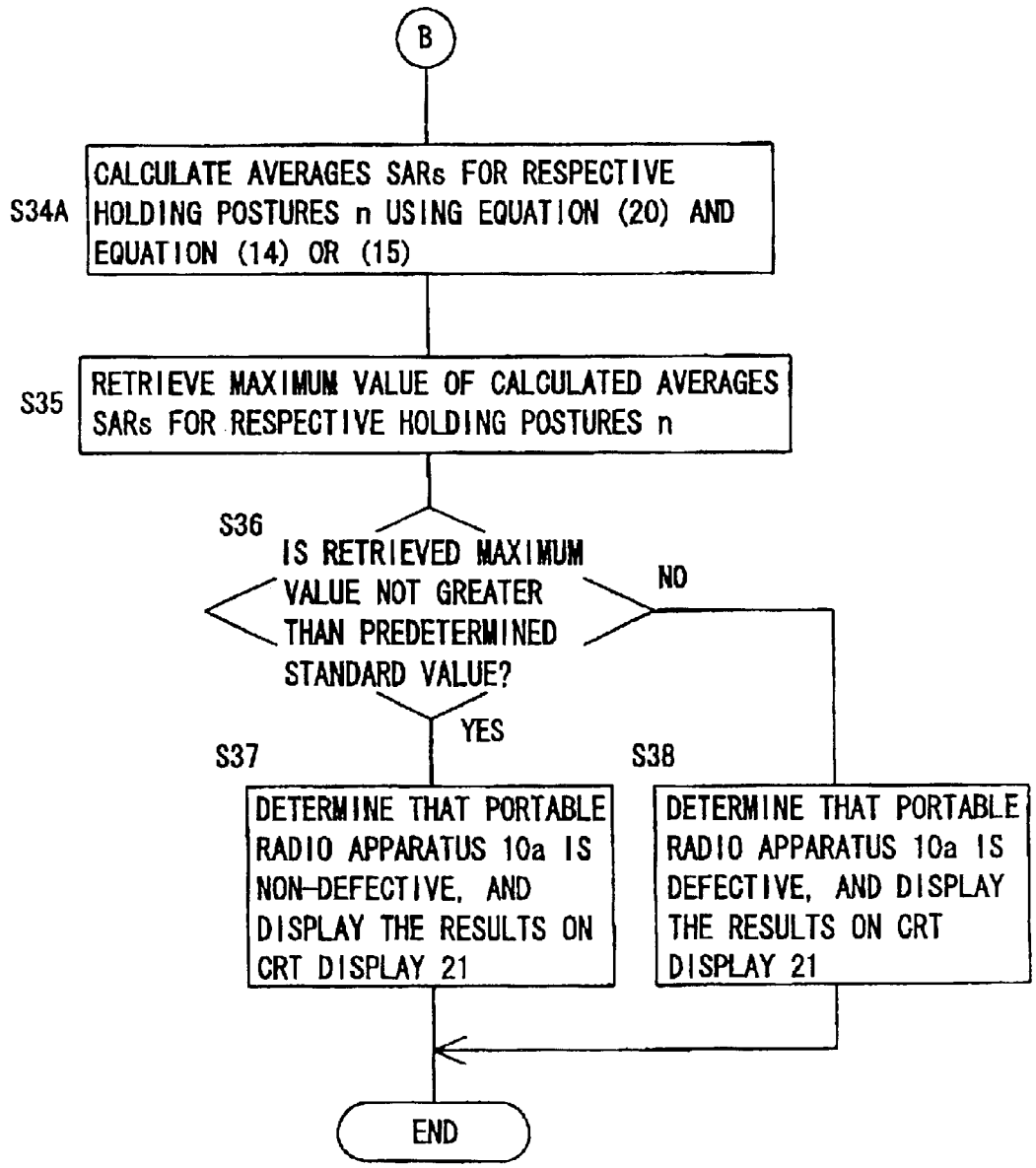
FIG. 40 is a flowchart showing a second part of the SAR calculation process executed by the SAR calculation controller of the modified preferred embodiment of the eighth preferred embodiment of the present invention.

FIGS. 39 and 40 are flowcharts showing an SAR calculation process executed by the SAR calculation controller according to the modified preferred embodiment of the eighth preferred embodiment of the present invention. In FIGS. 39 and 40, it is to be noted that the same step numbers are given to the same processings as those of FIGS. 35 and 36.

In the SAR calculation process of FIG. 39, first of all, in step S31A, transformation factor distributions $\alpha_n(x_i, y_j, z_l)$ for respective holding postures n (n=1, 2, 3, 4) are calculated for a plurality of predetermined position coordinates $(x_i, y_j, z_l)$ using the equation (12) based on the near magnetic field distribution $H_{ref}(x_i, y_j)$ previously measured while moving the portable radio apparatus of the reference radio apparatus in the x-direction and the y-direction by means of the movement mechanism apparatus 40 and the SAR distribution $SAR_{ref}(x_i, y_j, z_l)$ previously measured by moving the electric field probe 1001 in the x-direction and the y-direction with respect to the portable radio apparatus and the cubic phantom 60 with z fixed to $z=z_l$. In this case, the near magnetic field distribution $H_{ref}(x_i, y_j)$ can be measured by using the magnetic field probe 1, and the SAR distribution $SAR_{ref}(x_i, y_j, z_l)$ can be measured by using the above-mentioned standard measurement method. Subsequently, in step S32, while moving the portable radio apparatus 10a to be measured in the x-direction and the y-direction by means of the movement mechanism apparatus 40, a detection signal from the magnetic field probe 1, which is provided on its front surface and detects the near magnetic field, is received, and the magnetic field square value distribution $H^2_{measure}(x_i, y_j)$ in the vicinity of the front surface of the portable radio apparatus 10a to be measured is calculated for a plurality of predetermined position coordinates $(x_i, y_j)$ based on the voltages of the detection signals. Then, in step S33A, the SAR distributions $SAR_{estimaten}(x_i, y_j, z_l)$ for respective holding postures n (n=1, 2, 3, 4) are estimated and calculated using the equation (13) by multiplying the calculated magnetic field square value distribution $H^2_{measure}(x_i, y_j)$ by the transformation factor distributions $\alpha_n(x_i, y_j, z_l)$ for the respective holding postures n (n=1, 2, 3, 4), and the program flow proceeds to step S34 of FIG. 40.

In step S34A of FIG. 40, the average SARs for the respective holding postures n (n=1, 2, 3, 4) are calculated by using the equation (20) and the equation (14) or the equation (15), and thereafter, the processes of step S35 to S38 are executed in a manner similar to that of FIG. 36, then the SAR calculation is completed.

According to the average SAR estimation method of the modified preferred embodiment of the eighth preferred embodiment shown in FIGS. 39 and 40, the SAR in the z-direction can be estimated and calculated by using the equation (20) as compared with the average SAR estimation method of the eighth preferred embodiment shown in FIGS. 35 and 36. Accordingly, the measurement of the SAR distribution in the z-direction by the reference portable radio apparatus and the calculation of the transformation factor distribution $\alpha(x, y, z)$ in the z-direction calculation are not required to be executed in step S31A. Furthermore, there is no need for carrying out the calculation of the SAR distribution in the z-direction in step S33A, and this allows the amount of calculation to be remarkably reduced.

Next, the results of calculation of the average SAR as to that of FIG. 25 using the equation (20) and the equation (14) or the equation (15) of the modified preferred embodiment of the eighth preferred embodiment will be described below. In this case, the frequency f of the transmission signal is set to f=925 MHz, and it is assumed that the magnetic permeability $\mu$ has a magnetic permeability value of $\mu_o=4\pi \times 10^{-7}$ H/m in a vacuum and the electric conductivity a has an electric conductivity value of $\sigma=1.01$ S/m of the SAR solution 53. At this time, the skin depth $\delta$ of the phantom material becomes $\delta=1.65 \times 10^{-2}$.

First of all, the calculation of the 1-gram average SAR will be described. The 1-gram average SAR can be calculated as an arithmetic mean of SARs at the coordinates on the inside of the cubic lattice 54 where one side of the bottom surface of the cubic lattice 54A has a size of 10 mm. In the present preferred embodiment, the SAR is measured at intervals of 5 mm, and the 1-gram average SAR is calculated. This calculation method will be described with reference to FIG. 41.

Figure 41:
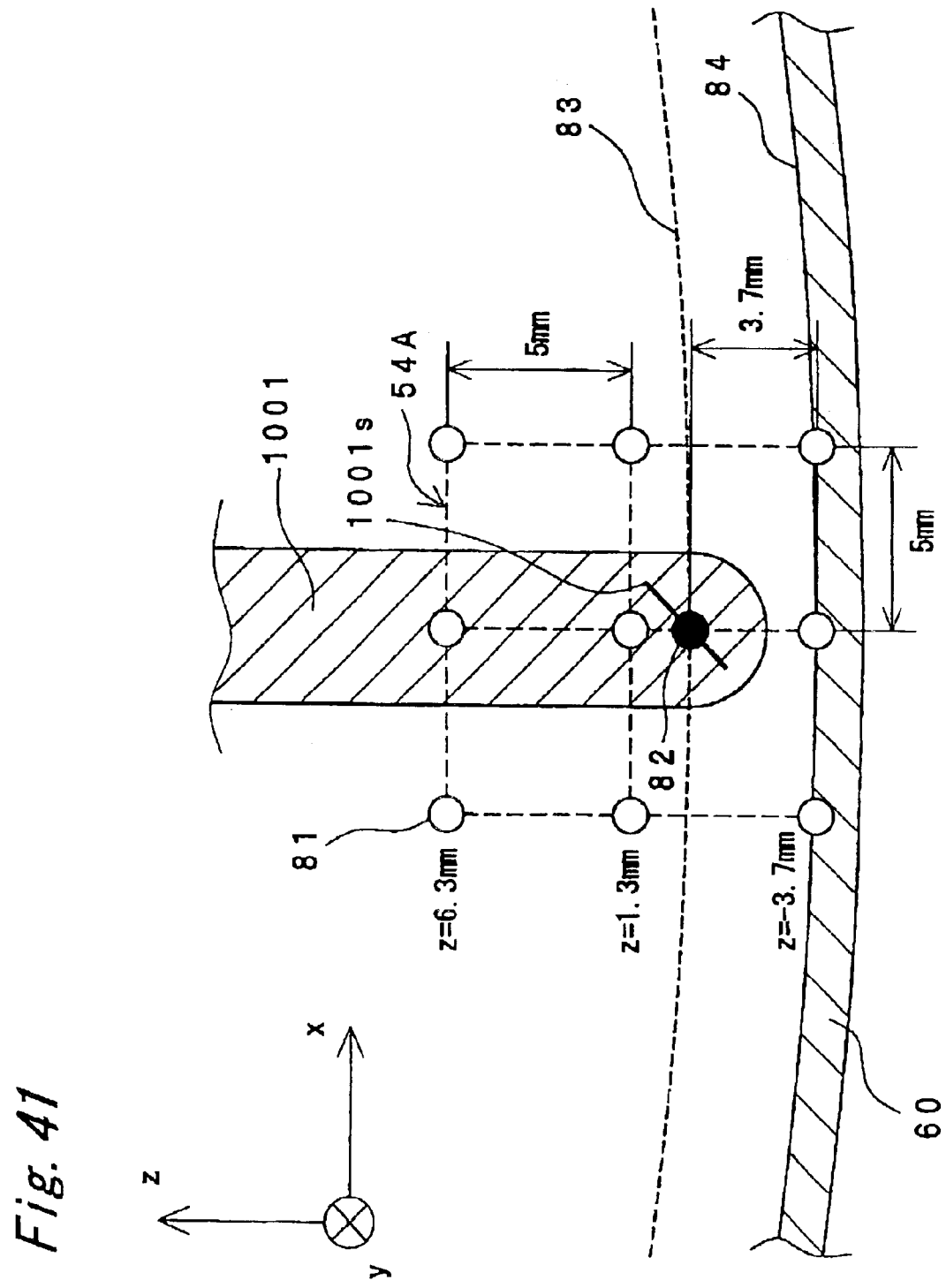
FIG. 41 is a sectional view showing a coordinates of a portion where the magnetic field probe 1 and the phantom 54 are adjacent to each other when the SAR calculation method of the modified preferred embodiment of the eighth preferred embodiment of the present invention is verified.

FIG. 41 shows a state in which the sensor portion 1001 s of the electric field probe 1001 is located so as to be adjacent to a surface line 84 of the head portion 60 of the human body phantom. In this case, with regard to the SAR distribution of nine points (=3×3, the SAR measurement surface has herein an area of 10 mm×10 mm) of the SAR measurement surface (xy-plane) including a measurement limit line 83 centered about an SAR measurement maximum point 82 among a plurality of measurement points 81 shown in FIG. 41, the SAR distribution in the z-direction is estimated by using the equation (20). It is to be noted that the measurement can be performed by using the above-mentioned standard measurement method only on the SAR measurement surface including the measurement limit line 83 located inside by 3.7 mm from the surface line 84 of the head portion 60 of the human body phantom, as shown in FIG. 41. It is assumed that the SAR located at the SAR measurement maximum point 82 is set as $SAR_{estimate}(x_i, y_j, z_l)$. Accordingly, an SAR at an estimated point 85 on the surface line 84 of the head portion 60 of the human body phantom is an SAR at a position shifted by 3.7 mm in the −z-direction from the measurement maximum point 82, and can be calculated by substituting z=−3.7 mm into the equation (20). Therefore, the coordinates in the z-direction of the 3×3×3=27 (10 mm×10 mm×10 mm) measurement points 81 for carrying out SAR estimation become z=−3.7 mm, 1.3 mm and 6.3 mm at 5-mm intervals from the surface line 84 of the head portion 60 of the human body phantom, as shown in FIG. 41. By calculating the average value of the SAR values of the 27 estimated points 81 estimated by using the equation (20) as described above, the 1-gram average SAR value can be calculated.

According to the experimental results conducted by the present inventors, the 1-gram average SAR value in the state in which the antenna is extended according to the above-mentioned standard measurement method was 0.637 mW/g, and the 1-gram average SAR value according to the estimation method using the equation (20) of the modified preferred embodiment of the eighth preferred embodiment was 0.645 mW/g. Therefore, the error of the 1-gram average SAR value was +1%.

Moreover, the present inventors conducted estimation of the 10-gram average SAR value in a similar manner. In this case, the average of the SAR values in a cube having one side of 22 mm was calculated. The 10-gram average SAR value in the state in which the antenna is extended according to the above-mentioned standard measurement method was 0.398 mW/g, and the 10-gram average SAR value using the equation (20) of the modified preferred embodiment of the eighth preferred embodiment was 0.423 mW/g. Therefore, the error of the 10-gram average SAR value was −6%

As described above, by using the average SAR estimation method of the eighth preferred embodiment or the average SAR estimation method of the modified preferred embodiment of the eighth preferred embodiment, the average SAR can be estimated and calculated very simply with higher accuracy as compared with the prior art.

IMPLEMENTAL EXAMPLES FOR USE IN PREFERRED EMBODIMENTS

In each of the above-mentioned preferred embodiments, the magnetic field probe 1 is employed. However, the present invention is not limited to this, and it is acceptable to employ magnetic field probes described below.

Figure 42:
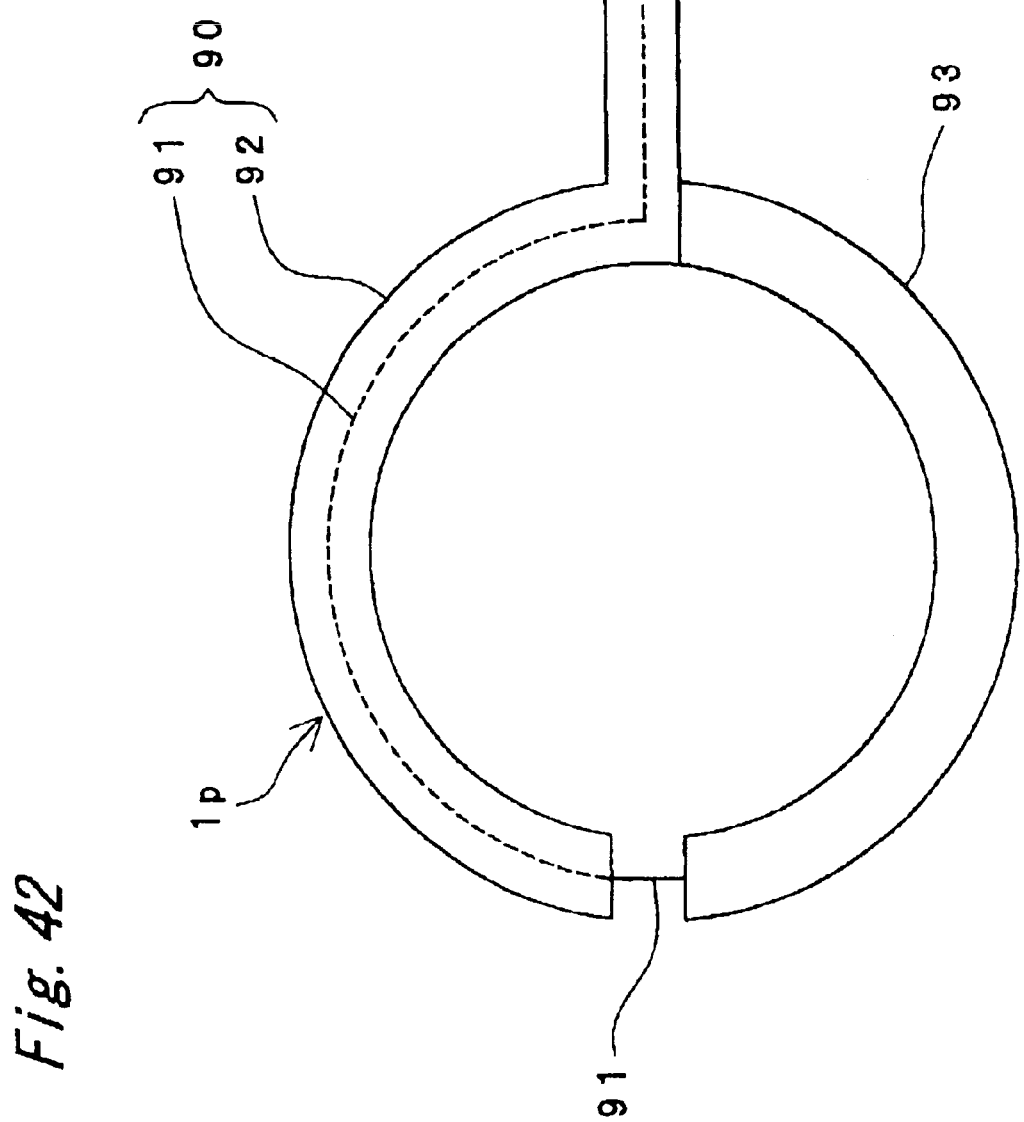
FIG. 42 is a side view showing a structure of a magnetic field probe 1p according to a first implemental example for use in the preferred embodiments of the present invention.

FIG. 42 is a side view showing a structure of a magnetic field probe 1p according to a first implemental example for use in the preferred embodiments of the present invention.

Referring to FIG. 42, a magnetic field probe 1p is provided with a single gap type shielded loop having a gap at its tip. A semicircular arc portion of the loop for detecting the magnetic field is constituted by a coaxial cable 90 comprised of a central conductor 91 and a grounding conductor 92, and the other semicircular portion is constituted by a conductor line 93 having an outside diameter substantially equal to the outside diameter of the coaxial cable 90. In this case, one end located on the leading end side of the conductor line 93 is connected to the central conductor 91 of the coaxial cable 90, and another end thereof is connected to the grounding conductor 92 of the coaxial cable 90.

Figure 43:
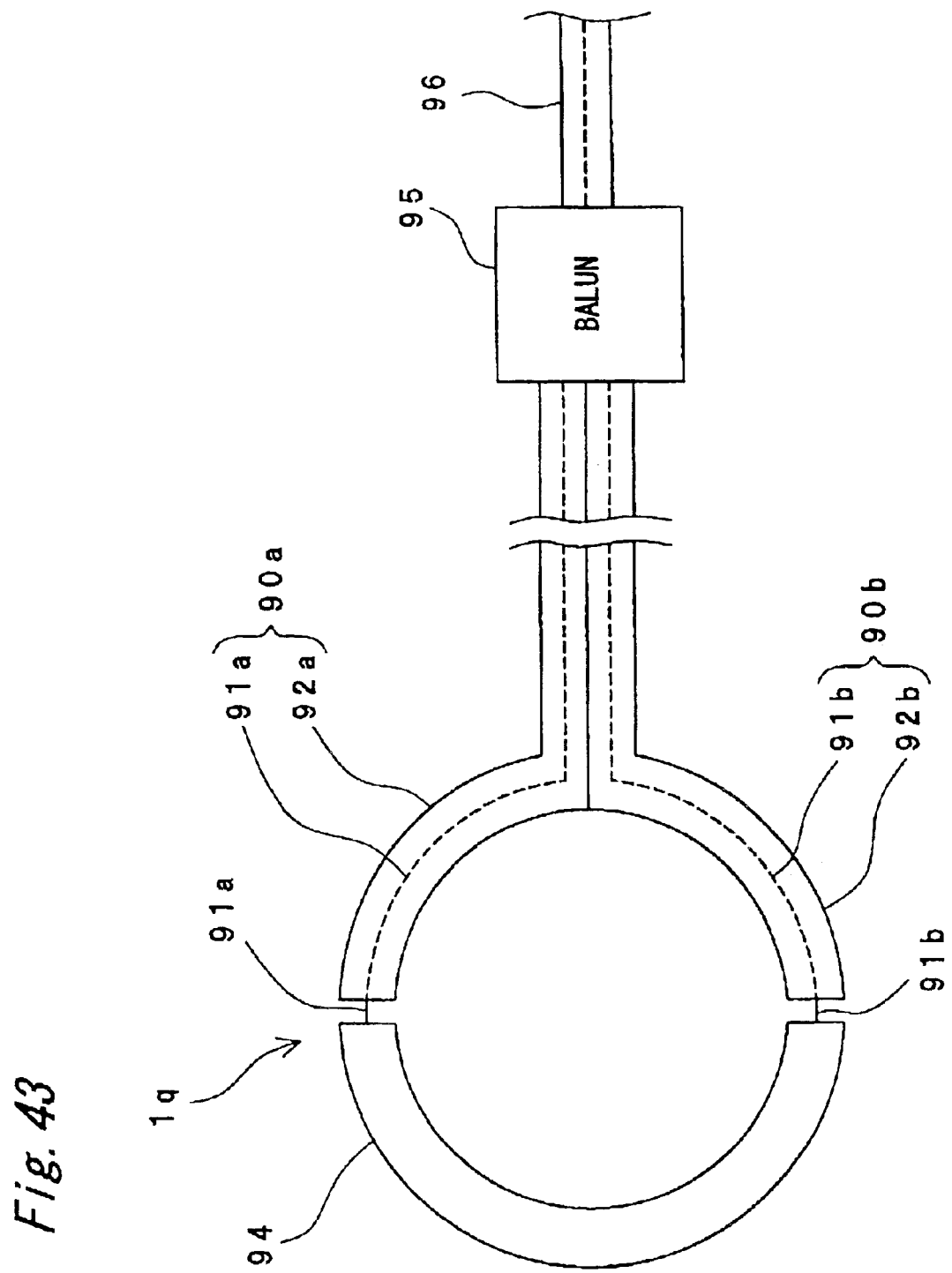
FIG. 43 is a side view showing a structure of a magnetic field probe 1q according to a second implemental example for use in the preferred embodiments of the present invention.

FIG. 43 is a side view showing a structure of a magnetic field probe 1q according to a second implemental example for use in the preferred embodiments of the present invention.

Referring to FIG. 43, the magnetic field probe 1q is provided with a double gap type (balanced type) shielded loop, and is constituted by two coaxial cables 90a and 90b, and a semicircular metal wire 94. In this case, the coaxial cable 90a includes a central conductor 91a and a grounding conductor 92a, while the coaxial cable 90b includes a central conductor 91b and a grounding conductor 92b. One end of the metal wire 94 is connected to the central conductor 91a of the coaxial cable 90a, while another end of the metal wire 94 is connected to the central conductor 91b of the coaxial cable 90b. The two coaxial cables 90a and 90b are connected to the balanced terminal of a balun 95 of a balanced to unbalanced transformer, while a coaxial cable 96 for feeding an electric power is connected to the unbalanced terminal of the balun 95.

Figure 44:
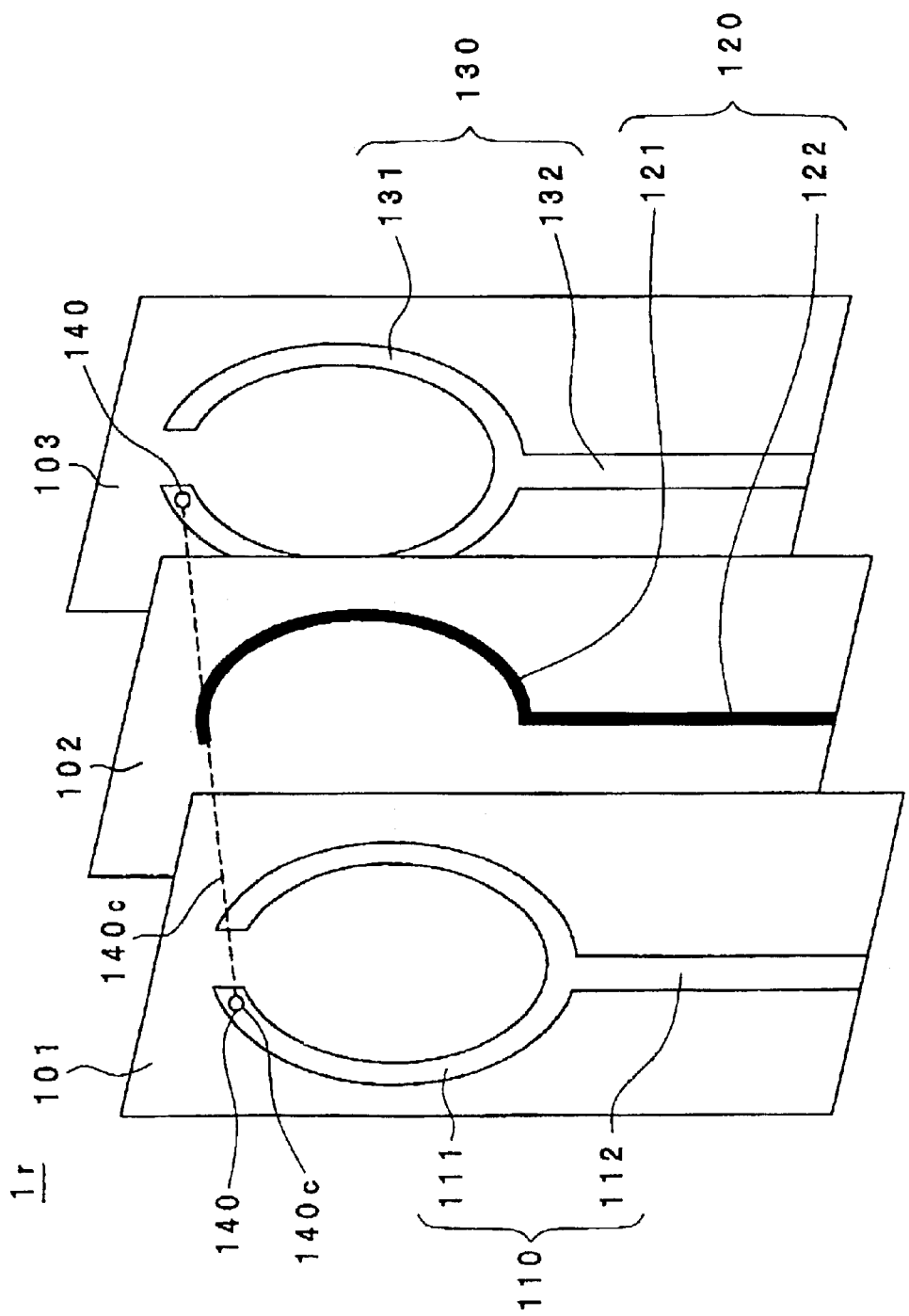
FIG. 44 is a perspective view showing a structure of a magnetic field probe 1r, according to a third implemental example for use in the preferred embodiments of the present invention.

FIG. 44 is a perspective view showing a structure of a magnetic field probe 1r according to a third implemental example for use in the preferred embodiments of the present invention.

Referring to FIG. 44, the magnetic field probe 1r is a shielded loop having a structure that employs a multi-layer printed wiring board, and FIG. 44 shows one example in which a magnetic field probe provided with the single gap type shielded loop is constituted by a three-layer substrate. Referring to FIG. 44, a grounding conductor pattern 110 comprised of a roughly circular portion 111 having a gap and a linear strip portion 112 connected to the intermediate position of the roughly circular portion 111 is formed on a dielectric substrate 101. A transmission conductor pattern 120 including a roughly semicircular portion 121 having a gap and a linear strip portion 122 connected to one end of the roughly semicircular portion 121 is formed on a dielectric substrate 102. A grounding conductor pattern 130 comprised of a roughly circular portion 131 having a gap and a linear strip portion 132 connected to the intermediate position of the roughly circular portion 131 is formed on a dielectric substrate 103. The three dielectric substrates 101, 102 and 103 are stuck together in a laminating manner so that the transmission conductor pattern 120 is interposed between the two grounding conductor patterns 110 and 130. In this case, a through hole 140 is formed so as to penetrate the dielectric substrate 101 in the direction of thickness at the leading end of the roughly circular portion 111, penetrates the dielectric substrate 102 in the direction of thickness at the leading end of the roughly semicircular portion 121, and penetrates the dielectric substrate 103 in the direction of thickness at the leading end of the roughly circular portion 131. The formed through hole 140 is formed by being internally filled with a through hole conductor 140c. With this arrangement, the leading end of the roughly circular portion 111, the leading end of the roughly semicircular portion 121 and the leading end of the roughly circular portion 131 can be connected together and grounded. It is acceptable to constitute the portions of the linear strip portions 112, 122 and 132 of a feeding planar transmission line such as a double-sided type microstrip line, a coplanar line and a slot line using, for example, a dielectric substrate.

Figure 45:
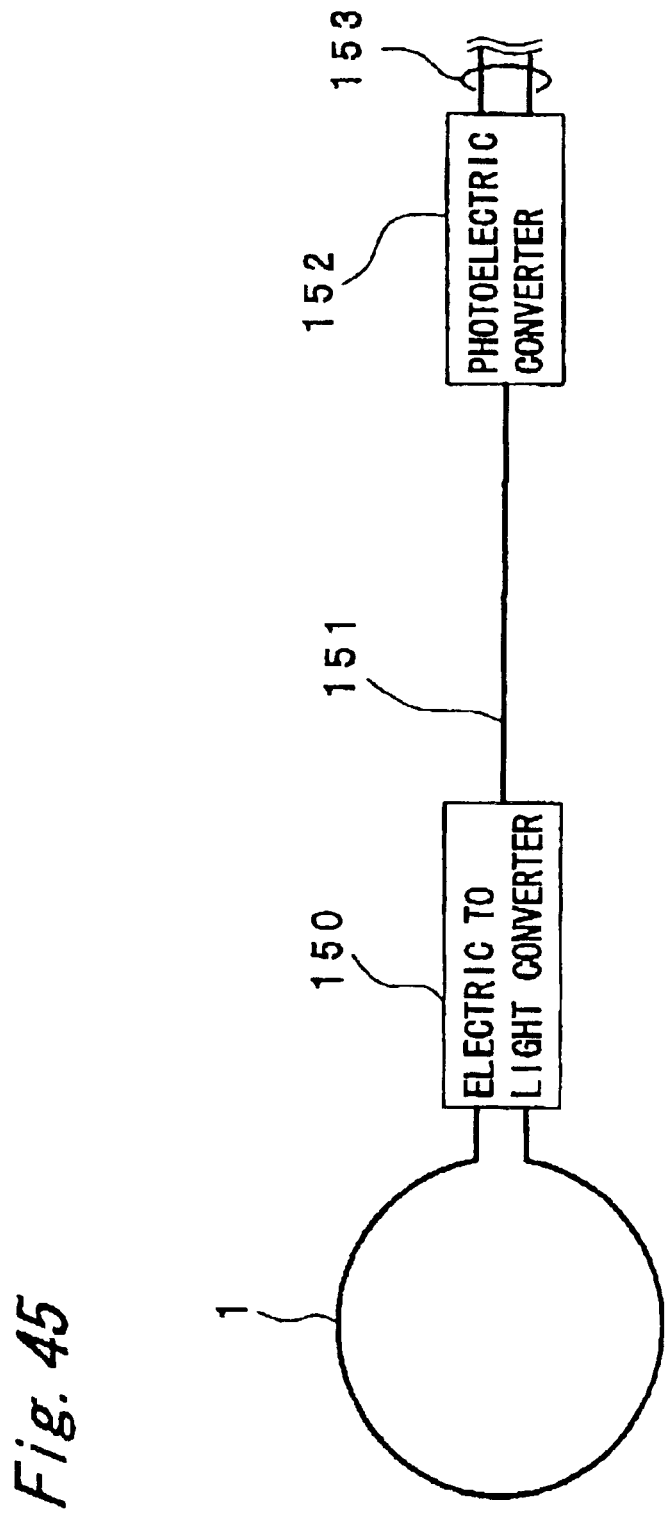
FIG. 45 is a block diagram showing a structure of a modified preferred embodiment of a signal cable to the magnetic field probe 1 according to a fourth implemental example for use in the preferred embodiments of the, present invention.

FIG. 45 is a block diagram showing a structure of a modified preferred embodiment of a signal cable to the magnetic field probe 1 according to a fourth implemental example for use in the preferred embodiments of the present invention.

Referring to FIG. 45, a detection signal that represents the detection voltage proportional to the magnetic field detected by the magnetic field probe 1 is subjected to electric to light conversion by an electric to light converter 150 provided with a laser diode or the like, and thereafter, the converted optical signal is transmitted via an optical fiber cable 151 and then inputted to a photoelectric converter 152. The photoelectric converter 152 photoelectrically converts the inputted optical signal into an electric signal, and then, outputs the electric signal via a feeder cable. According to the implemental example of FIG. 45, the detection signal of the magnetic field probe 1 is photoelectrically converted and transmitted, and therefore, the influence of external noises on the detection signal can be remarkably reduced.

Figure 46:
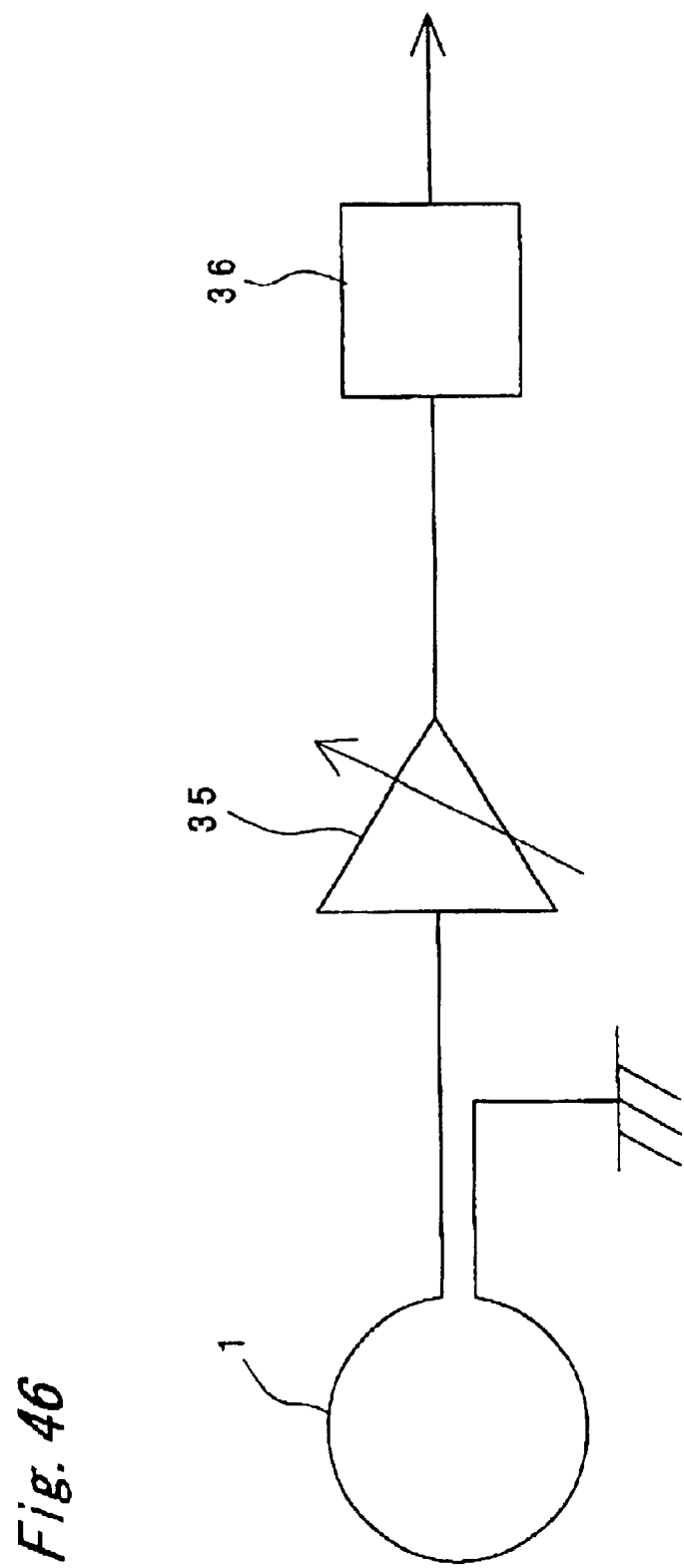
FIG. 46 is a block diagram showing a structure of a modified preferred embodiment of an apparatus for processing a detection signal from the magnetic field probe 1 according to a fifth implemental example for use in the preferred embodiments of the present invention.

FIG. 46 is a block diagram showing a structure of a modified preferred embodiment of an apparatus for processing the detection signal from the magnetic field probe 1 according to a fifth implemental example for use in the preferred embodiments of the present invention.

Referring to FIG. 46, the detection signal from the magnetic field probe 1 is outputted via a variable amplifier 35 and a variable phase shifter 36. In the present implemental example, a loop diameter of the magnetic field probe 1 is reduced to increase the resolving power of SAR measurement, while the voltage of the detection signal is amplified by using the variable amplifier 35. By this setting, a minute magnetic field can be detected. Moreover, in a manner similar to that of the fifth preferred embodiment of FIG. 7, the SAR distribution can be measured with higher accuracy by calibrating the SAR measuring apparatus by adjusting the amplification of the variable amplifier 35 and the quantity of phase shift of the variable phase shifter 36 so that the measured SAR distribution substantially coincides with the predetermined SAR distribution of the reference antenna and thereafter executing the SAR measurement process for the portable radio apparatus to be measured.

The above-mentioned fifth implemental example is provided with the variable amplifier 35 and the variable phase shifter 36. However, the present invention is not limited to this, and it is acceptable to provide at least one of the variable amplifier 35 and the variable phase shifter 36.

Figure 47A:
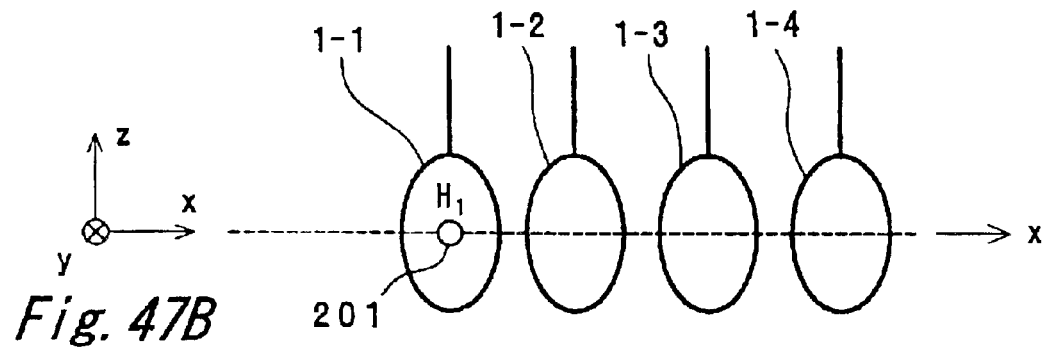
FIG. 47A is a sectional view of a zx-plane showing an arrangement method of a plurality of magnetic field probes 1 according to a sixth implemental example for use in the preferred embodiments of the present invention.
Figure 47B:
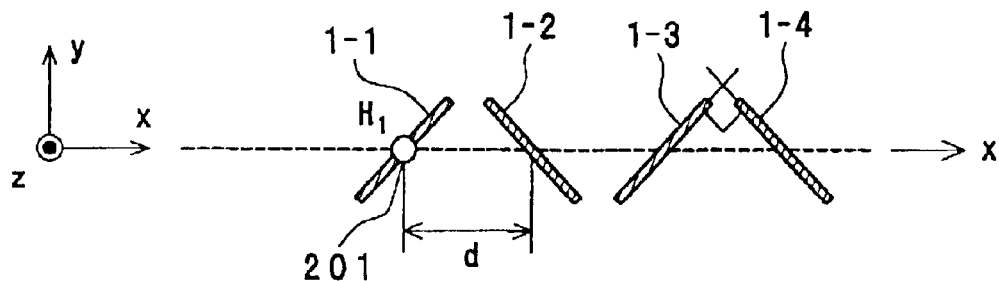
FIG. 47B is a sectional view of the xy-plane showing the arrangement method of FIG. 47A.

FIG. 47A is a sectional view of the zx-plane showing an arrangement method of a plurality of magnetic field probes 1 according to a sixth implemental example for use in the preferred embodiments of the present invention, and FIG. 47B is a sectional view of the xy-plane. As shown in FIGS. 47A and 47B, it is acceptable to provide a linear array arrangement in which the probes are aligned at intervals of "d" so that mutually adjacent one pair of magnetic field probes (1-1 and 1-2; 1-2 and 1-3; and 1-3 and 1-4) are perpendicular to each other. Moreover, without being limited to the linear array arrangement of FIGS. 47A and 47B, there may be a two-dimensional array arrangement. Accordingly, by arranging the magnetic field probes 1-1 to 1-4 so that they are aligned so as to be perpendicular to one another, with isolation between the magnetic field probes 1-1 to 1-4 can be increased, and the magnetic fields of the xy components can be detected with higher accuracy as compared with the prior art.

Figure 48A:
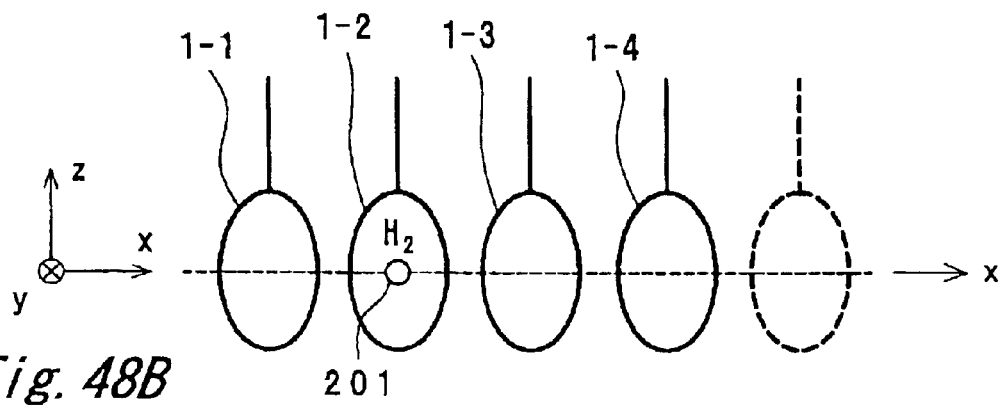
FIG. 48A is a sectional view of the zx-plane when the plurality of magnetic field probes 1 are moved by a distance of "d" in the x-direction from the state of FIGS. 45A and 45B.
Figure 48B:
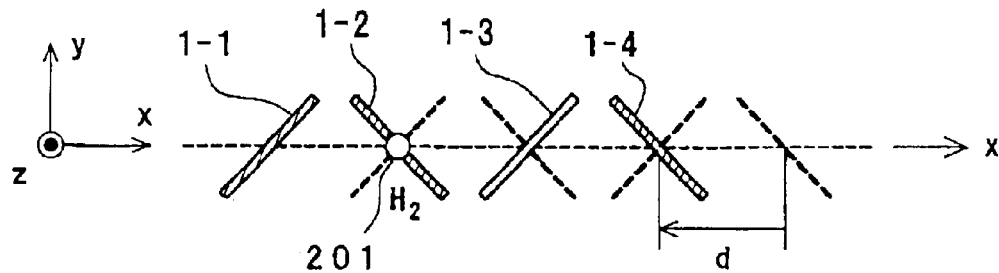
FIG. 48B is a sectional view of the xy-plane showing the movement of FIG. 48A.

For example, the magnetic field intensities of the xy components at a magnetic field detection point 201 in FIGS. 47A and 47B are calculated as follows. First of all, a magnetic field intensity $H_1$ when the center of the loop of the magnetic field probe 1-1 is located at the magnetic field detection point 201 is detected. Next, as shown in FIGS. 48A and 48B, the magnetic field probes 1-1 to 1-4 are shifted by a distance of "d" in the −x-direction. At this time, the magnetic field detection point 201 is located at the center of the loop of the magnetic field probe 1-2. In this case, the magnetic field intensity detected by the magnetic field probe 1-2 is assumed to be $H_2$. A magnetic field intensity $H_{total}$ of the xy components at the magnetic field detection point 201 is expressed by the sum of squares of two detection magnetic field intensities $H_1$ and $H_2$ as expressed by the following equation:

$$H_{total} = \sqrt{H_1^2 + H_2^2}. \tag{21}$$

Figure 49A:
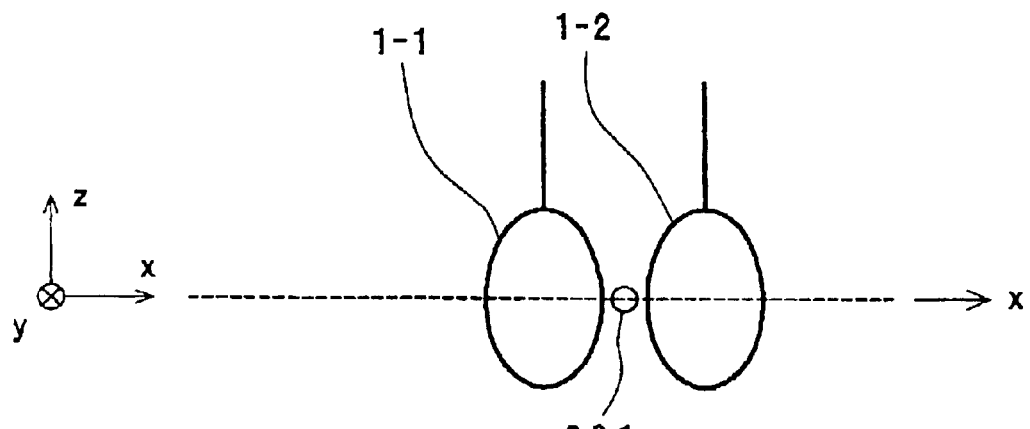
FIG. 49A is a sectional view of the zx-plane showing an arrangement method of a pair of magnetic field probes 1 according to a seventh implemental example for use in the preferred embodiments of the present invention.
Figure 49B:
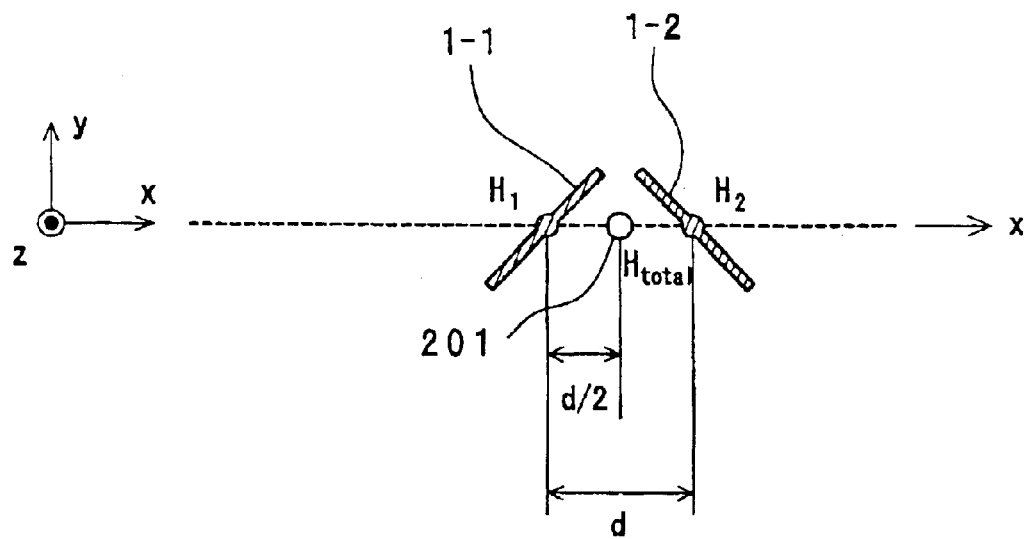
FIG. 49B is a sectional view of the xy-plane showing the arrangement method of FIG. 49A.

Moreover, it is acceptable to calculate the sum of squares using the equation (21) as it is without shifting the magnetic field intensity $H_1$ detected by the magnetic field probe 1-1 and the magnetic field intensity $H_2$ detected by the magnetic field probe 1-2 in the x-direction. As shown in FIG. 49, the detection point 201 of the magnetic field intensity at this time is located at the midpoint (or intermediate position) of a distance between the centers of the loops of the two magnetic field probes 1-1 and 1-2. According to the magnetic field measurement method shown in FIGS. 49A and 49B, the magnetic field intensity can be measured at a higher speed since the method is accompanied by no shift for aligning the coordinates of the mutually adjacent magnetic field probes 1-1 and 1-2.

Figure 50:
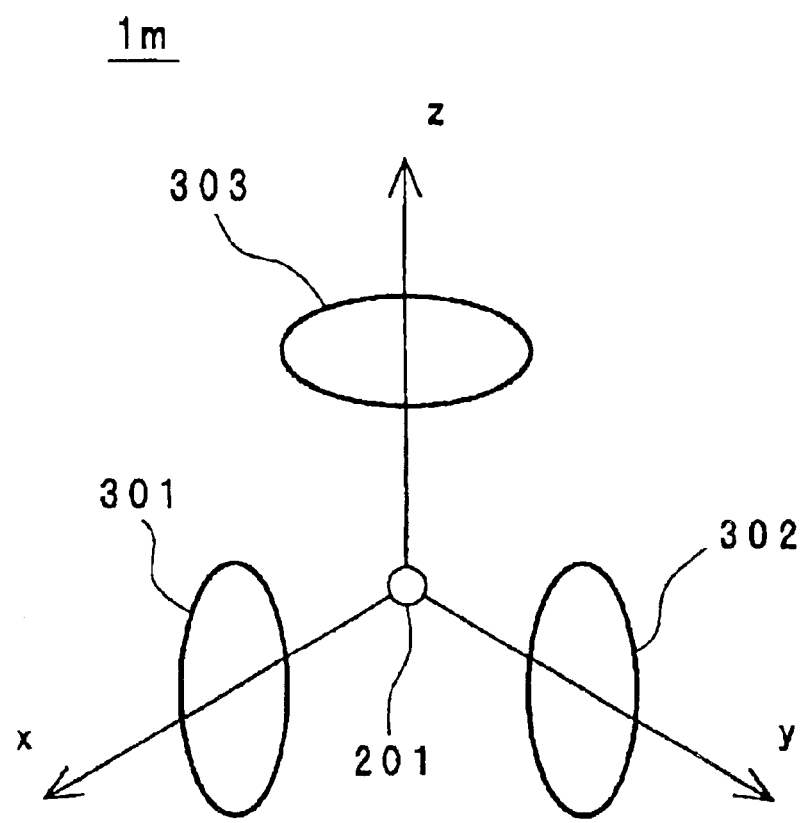
FIG. 50 is a perspective view showing an arrangement method of a magnetic field probe 1m comprised of three magnetic field probe portions 301, 302 and 303 according to an eighth implemental example for use in the preferred embodiments of the present invention.

FIG. 50 is a perspective view showing an arrangement method of a magnetic field probe 1m comprised of three magnetic field probe portions 301, 302 and 303 according to an eighth implemental example for use in the preferred embodiments of the present invention.

Referring to FIG. 50, a magnetic field probe 1m is comprised of the three magnetic field probe portions 301, 302 and 303. In this case, these magnetic field probe portions 301, 302 and 303 are arranged in a manner that the x-axis penetrates the center of the loop of the magnetic field probe portion 301 so as to be perpendicular to its loop plane, the y-axis penetrates the center of the loop of the magnetic field probe portion 302 so as to be perpendicular to its loop plane, and the z-axis penetrates the center of the loop of the magnetic field probe portion 303 so as to be perpendicular to its loop plane. With the above arrangement, the magnetic fields of the three orthogonal components of the three axes can be detected, and the magnetic field intensity can be measured with higher accuracy.

Figure 51A:
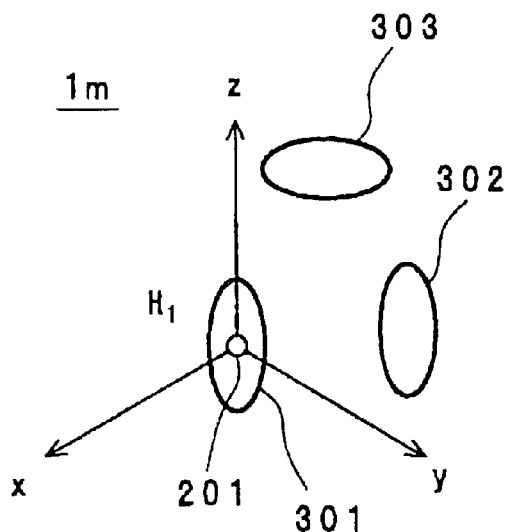
FIG. 51A is a perspective view showing an arrangement method of a magnetic field probe 1m comprised of three magnetic field probe portions 301, 302 and 303 in a first case according to a ninth implemental example for use in the preferred embodiments of the present invention.
Figure 51B:
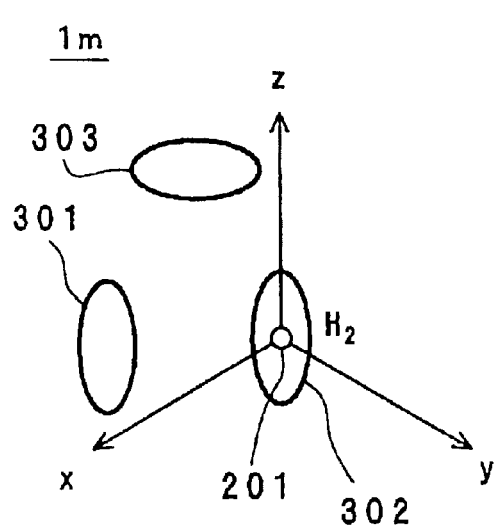
FIG. 51B is a perspective view showing an arrangement method of the magnetic field probe 1m comprised of the three magnetic field probe portions 301, 302 and 303 in a second case according to the ninth implemental example for use in the preferred embodiments of the present invention.
Figure 51C:
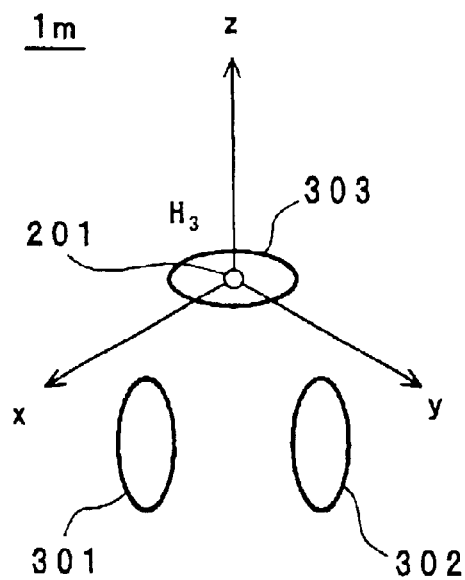
FIG. 51C is a perspective view showing an arrangement method of the magnetic field probe 1m comprised of the three magnetic field probe portions 301, 302 and 303 in a third case according to the ninth implemental example for use in the preferred embodiments of the present invention.

The magnetic electric field intensity at the detection point 201 of FIG. 50 can be also calculated by subjecting the detected intensity when the magnetic field probe 1m arranged with the arrangement relationship similar to that of FIG. 50 is shifted so that the centers of the loops of the three magnetic field probe portions 301, 302 and 303 are located at the origin of the xyz-coordinate system as shown in FIGS. 51A, 51B and 51C to the operation of the sum of squares. Assuming that the magnetic field intensities at the detection point 201 of the magnetic field probe portions 301, 302 and 303 are $H_1$, $H_2$ and $H_3$, respectively, then the total magnetic field intensity $H_{total}$ at the origin of the xyz-coordinate system is expressed by the following equation:

$$H_{total} = \sqrt{H_1^2 + H_2^2 + H_3^2}. \tag{22}$$

Figure 52:
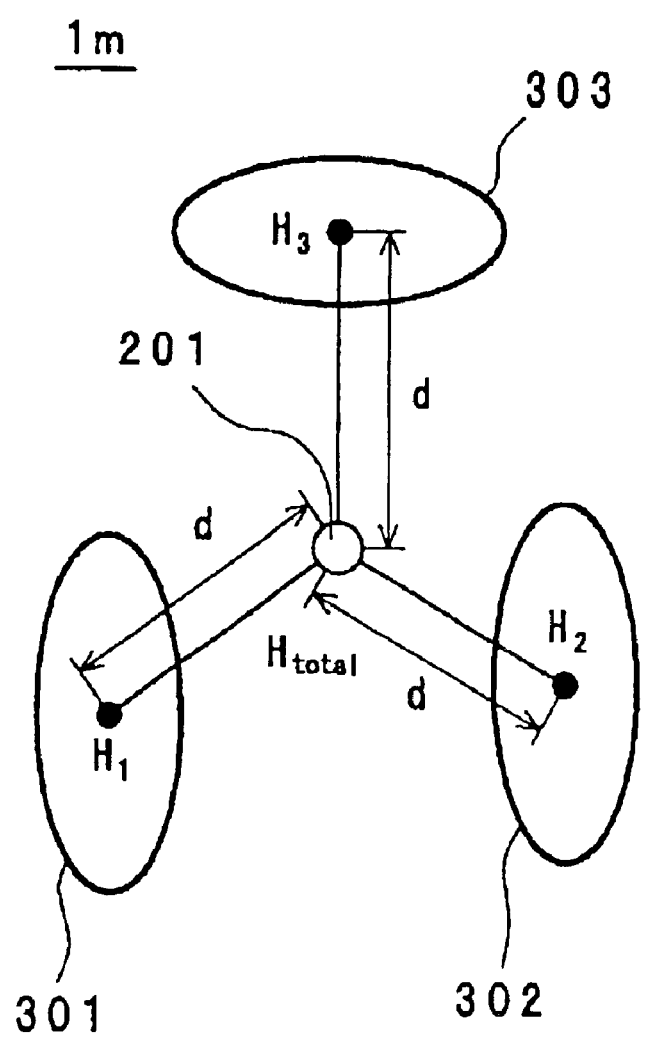
FIG. 52 is a perspective view showing an arrangement method of the magnetic field probe 1m comprised of the three magnetic field probe portions 301, 302 and 303 according to a tenth implemental example for use in the preferred embodiments of the present invention.

Further, as shown in FIG. 52, as a simple magnetic field detection method of the xyz components, it is acceptable to calculate the total magnetic field by subjecting the magnetic field intensities $H_1$, $H_2$ and $H_3$ detected by the magnetic field probe portions 301, 302 and 303 arranged apart by the same distance of "d" to the detection point 201 with the arrangement relationship similar to that of FIG. 50 to the operation of sum of squares by using the, above equation (22) without shifting the three magnetic field probe portions 301, 302 and 303. Since this magnetic field detection method is accompanied by no shift for aligning the coordinates of the three magnetic field probe portions 301, 302 and 303, the magnetic field can be measured at a higher speed.

Furthermore, it is acceptable to provide a structure in which the three mutually perpendicular magnetic field probe portions 301, 302 and 303 shown in FIG. 52 may be formed as a one-element magnetic field probe 1m, and a plurality of magnetic field probes 1m may be arranged in a linear array arrangement or a two-dimensional array arrangement. With this arrangement, the magnetic field measurement can be achieved with higher accuracy at a higher speed.

Moreover, it is preferable to enclose the magnetic field probe 1, the portable radio apparatus 10 or 10a, the movement mechanism apparatus 30 or 40 and so on with metal plates in order to reduce the superimposition of external noises on the detection signal from the magnetic field probe 1. At this time, it is preferable to cover the inside of the metal plates with a wave absorber so as to prevent the occurrence of multipath reflection on the metal plates. With this arrangement, the magnetic field measurement can be achieved with higher accuracy.

Furthermore, for the purpose of prevention of the disturbance of the near magnetic field distributions of the portable radio apparatuses 10 and 10a, it is improper to form the movement mechanism apparatuses 30 and 40 of a metallic material. For this reason, it is preferable to form the movement mechanism apparatuses 30 and 40 of a resin material of, for example, polyethylene fluoride or acrylic or of a dielectric substance such as wood or the like. Moreover, it is also undesirable for the measurement of the near magnetic field of the portable radio apparatuses 10 and 10a that components made of a metallic material exist around the magnetic field probe 1 and the portable radio apparatuses 10 and 10a. For this reason, it is preferable to stick a radio wave absorber to the components made of a metallic material.

Furthermore, the distribution of the transformation factor $\alpha$ differs depending on the transmission frequencies of the portable radio apparatuses 10 and 10a and the models of products. In order to cope with various models and many frequencies, it is acceptable to provide a function to switch over the distribution of the transformation factor $\alpha$ used for SAR calculation according to the portable radio apparatuses 10 and 10a to be measured.

In the above-mentioned preferred embodiments, the movement mechanism apparatuses 30 and 40 are provided with the movement mechanisms, and the near magnetic field distributions thereof are measured while moving the portable radio apparatuses 10 and 10a. However, the present invention is not limited to this, and it is acceptable to provide the magnetic field probe 1 or the array of the magnetic field probes 1 with a movement mechanism.

Advantageous Effects of Preferred Embodiments

As described above in detail, according to the preferred embodiments of the present invention, there is provided the following SAR measuring apparatus for use in a radio apparatus. In the SAR measuring apparatus, a first measurement device measures in free space a first near magnetic field of a radio wave radiated from either a reference radio apparatus or a reference antenna, and a second measurement device measures a specific absorption rate (SAR) of the radio wave radiated from either the reference radio apparatus or the reference antenna by using a predetermined phantom according to a predetermined measurement method. A first calculation device calculates a transformation factor $\alpha$ by dividing the measured specific absorption rate (SAR) by a square value of the measured first near magnetic field, and a third measurement device measures in free space a second near magnetic field of a radio wave radiated from a radio apparatus to be measured. A second calculation device estimates and calculates a specific absorption rate (SAR) of the radio wave radiated from SAR radio apparatus to be measured by multiplying a square value of the measured second near magnetic field by the calculated transformation factor $\alpha$.

In the above-mentioned SAR measuring apparatus, a first movement device moves either the reference radio apparatus or the reference antenna in one, two or three dimension relatively to the first measurement device and the second measurement device, and a second movement device moves the second measurement device in one, two or three dimension relatively to the radio apparatus to be measured and the phantom. Then the first measurement device measures in free space a distribution of the first near magnetic field of the radio wave radiated from either the reference radio apparatus or the reference antenna, while moving either the reference radio apparatus or the reference antenna by the first movement device, and the second measurement device measures a distribution of the specific absorption rate (SAR) of the radio wave radiated from either the reference radio apparatus or the reference antenna, while moving either the reference radio apparatus or the reference antenna by the first movement device, according to the measurement method. Thereafter, the first calculation device calculates a distribution of the transformation factor $\alpha$ by dividing the distribution of the measured specific absorption rate (SAR) by a distribution of the square value of the measured first near magnetic field, and third measurement device measures in free space a distribution of the second near magnetic field of the radio wave radiated from the radio apparatus to be measured, while moving the radio apparatus to be measured by the second movement device. Finally, the second calculation device estimates and calculates a distribution of the specific absorption rate (SAR) of the radio wave radiated from the radio apparatus to be measured by multiplying a distribution of the square value of the measured second near magnetic field by the distribution of the calculated transformation factor $\alpha$.

Accordingly, according to the present invention, it is possible to measure in free space the near magnetic field distribution radiated from the radio apparatus such as a portable telephone, and estimate and calculate an SAR or its distribution at a higher speed with higher accuracy as compared with the prior art, based on the measured near magnetic field distribution with a simple apparatus structure. Moreover, according to the present invention, it is possible to measure an SAR or its distribution in the arrangement of the radio apparatus such as a portable telephone in conformity to the actual SAR measurement. Furthermore, according to the present invention, it is possible to measure an SAR or its distribution of the radio apparatus such as a portable telephone on a production line more easily than that of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A specific absorption rate measuring apparatus for use in a radio apparatus, comprising:

a first measurement device for measuring in free space a first near magnetic field of a radio wave radiated from one of a reference radio apparatus and a reference antenna;

a second measurement device for measuring a specific absorption rate (SAR) of the radio wave radiated from one of said reference radio apparatus and said reference antenna by using a predetermined phantom according to a predetermined measurement method;

a first calculation device for calculating a transformation factor $\alpha$ by dividing the measured specific absorption rate (SAR) by a square value of the measured first near magnetic field;

a third measurement device for measuring in free space a second near magnetic field of a radio wave radiated from a radio apparatus to be measured; and a second calculation device for estimating and calculating a specific absorption rate (SAR) of the radio wave radiated from SAR radio apparatus to be measured by multiplying a square value of the measured second near magnetic field by the calculated transformation factor $\alpha$.

2. The specific absorption rate measuring apparatus as claimed in claim 1, further comprising:
a first movement device for moving one of said reference radio apparatus and said reference antenna in one of one, two and three dimensions relatively to said first measurement device and said second measurement device; and
a second movement device for moving said second measurement device in one of one, two and three dimensions relatively to said radio apparatus to be measured and said phantom,
wherein said first measurement device measures in free space a distribution of the first near magnetic field of the radio wave radiated from one of said reference radio apparatus and said reference antenna, while moving one of said reference radio apparatus and said reference antenna by said first movement device,
wherein said second measurement device measures a distribution of the specific absorption rate (SAR) of the radio wave radiated from one of said reference radio apparatus and said reference antenna, while moving one of said reference radio apparatus and said reference antenna by said first movement device, according to said measurement method,
wherein said first calculation device calculates a distribution of the transformation factor α by dividing the distribution of the measured specific absorption rate (SAR) by a distribution of the square value of the measured first near magnetic field,
wherein said third measurement device measures in free space a distribution of the second near magnetic field of the radio wave radiated from said radio apparatus to be measured, while moving said radio apparatus to be measured by said second movement device, and
wherein said second calculation device estimates and calculates a distribution of the specific absorption rate (SAR) of the radio wave radiated from said radio apparatus to be measured by multiplying a distribution of the square value of the measured second near magnetic field by the distribution of the calculated transformation factor α.

3. The specific absorption rate measuring apparatus as claimed in claim 2,
wherein said first measurement device measures in free space the distribution of the first near magnetic field of the radio wave radiated from one of said reference radio apparatus and said reference antenna, while moving one of said reference radio apparatus and said reference antenna in one, two and three dimensions except for a direction substantially perpendicular to a surface of one of said reference radio apparatus and said reference antenna by said first movement device, and
wherein said third measurement device measures in free space the distribution of the second near magnetic field of the radio wave radiated from said radio apparatus to be measured, while moving said radio apparatus to be measured in one of one and two dimensions except for a direction substantially perpendicular to a surface of said radio apparatus to be measured by said second movement device.

4. The specific absorption rate measuring apparatus as claimed in claim 3,
wherein said second calculation device estimates and calculates one of a specific absorption rate (SAR) and its distribution, in the direction substantially perpendicular to the surface of the radio apparatus to be measured, by using a relational equation including a skin depth of said phantom used for measuring the specific absorption rate (SAR), based on one of the specific absorption rate (SAR) and its distribution, which is estimated and calculated on a measurement plane including a measurement limit line used for measuring the specific absorption rate (SAR) by said third measurement device, and based on a distance from said radio apparatus to be measured.

5. The specific absorption rate measuring apparatus as claimed claim 1,
wherein said second measurement device measures of the specific absorption rates (SARs) for a plurality of predetermined mutually different holding postures for holding said reference radio apparatus,
wherein said first calculation device calculates the transformation factors for said plurality of holding postures, and
wherein said second calculation device calculates the specific absorption rates (SARs) for said plurality of holding postures.

6. The specific absorption rate measuring apparatus as claimed in claim 2,
wherein said second measurement device measures the distributions of the specific absorption rates (SARs) for a plurality of predetermined mutually different holding postures for holding said reference radio apparatus,
wherein said first calculation device calculates the distributions of the transformation factors for said plurality of holding postures, and
wherein said second calculation device calculates the distributions of the specific absorption rates (SARs) for said plurality of holding postures.

7. The specific absorption rate measuring apparatus as claimed in claim 3,
wherein said second measurement device measures the distributions of the specific absorption rates (SARs) for a plurality of predetermined mutually different holding postures for holding said reference radio apparatus,
wherein said first calculation device calculates the distributions of the transformation factors for said plurality of holding postures, and
wherein said second calculation device calculates the distributions of the specific absorption rates (SARs) for said plurality of holding postures.

8. The specific absorption rate measuring apparatus as claimed in claim 1,
wherein said second calculation device calculates an average value of the plurality of specific absorption rates (SARs) as an average SAR, based on a plurality of specific absorption rates (SARs) at a plurality of measurement points within a predetermined volume isolated from said radio apparatus to be measured.

9. The specific absorption rate measuring apparatus as claimed in claim 8,
wherein said second calculation device retrieves a maximum value of the average SARs calculated for the plurality of holding postures, determines whether or not the maximum value of the retrieved average SARs is equal to or smaller than a predetermined threshold value, outputs such information that said radio apparatus is non-defective when the maximum value of the retrieved average SARs is equal to or smaller than the predetermined threshold value, and outputs such information that said radio apparatus is defective when the maximum value of the retrieved average SARs is larger than the predetermined threshold value.

10. The specific absorption rate measuring apparatus as claimed in claim 1,
wherein each of said first measurement device and said third measurement device comprises at least one magnetic field probe.

11. The specific absorption rate measuring apparatus as claimed in claim 1,
wherein each of said first measurement device and said third measurement device comprises a plurality of magnetic field probes aligned apart from one another at predetermined intervals.

12. The specific absorption rate measuring apparatus as claimed in claim 11,
wherein said magnetic field probes are aligned so that their magnetic field detection planes intersect at an angle of 45 degrees and an angle between mutually adjacent one pair of magnetic field probes is 90 degrees.

13. The specific absorption rate measuring apparatus as claimed in claim 12,
wherein each of said first measurement device and said third measurement device calculates a near magnetic field in an intermediate position of said one pair of magnetic field probes by calculating a square root of a sum of squares of two near magnetic fields measured by one pair of mutually adjacent magnetic field probes.

14. The specific absorption rate measuring apparatus as claimed in claim 11,
wherein magnetic field probes each terminated with a terminating resistor are arranged respectively on the outside of the magnetic field probes located at both ends of the plurality of magnetic field probes.

15. The specific absorption rate measuring apparatus as claimed in claim 10,
wherein each of said first measurement device and said third measurement device further comprises at least one of a variable amplifier and a variable phase shifter provided at a stage subsequent to said magnetic field probes.

16. The specific absorption rate measuring apparatus as claimed in claim 15, further comprising:
control device for controlling an amplification of said variable amplifier and a quantity of phase shift of said variable phase shifter so that a predetermined SAR distribution can be obtained by said second measurement device.

17. The specific absorption rate measuring apparatus as claimed in claim 10,
wherein each of said magnetic field probes comprises three magnetic field probe portions, and
wherein the three magnetic field probe portions are arranged so that centers of the detection surfaces thereof are passed through by mutually orthogonal three axes.

18. The specific absorption rate measuring apparatus as claimed in claim 17,
wherein each of said first measurement device and said third measurement device calculates a near magnetic field measured by a magnetic field probe comprised of said three magnetic field probe portions by calculating a square root of a sum of squares of three magnetic fields detected by said three magnetic field probe portions.

* * * * *

UNITED STATES PATENT AND TRADEMARK OFFICE
CERTIFICATE OF CORRECTION

PATENT NO. : 6,919,845 B2
DATED : July 19, 2005
INVENTOR(S) : Akihiro Ozaki et al.

It is certified that error appears in the above-identified patent and that said Letters Patent is hereby corrected as shown below:

<u>Title page,</u>
Item [56], References Cited, OTHER PUBLICATIONS,
"N. Kuster et al.," reference, replace "Vehicle" with -- Vehicular --.

Signed and Sealed this

Third Day of January, 2006

JON W. DUDAS
*Director of the United States Patent and Trademark Office*